United States Patent
Goto et al.

(10) Patent No.: US 8,320,042 B2
(45) Date of Patent: Nov. 27, 2012

(54) POLARIZING FILM, OPTICAL FILM LAMINATE COMPRISING POLARIZING FILM, AND STRETCHED LAMINATE FOR MANUFACTURING THE SAME

(75) Inventors: Shusaku Goto, Ibaraki (JP); Takeharu Kitagawa, Ibaraki (JP); Minoru Miyatake, Ibaraki (JP); Tomohiro Mori, Ibaraki (JP); Takashi Kamijo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/222,683

(22) Filed: Aug. 31, 2011

(65) Prior Publication Data

US 2012/0057231 A1 Mar. 8, 2012

(30) Foreign Application Priority Data

Sep. 3, 2010 (JP) .................................. 2010-197413
Dec. 2, 2010 (JP) .................................. 2010-269002

(51) Int. Cl.
    G02B 5/30 (2006.01)
(52) U.S. Cl. .................................. 359/487.06
(58) Field of Classification Search ........................ None
    See application file for complete search history.

(56) References Cited

U.S. PATENT DOCUMENTS

| | | |
|---|---|---|
| 4,659,523 A | 4/1987 | Rogers et al. |
| 4,895,769 A | 1/1990 | Land et al. |
| 5,628,957 A | 5/1997 | Collette et al. |
| 2005/0019530 A1 | 1/2005 | Merrill et al. |
| 2007/0128461 A1 | 6/2007 | Tsai |
| 2012/0056211 A1* | 3/2012 | Kitagawa et al. ............... 257/88 |

FOREIGN PATENT DOCUMENTS

| | | |
|---|---|---|
| JP | 02-256002 | 10/1990 |
| JP | 10288709 | 10/1998 |
| JP | 2000-338329 | 12/2000 |
| JP | 2001-343521 | 12/2001 |
| JP | 2001-350021 | 12/2001 |
| JP | 2003-043257 | 2/2003 |
| JP | 2003043257 | 2/2003 |
| JP | 2003-215335 | 7/2003 |
| JP | 2003-279748 | 10/2003 |
| JP | 2004-020629 | 1/2004 |
| JP | 2004020629 | 1/2004 |
| JP | 2005-266325 | 9/2005 |

(Continued)

OTHER PUBLICATIONS

Partial European Search Report for 11179965 dated Dec. 6, 2011.

(Continued)

*Primary Examiner* — Derek S Chapel
(74) *Attorney, Agent, or Firm* — Lowe Hauptman Ham & Berner, LLP

(57) ABSTRACT

A polarizing film includes a polyvinyl alcohol (PVA) type resin having a dichroic material impregnated therein. The polarizing film is formed by stretching the PVA type resin, such that the thickness of the polarizing film is decreased to 10 μm or less, and. The polarizing film has optical properties which satisfy conditions represented by formulae:

$P > -(10^{0.929T-42.4} - 1) \times 100$ (where $T < 42.3$); and $P \geq 99.9$ (where $T \geq 42.3$)

where T represents a single layer transmittance and P a polarization rate. The polarizing film can be made by providing a laminate comprising a PVA type resin layer formed on a non-crystallizable ester type thermoplastic resin substrate.

4 Claims, 29 Drawing Sheets

FOREIGN PATENT DOCUMENTS

| | | |
|---|---|---|
| JP | 2009-083301 | 4/2009 |
| JP | 2009-244465 | 10/2009 |
| TW | I309200 | 5/2009 |
| TW | 200932524 | 8/2009 |
| WO | 95/16554 | 6/1995 |

OTHER PUBLICATIONS

H.W. Siesler; Rheo-Optical Fourier-Transform Infared Spectroscopy; Advanced Polymeric Science; 1984; pp. 9-15.

Partial European Search Report for 11179966 searched Nov. 28, 2011, citing the above reference(s).

Taiwanese Office Action for 100131725 issued May 7, 2012, citing the above reference(s).

Korean Decision to Grant for 10-2011-0088847 dated May 29, 2012, citing the above reference(s).

Partial European Search Report for 11179965 dated Dec. 6, 2011, citing the above reference(s).

\* cited by examiner

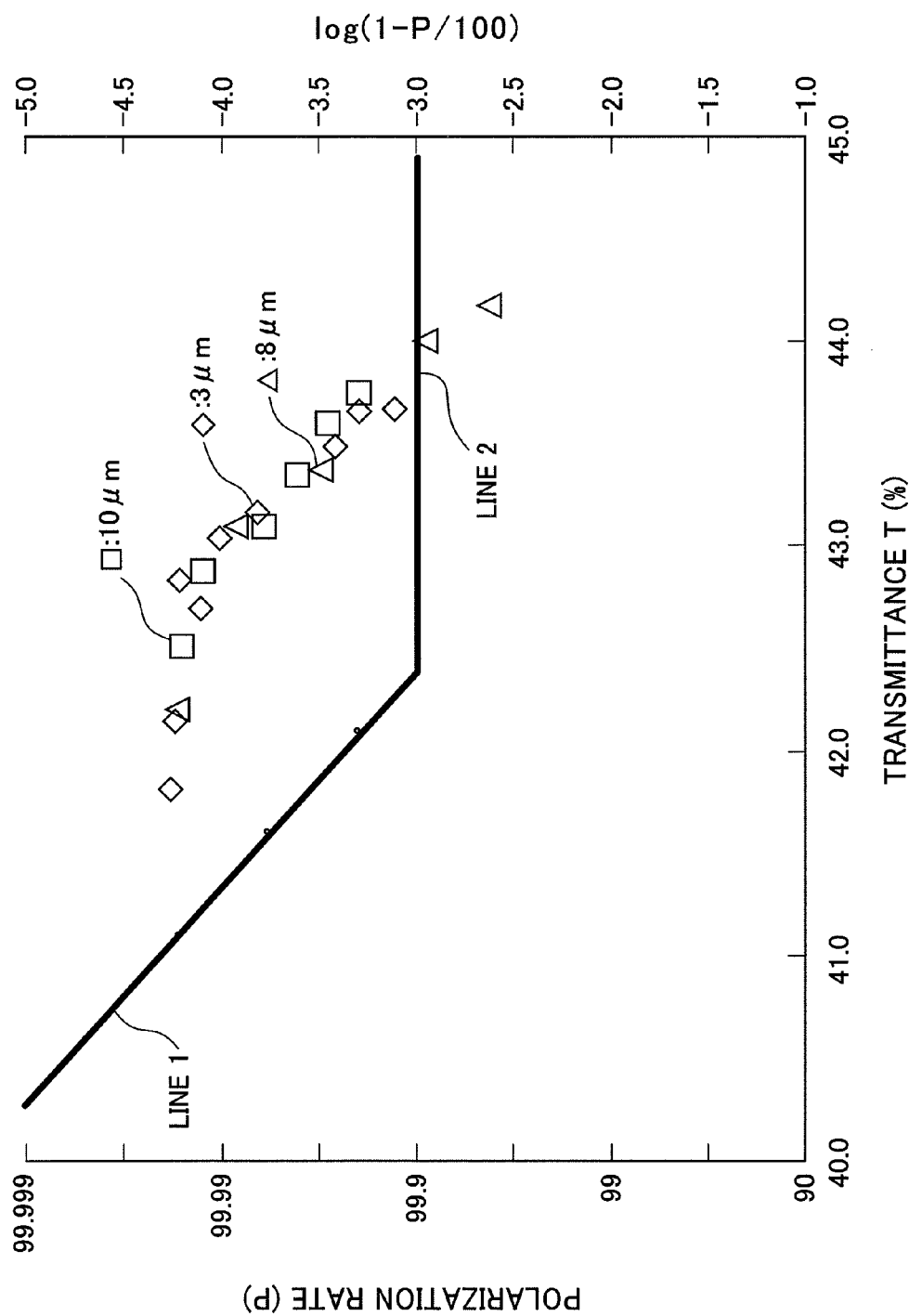

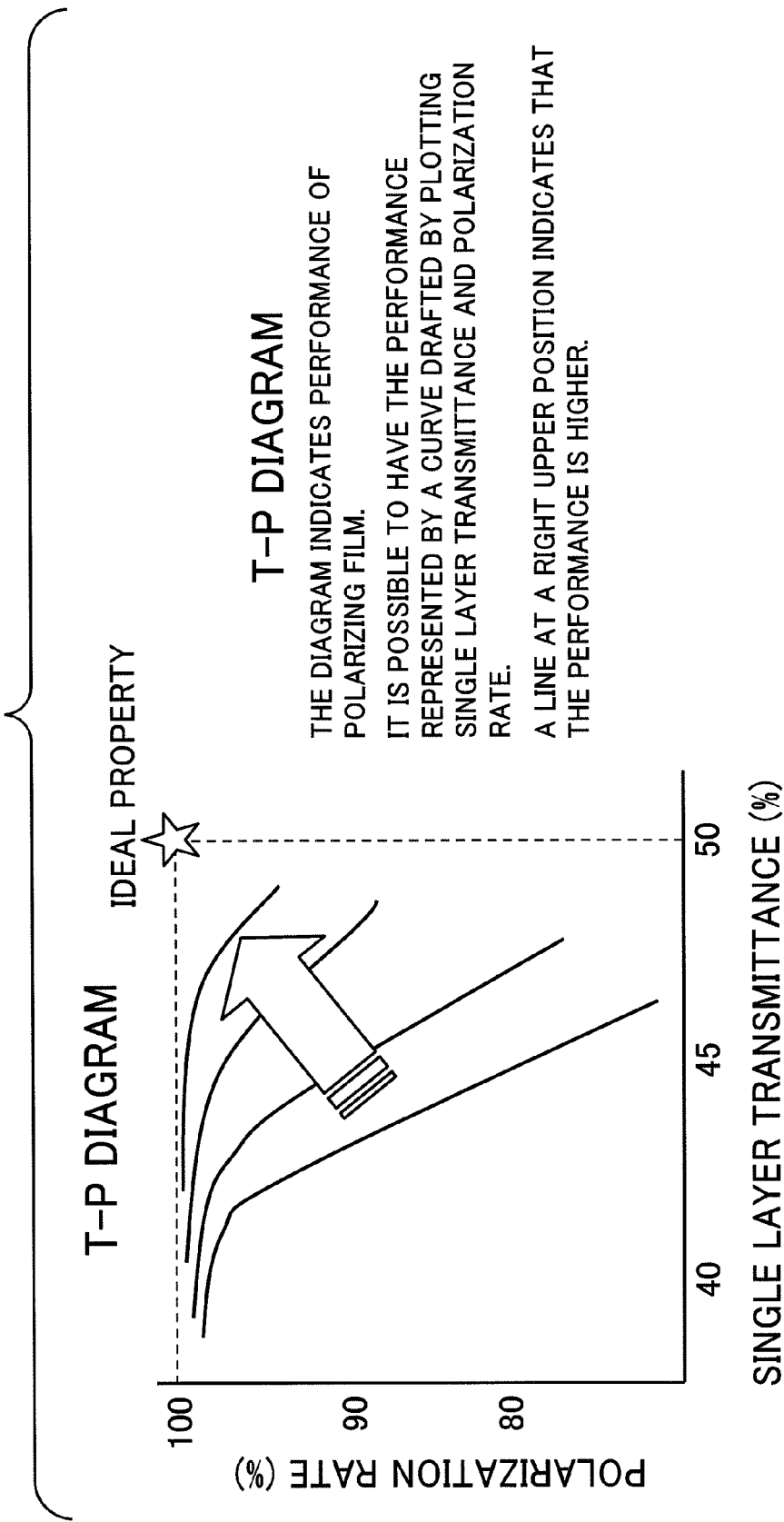

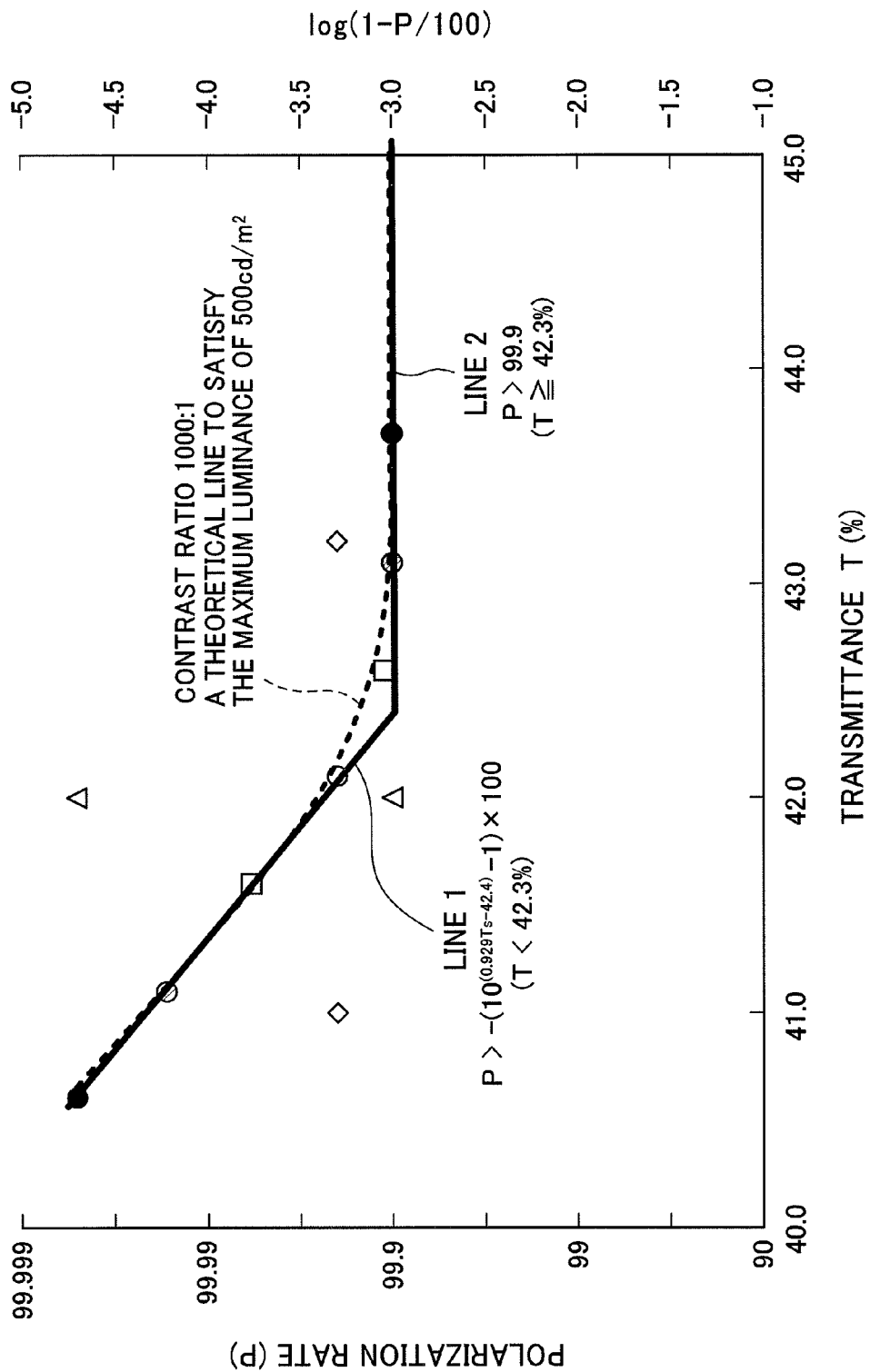

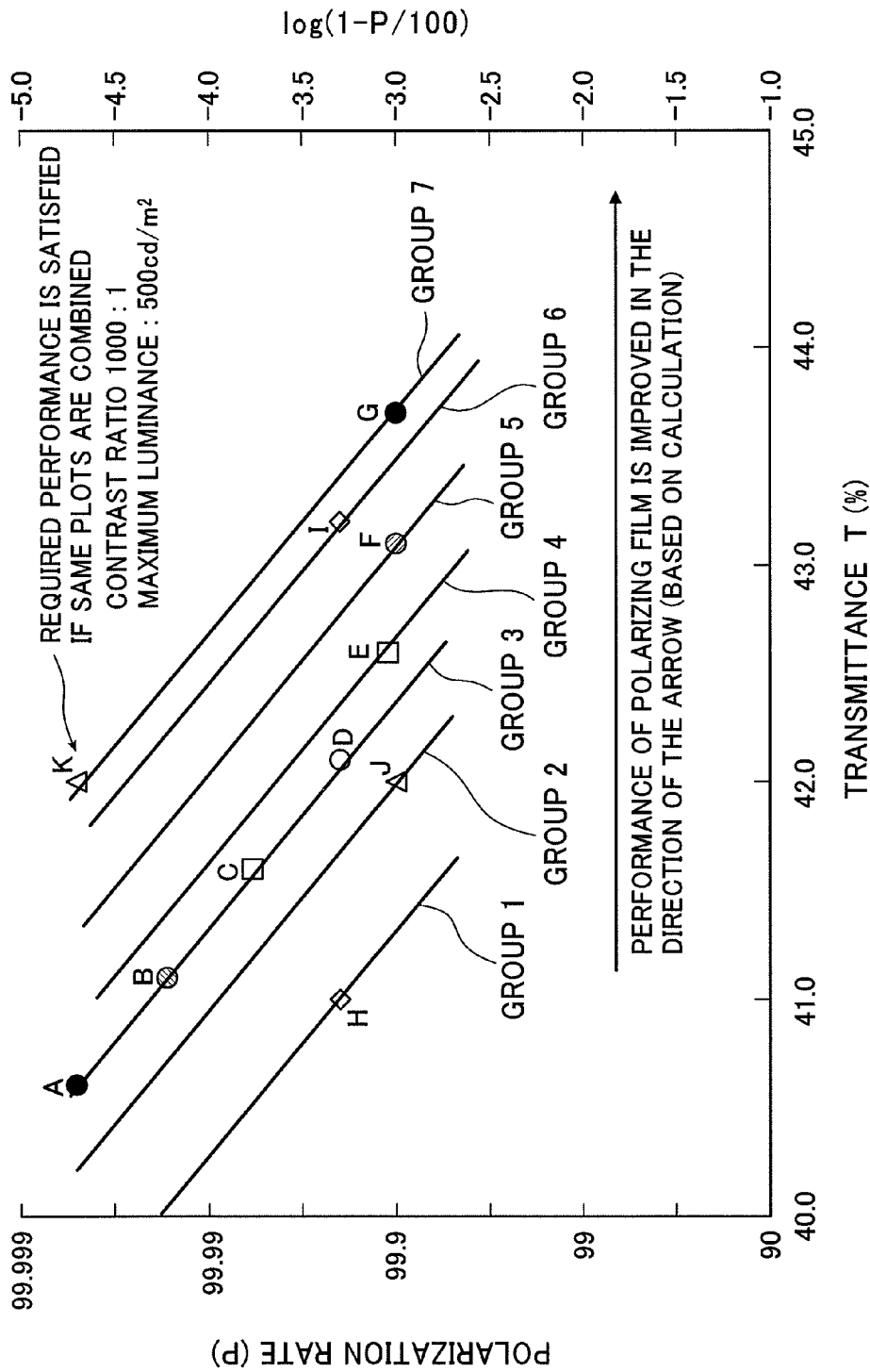

FIG. 6

| CONDITIONS | IODINE CONCENTRATION IN DYEING POOL (wt%) | | | | |
|---|---|---|---|---|---|
| | 0.10 | 0.15 | 0.20 | 0.25 | 0.30~ |
| EXPERIMENTAL RESULTS | ×<br>PVA DISSOLVED IN DYEING POOL | ×<br>PVA DISSOLVED IN DYEING POOL | ×<br>PVA DISSOLVED IN DYEING POOL | ×<br>PVA DISSOLVED IN CLEANING POOL | ○<br>PVA NOT DISSOLVED |

〈 CONDITIONS FOR EXPERIMENT 〉

※ RESIN SUBSTRATE : ISOPHTHALIC ACID COPOLYMERIZED PET

※ THICKNESS OF PVA TYPE RESIN LAYER : 7μm

※ CONDITIONS FOR ELEVATED TEMPERATURE IN-AIR STRETCHING : STRETCHING TEMPERATURE 130°C, STRETCHING RATIO 1.8

※ WITHOUT FIRST INSOLUBILIZATION PROCESS

※ CONDITIONS FOR DYEING PROCESS : SOLUTION TEMPERATURE 30°C, IODINE CONCENTRATION 0.1wt% ~ 1.0wt%

※ WITH CROSS-LINKING PROCESS INCLUDING SECOND INSOLUBILIZATION

※ CONDITIONS FOR IN-BORIC ACID SOLUTION STRETCHING : SOLUTION TEMPERATURE 75°C, STRETCHING RATIO 3.3

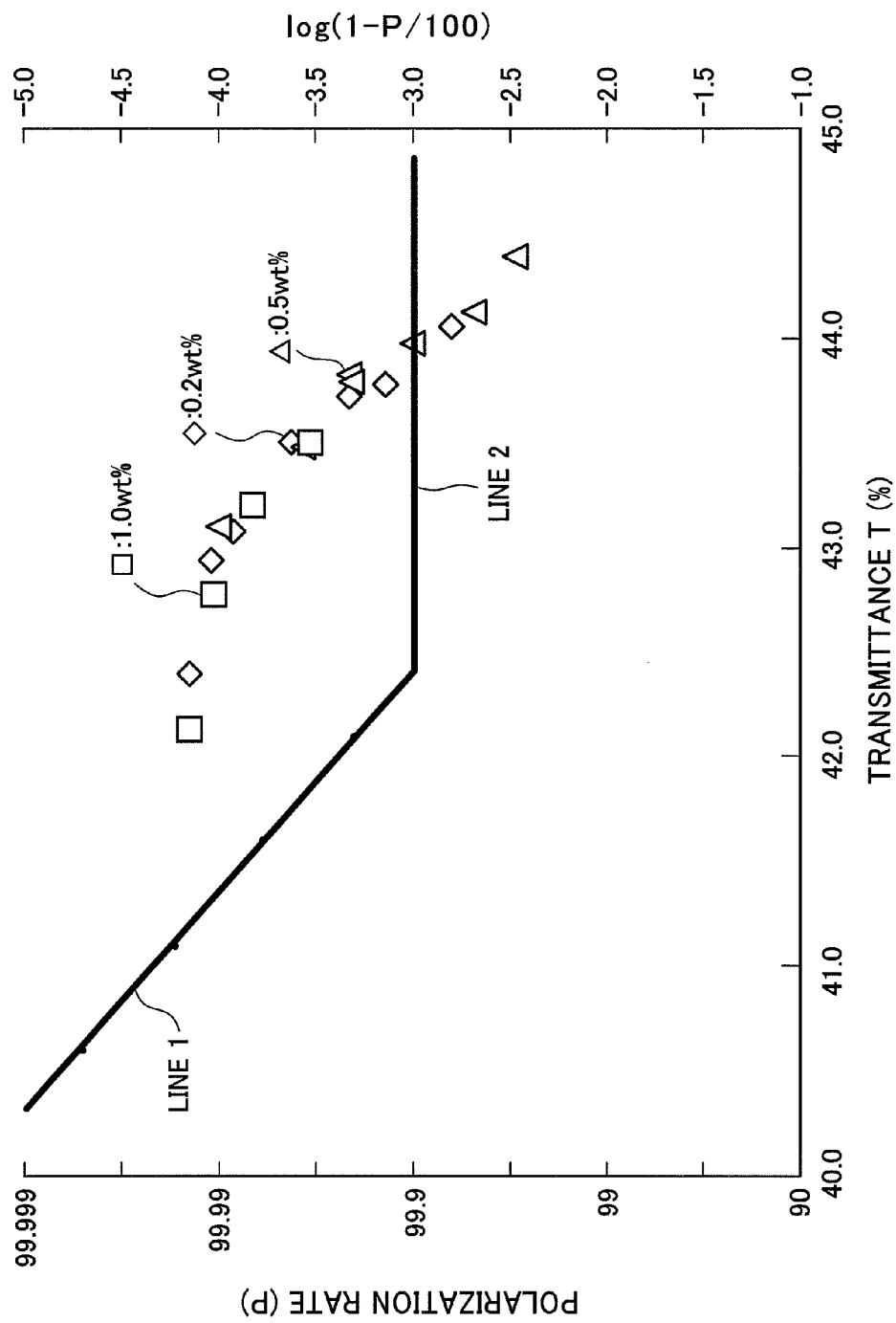

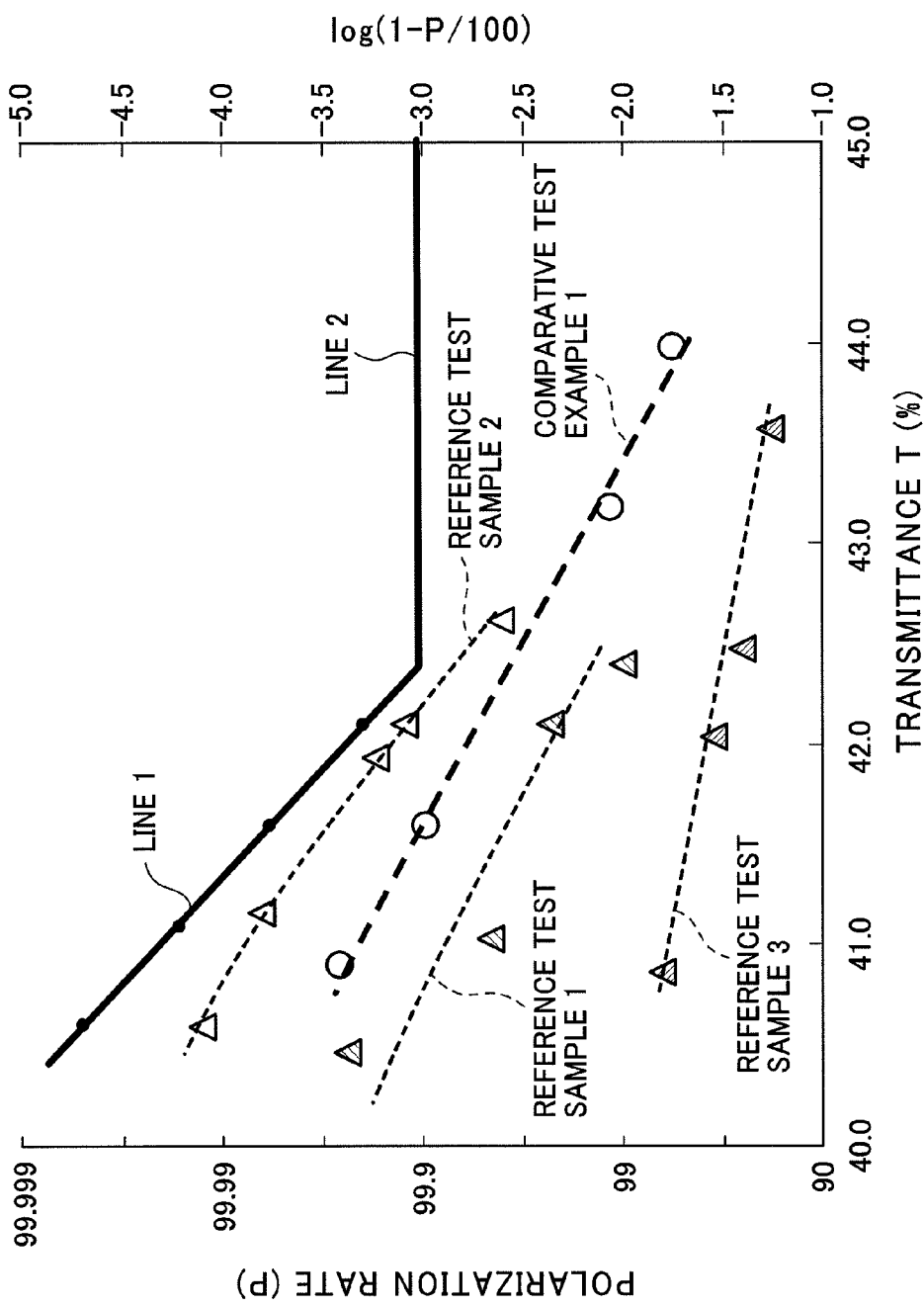

FIG. 27

| EXAMPLE NO. | VARIATION | COPOLYMERIZED PET SUBSTRATE | THICKNESS OF PVA (μm) | HIGH TEMPERATURE MIDAIR STRETCHING ||||| FIRST INSOLUBILIZATION | IODIDE CONCENTRATION IN DYEING PROCESS (wt%) | SECOND INSOLUBILIZATION | IN-BORIC ACID SOLUTION STRETCHING || TOTAL STRETCHING RATIO | THICKNESS OF POLARIZER (μm) |
|---|---|---|---|---|---|---|---|---|---|---|---|---|---|---|---|
| | | | | TEMPERATURE (°C) | STRETCHING RATIO | METHOD | WIDTH AFTER/BEFORE STRETCHING (%) | THICKNESS OF PVA (μm) | | | | TEMPERATURE (°C) | STRETCHING RATIO | | |
| 1 | INSOLUBILIZATION PROCESS | ISOPHTHALIC ACID | 7 | 130 | 1.8 | END-FREE | 65 | 5 | W/O | 0.3 | W/O | 65 | 3.3 | 5.94 | 3 |
| 2 | | ISOPHTHALIC ACID | 7 | 130 | 1.8 | END-FREE | 65 | 5 | W/O | 0.3 | WITH | 75 | 3.3 | 5.94 | 3 |
| 3 | | ISOPHTHALIC ACID | 7 | 130 | 1.8 | END-FREE | 65 | 5 | WITH | 0.12-0.25 | W/O | 65 | 3.3 | 5.94 | 3 |
| 4 | REFERENCE | ISOPHTHALIC ACID | 7 | 130 | 1.8 | END-FREE | 65 | 5 | WITH | 0.12-0.25 | WITH | 75 | 3.3 | 5.94 | 3 |
| 5 | THICKNESS | ISOPHTHALIC ACID | 12 | 130 | 1.8 | END-FREE | 65 | 9 | WITH | 0.12-0.25 | WITH | 75 | 3.3 | 5.94 | 5 |
| 6 | SUBSTRATE | CHDM | 7 | 130 | 1.8 | END-FREE | 65 | 5 | WITH | 0.12-0.25 | WITH | 75 | 3.3 | 5.94 | 3 |
| 7 | HIGH TEMPERATURE MIDAIR STRETCHING RATIO | ISOPHTHALIC ACID | 7 | 130 | 1.2 | END-FREE | 85 | 6 | WITH | 0.12-0.25 | WITH | 75 | 4.9 | 5.88 | 3 |
| 8 | | ISOPHTHALIC ACID | 7 | 130 | 1.5 | END-FREE | 75 | 6 | WITH | 0.12-0.25 | WITH | 75 | 4.0 | 6.0 | 3 |
| 9 | | ISOPHTHALIC ACID | 7 | 130 | 2.5 | END-FREE | 55 | 4 | WITH | 0.12-0.25 | WITH | 75 | 2.4 | 6.0 | 3 |
| 10 | HIGH TEMPERATURE MIDAIR STRETCHING TEMPERATURE | ISOPHTHALIC ACID | 7 | 95 | 1.8 | END-FREE | 75 | 5 | WITH | 0.12-0.25 | WITH | 75 | 3.3 | 5.94 | 3 |

FIG. 28

| | | | | | | | | | | | | | | | |
|---|---|---|---|---|---|---|---|---|---|---|---|---|---|---|---|
| 11 | HIGH TEMPERATURE MIDAIR STRETCHING TEMPERATURE | ISOPHTHALIC ACID | 7 | 110 | 1.8 | END-FREE | 70 | 5 | WITH | 0.12-0.25 | WITH | 75 | 3.3 | 5.94 | 3 |
| 12 | | ISOPHTHALIC ACID | 7 | 150 | 1.8 | END-FREE | 65 | 5 | WITH | 0.12-0.25 | WITH | 75 | 3.3 | 5.94 | 3 |
| 13 | IN-BORIC ACID SOLUTION STRETCHING RATIO | ISOPHTHALIC ACID | 7 | 130 | 1.8 | END-FREE | 65 | 5 | WITH | 0.12-0.25 | WITH | 75 | 2.8 | 5.04 | 3 |
| 14 | | ISOPHTHALIC ACID | 7 | 130 | 1.8 | END-FREE | 65 | 5 | WITH | 0.12-0.25 | WITH | 75 | 3.1 | 5.58 | 3 |
| 15 | | ISOPHTHALIC ACID | 7 | 130 | 1.8 | END-FREE | 65 | 5 | WITH | 0.12-0.25 | WITH | 75 | 3.6 | 6.48 | 3 |
| 16 | FIXED-END STRETCHING RATIO | ISOPHTHALIC ACID | 7 | 130 | 1.8 | FIXED-END | 100 | 4 | WITH | 0.12-0.25 | WITH | 75 | 3.3 | 5.94 | 2 |
| 17 | | ISOPHTHALIC ACID | 7 | 130 | 1.8 | FIXED-END | 100 | 4 | WITH | 0.12-0.25 | WITH | 75 | 3.9 | 7.02 | 2 |
| 18 | | ISOPHTHALIC ACID | 7 | 130 | 1.8 | FIXED-END | 100 | 4 | WITH | 0.12-0.25 | WITH | 75 | 4.4 | 7.92 | 2 |

FIG. 29

| EXAMPLE NO. | COPOLYMERIZED PET SUBSTRATE | HIGH TEMPERATURE MIDAIR STRETCHING | | ORIENTATION FUNCTION OF PET |
|---|---|---|---|---|
| | | TEMPERATURE (°C) | STRETCHING RATIO | |
| EXAMPLE 1 | ISOPHTHALIC ACID | 130 | 1.8 | 0.02 |
| EXAMPLE 2 | ISOPHTHALIC ACID | 130 | 1.8 | 0.01 |
| EXAMPLE 3 | ISOPHTHALIC ACID | 130 | 1.8 | 0.01 |
| EXAMPLE 4 | ISOPHTHALIC ACID | 130 | 1.8 | 0.01 |
| EXAMPLE 5 | ISOPHTHALIC ACID | 130 | 1.8 | 0.01 |
| EXAMPLE 6 | CHDM | 130 | 1.8 | 0.01 |
| EXAMPLE 7 | ISOPHTHALIC ACID | 130 | 1.2 | 0.01 |
| EXAMPLE 8 | ISOPHTHALIC ACID | 130 | 1.5 | 0.01 |
| EXAMPLE 9 | ISOPHTHALIC ACID | 130 | 2.5 | 0.01 |
| EXAMPLE 10 | ISOPHTHALIC ACID | 95 | 1.8 | 0.10 |
| EXAMPLE 11 | ISOPHTHALIC ACID | 110 | 1.8 | 0.05 |
| EXAMPLE 12 | ISOPHTHALIC ACID | 150 | 1.8 | 0.01 |
| EXAMPLE 13 | ISOPHTHALIC ACID | 130 | 1.8 | 0.01 |
| EXAMPLE 14 | ISOPHTHALIC ACID | 130 | 1.8 | 0.01 |
| EXAMPLE 15 | ISOPHTHALIC ACID | 130 | 1.8 | 0.01 |
| EXAMPLE 16 | ISOPHTHALIC ACID | 130 | 1.8 | 0.01 |
| EXAMPLE 17 | ISOPHTHALIC ACID | 130 | 1.8 | 0.01 |
| EXAMPLE 18 | ISOPHTHALIC ACID | 130 | 1.8 | 0.01 |

| REFERENCE TEST SAMPLE NO. | THERMOPLASTIC RESIN SUBSTRATE | HIGH TEMPERATURE MIDAIR STRETCHING | | ORIENTATION FUNCTION OF PET |
|---|---|---|---|---|
| | | TEMPERATURE (°C) | STRETCHING RATIO | |
| REFERENCE TEST SAMPLE 1 | CRYSTALLIZABLE PET | 110 | 4.0 | 0.51 |
| REFERENCE TEST SAMPLE 2 | CRYSTALLIZABLE PET | 100 | 4.5 | 0.78 |
| REFERENCE TEST SAMPLE 3 | CRYSTALLIZABLE PET | 90 | 4.5 | 0.79 |

US 8,320,042 B2

POLARIZING FILM, OPTICAL FILM LAMINATE COMPRISING POLARIZING FILM, AND STRETCHED LAMINATE FOR MANUFACTURING THE SAME

CROSS REFERENCE TO RELATED APPLICATION

This application claims the priority of Japanese Patent Application No. 2010-197413 filed on Sep. 3, 2010, and Japanese Patent Application No. 2010-269002 filed on Dec. 2, 2010 in the JPO (Japan Patent Office), the disclosure of which is incorporated herein in their entirety by reference.

TECHNICAL FIELD

The present invention relates to a polarizing film, an optical film laminate including a polarizing film, and a stretched laminate for manufacturing an optical film laminate including a polarizing film. The polarizing film of the present invention is a polarizing film with a thickness of 10 μm or less and comprises polyvinyl alcohol resin having a dichroic material impregnated therein in an oriented state.

BACKGROUND ART

A well-known method for manufacturing a polarizing film or a so-called polarizer (hereinafter, referred as "a polarizing film") comprises steps of subjecting a film of polyvinyl alcohol resin type material (hereinafter, referred as "PVA type resin") to dyeing and stretching processes to thereby provide a stretched film having a dichroic material impregnated therein with an oriented state. However, such a method of producing a polarizing film with a single layer of PVA film cannot be applied to a production of a polarizing film having a thickness of 10 μm or less since it is generally difficult to process the PVA film into a uniform film thickness through the dyeing and/or stretching process avoiding any risk of the film being partially dissolved or broken. Because of such difficulties, proposals have already been made to produce a polarizing film with a method wherein use is made of a thermoplastic resin material as a substrate and providing a PVA type resin layer on the substrate, the laminate of the substrate and the PVA type resin layer being then subjected to dyeing and stretching processes, as shown in a schematic diagram of FIG. 25. Polarizing films manufactured with such proposed method has however not as yet been publicly known nor made available to public.

As specific examples, reference test samples 1 and 3 are referred to. In the case of the reference test sample 1, a solution of PVA type resin is coated on a thermoplastic resin substrate and then dried to form a laminate having a thin PVA type resin layer formed on the thermoplastic resin substrate. The formed laminate is stretched in air at a stretching temperature of 110° C. using, for example, a stretching device arranged in an oven. Then, the PVA type resin layer having an oriented molecular structure created by the stretching is subjected to a dyeing process to have it impregnated with a dichroic material. Alternatively, in the case of the reference test sample 3, the formed laminate is first subjected to dyeing process to have the dichroic material impregnated therein. Then, the laminate having the dichroic material impregnated therein is stretched in air at a stretching temperature of 90° C. Such polarizing film comprising a PVA type resin including a dichroic material in an oriented state has been already publicly known as disclosed in the Patent Documents 2 to 5.

The method for manufacturing a polarizing film using a thermoplastic resin substrate is noticeable in that it allowed for uniformly manufacturing the polarizing film compared with the method for manufacturing a polarizing film with a mono-layer of the PVA type resin. In the case of a polarizing film which is to be adhesively attached to each of the opposite surfaces of a liquid-crystal cell for use in a liquid-crystal display apparatus, according to the method for manufacturing a polarizing film with a mono-layer of the PVA type resin as disclosed in Japanese Patent Application Publication JP2005-266325A (the Patent Document 1), the polarizing film is manufactured, for example, by transporting a PVA type resin mono-layer of a thickness of 50 to 80 μm through a transporting apparatus comprising a plurality sets of rolls driven at different peripheral speeds, and immersing the PVA type resin mono-layer in a dyeing solution to have a dichroic material impregnated therein, while stretching the PVA type resin mono-layer in the dichroic material solution at around 60° C. What is manufactured is a mono-layer polarizing film with a thickness of 15 to 35 μm. Presently, the polarizing film manufactured using the method has optical properties of a single layer transmittance of 42% or higher and a polarization rate of 99.95% or higher, and is used for a large-sized screen television.

However, since the PVA type resin is hydrophilic, a polarizing film is sensitive to change of temperature and humidity and is apt to produce changes in dimensions such as expansion or shrinkage due to changes in environmental conditions possibly resulting in cracks. In order to suppress expansion and shrinkage and to minimize effects of temperature and/or humidity, it has been a usual practice in a polarizing film for use with a television to provide a film of triacetylcellulose (TAC) having a thickness of 40 to 80 μm laminated on each of the opposite surfaces of the polarizing film as a protection film. It should however be noted that, in the case of a mono-layer polarizing film, since there is a certain limit in reducing the thickness of the polarizing film, it is still difficult to completely restrict the expansion or shrinkage, so that, when an optical film laminate including such polarizing film is adhesively attached to a component such as an adjacent optical film or a liquid-crystal cell through a layer of a bonding or adhesive agent, a stress is induced in such component by the expansion or shrinkage of the polarizing film. Such stress may cause a distortion in the displayed image in a liquid-crystal display apparatus. Since the image distortion is caused by an optical elasticity or deformation of the component induced by a stress produced under the shrinkage in the polarizing film, the material to be used for such component must be limited to be of a low optical elasticity and of low birefringent property in order to reduce the image distortion. In addition, since the stress produced under the shrinkage of the polarizing film may possibly cause the optical film laminate to be detached from the liquid-crystal cell, it is required to use an adhesive agent of a higher adhesive power. However, using such adhesive agent of high adhesive power makes re-working operation difficult. The above is the technical problem inherent to a use of a mono-layer polarizing film.

Under such circumstances, there is a need for a manufacture of polarizing films, which can be used in place of the method using a mono-layer polarizing film in which difficulties have been encountered in an effort for producing polarizing films of a decreased thickness. However, if a PVA type resin mono-layer film having a thickness smaller than 50 μm is passed through a transporting apparatus including a plurality sets of rolls driven at different peripheral speeds and stretched in a dye solution around a temperature of 60° C. to produce a polarizing film having a thickness of 10 μm or less, the PVA type resin mono-layer comprised of a hydrophilic polymer composition may be at least partially dissolved in the solution as the thickness is decreased by stretching, or may be broken because of being unable to withstand the stretching stress. As such, it is difficult to stably manufacture a polarizing film from a PVA type resin mono-layer. Because of such problems, the methods disclosed in the Patent Documents 2 to 5 have been developed as new manufacturing methods of polarizing films. In those methods, a polarizing film is manufactured by forming a layer of a PVA type resin on a thermoplastic resin substrate of a certain thickness and stretching thus formed PVA type resin layer together with the thermoplastic resin substrate.

In the above method, a laminate comprising a thermoplastic resin substrate and a PVA type resin layer is stretched in air typically at a stretching temperature of 60 to 110° C. using, for example, a stretching apparatus arranged in an oven. Then, the PVA type resin layer having molecular orientation produced through the stretching is subjected to a dyeing process to have a dichroic material impregnated therein. Alternatively, the PVA type resin layer in the laminate comprising the thermoplastic resin substrate and the PVA type resin layer is first dyed to have a dichroic material impregnated therein. Then, the laminate comprising the PVA type resin layer having the dichroic material impregnated therein is stretched in air typically at a stretching temperature of 60 to 110° C. The above process is the method of manufacturing the polarizing film having the dichroic material in an oriented state as disclosed in the Patent Documents 2 to 5.

More particularly, a solution containing a PVA type resin is initially applied onto a thermoplastic resin substrate, and moisture content is removed by a drying process to form a PVA type resin layer with a thickness of several tens micrometer. Then, a laminate comprising the thermoplastic resin substrate and the PVA type resin layer is stretched in air under an elevated temperature provided by a stretching apparatus arranged in an oven. The stretched laminate is then immersed in a dyeing solution to have a dichroic material impregnated in the PVA type resin layer, to form a polarizing film of a few micrometer thick having the dichroic material in an oriented state. The above is a conventional manufacturing method of a polarizing film using a thermoplastic resin substrate.

The polarizing film produced by the aforementioned manufacturing process is promising from viewpoint of reducing the thickness of a large size display element, eliminating distortions in displayed images and reducing industrial waste. However, up to now, it has been experienced that the polarizing film manufactured by the aforementioned process has a lower degree of optical properties in terms of the polarizing performance, as shown in FIG. 26 illustrating the optical properties of the reference test samples 1 to 3, and thus, there is still unsolved technical problem in an effort for producing a thin polarizing film with a sufficiently high optical property.

The prior art documents referred to in the above and following descriptions are listed below.

Patent Document 1: Japanese Laid-Open Patent Publication JP2005-266325A
Patent Document 2: Japanese Patent 4279944B
Patent Document 3: Japanese Laid-Open Patent Publication JP2001-343521A
Patent Document 4: Japanese Patent Publication JP8-12296B
Patent Document 5: U.S. Pat. No. 4,659,523
Non-Patent Document 1: H. W. Siesler, Advanced Polymeric Science, 65, 1, 1984

DISCLOSURE OF THE INVENTION

Problem to be Solved by the Invention

The process of steadily manufacturing polarizing film using a thermoplastic resin substrate has been discussed with reference to the Patent Documents 2 to 5. It should however be noted that in these methods, it has not as yet been possible to obtain polarizing films meeting requirements for optical properties of contrast ratio of 1000:1 or more and maximum luminance of 500 cd/m$^2$ or more which are required for display elements of liquid-crystal display televisions.

This technical problem is simple and because of such simplicity it is not easy to solve as will be described in the followings. According to anyone of the conventional manufacturing methods, stretching of a laminate comprising a thermoplastic resin substrate and a PVA type resin layer formed thereon has been carried out in an environment of high-temperature air. A primary reason for such stretching in air under a high temperature environment is that the thermoplastic resin substrate and the PVA type resin layer cannot be stretched at a temperature below respective glass transition temperature (Tg). The Tg of PVA type resin is 75 to 80° C. The Tg of polyethylene terephthalate (PET) which is an ester thermoplastic resin is 80° C. For reference, the Tg of non-crystallizable PET having isophthalic acid copolymerized PET is 75° C. Thus, a laminate comprising a thermoplastic resin substrate and a PVA type resin layer has to be stretched under an elevated temperature higher than those glass transition temperatures. As a matter of fact, the molecular orientation of a PVA type resin is enhanced by stretching. Polarizing property of a polarizing film comprising a PVA type resin depends on the molecular orientation of the PVA type resin having a dichroic material such as iodine impregnated therein. The polarizing property of the polarizing film comprising the PVA type resin is improved with increase in the molecular orientation of the PVA type resin.

However, a crystallizable resin, regardless whether it is an olefin or an ester, has generally a tendency of its molecules being oriented with an increase in temperature and with a stretching, resulting in an enhanced crystallization. Such crystallization causes various changes in physical properties of a resin. A typical example is that the resin actually becomes unstretchable due to crystallization. In the case of a crystallizable resin, even in the case of an amorphous PET, crystallization rate abruptly increases at 120° C. and it becomes unstretchable at 130° C. As described later with reference to general material properties of thermoplastic resins, it has been known to provide measures for suppressing crystallization by inhibiting polymer molecular orientation caused by heating or stretching. It is needless to mention that non-crystallizable olefin type resin and non-crystallizable ester type resin produced with such process have also been well-known. For example, a unit which may inhibit crystallization of PET may be copolymerized with PET to form a non-crystallizable PET in which crystallization is suppressed. The crystallization rate does not abruptly increases at around 120° C. in the case of a non-crystallizable PET. Although crystallization of the non-crystallizable PET may gradually progress, it may be possible to stretch steadily to a temperature of 170° C. The non-crystallizable PET becomes unstretchable at a temperature higher than 170° C. due to softening of the PET.

The present invention aims at providing a polarizing film having superior optical properties, an optical film laminate comprising the polarizing film having superior optical properties, and a stretched laminate for use in manufacturing the optical film laminate comprising the polarizing film having superior optical properties.

Means for Solving the Problem

The inventors of the present invention have made extensive efforts in obtaining a polarizing film of a reduced thickness and improving optical properties of such polarizing film of a reduced thickness. As the results, the inventors have been successful in obtaining a polarizing film with a thickness of 10 μm or less and comprising a PVA type resin in which a dichroic material is impregnated therein, and a method for manufacturing the same. A thin polarizing film can be produced by stretching a non-crystallizable ester thermoplastic resin substrate together with a PVA type resin layer formed thereon.

According to researches and analysis by the inventors, it is not possible to find any case where a non-crystallizable PET is used as a thermoplastic resin substrate, and a laminate comprising a PVA type resin layer formed on the non-crystallizable PET substrate is stretched in end-free uniaxial stretching at a stretching temperature of 120° C. or higher and a stretching ratio of 5.0 or more. The present inventors have challenged the above process to realize the present invention.

Each of FIGS. 18 to 22 is a schematic diagram based on experimental results. FIG. 18 is a schematic diagram, based on an experiment, showing a relationship between a stretching temperature and a stretchable ratio for each of a crystallizable PET, a non-crystallizable PET and a PVA type resin.

The thick solid line in FIG. 18 shows a relationship between the practically realizable stretching ratio of a non-crystallizable PET and the stretching temperature. The Tg of the non-crystallizable PET is 75° C. in this instance and it cannot be stretched at a temperature below the Tg. The stretching ratio of the non-crystallizable PET may be 7.0 or more at a stretching temperature of 110° C. or higher in end-free uniaxial elevated temperature in-air stretching. The thin solid line in FIG. 18 shows a relationship between the practically realizable stretching ratio of a crystallizable PET and the stretching temperature. The Tg of the crystallizable PET in this instance is 80° C. and it cannot be stretched at a temperature below the Tg.

FIG. 19 is a schematic diagram showing a change of the crystallization rate of each of crystallizable PET and a non-crystallizable PET with a change of stretching temperature between the Tg and melting point (Tm) of the PET. It is understood from FIG. 19 that the crystallizable PET in amorphous state at 80 to 110° C. rapidly crystallizes at around 120° C.

As is clear from FIG. 18, a stretchable ratio of the crystallizable PET in end-free uniaxial elevated temperature in-air stretching is limited to 4.5 to 5.5, and an applicable stretching temperature is in a very limited range of 90 to 110° C.

Reference test samples 1 to 3 are examples of products obtained by the end-free uniaxial elevated temperature in-air stretching. Each of the reference test samples 1 to 3 comprises a polarizing film with a thickness of 3.3 μm, formed by the end-free uniaxial elevated temperature in-air stretching of a laminate comprising a 7 μm-thick PVA layer formed on a 200 μm-thick crystallizable PET substrate. Stretching temperature of each of the reference test samples is different such that the reference test sample 1 is 110° C., the reference test sample 2 is 100° C. and the reference test sample 3 is 90° C. It should be noted that the limit of stretchable ratio of the reference test sample 1 is 4.0, and those for the reference test samples 2 and 3 are both 4.5. Stretching beyond those stretchable ratios was not possible because the laminate itself was finally broken. It should however be noted that, in the above results, it is not possible to deny that the restriction has partly been influenced by the stretchable ratio of the PVA type resin layer formed on the crystallizable PET.

Reference is now made to the broken line in FIG. 18. This diagram shows a realizable stretching ratio of a PVA which belongs to PVA type resins. The Tg of a PVA type resin is 75 to 80° C. and a mono-layer of a PVA type resin cannot be stretched at a temperature below the Tg. As is clear from FIG. 18, the realizable stretching ratio of the mono-layer of a PVA type resin in the end-free uniaxial elevated temperature in-air stretching is limited to 5.0. Thus, the present inventors have arrived at a conclusion that, from the relationship between the stretching temperature and the realizable stretching ratio of each of a crystallizable PET and a PVA type resin, the realizable stretching ratio under the end-free uniaxial elevated temperature in-air stretching of the laminate comprising the PVA type resin layer formed on the crystallizable PET is limited to 4.0 to 5.0 at a stretching temperature in the range of 90 to 110° C.

Comparative test samples 1 and 2 are examples of the end-free uniaxial elevated temperature in-air stretching of a laminate comprising a PVA type resin layer formed on a non-crystallizable PET substrate. Stretching temperature does not restrict stretching of the non-crystallizable PET substrate. The comparative test samples 1 is a polarizing film formed by the end-free uniaxial elevated temperature in-air stretching of a laminate comprising a 7 μm-thick PVA layer formed on a 200 μm-thick non-crystallizable PET substrate at a stretching temperature of 130° C. with a stretching ratio of 4.0.

Reference is made to the Comparative Table in Table 1. The comparative test sample 2 includes those cases wherein polarizing films, similar to the comparative test sample 1, are formed by an end-free uniaxial elevated temperature in-air stretching of a laminate comprising a 7 μm-thick PVA layer formed on a 200 μm-thick non-crystallizable PET substrate under different stretching ratio of 4.5, 5.0 and 6.0, respectively. As shown in Table 1, in each case of the comparative test samples, there have been non-uniform stretching or breakage produced in film surface of the non-crystallizable PET substrate, and a breakage in the PVA type resin at a stretching ratio of 4.5. It has been confirmed with the results that the stretching ratio of the PVA type resin layer under the end-free uniaxial elevated temperature in-air stretching at a stretching temperature of 130° C. is limited to be 4.0.

TABLE 1

Comparative Table

| | Stretching temp. | Stretching ratio | Stretched film Non-crystallizable PET substrate (isophthalic acid copolymerized PET) | Laminate of PVA type resin layer and non-crystallizable PET substrate |
|---|---|---|---|---|
| Comp. test sample 1 | 130° C. | 4.0 | Uniformly stretched without breaking | Uniformly stretched without breaking |
| Comp. test samples 2 | | 4.5 | Not uniformly stretched | PVA type resin layer and non- |

TABLE 1-continued

Comparative Table

| | | Stretched film | |
|---|---|---|---|
| Stretching temp. | Stretching ratio | Non-crystallizable PET substrate (isophthalic acid copolymerized PET) | Laminate of PVA type resin layer and non-crystallizable PET substrate |
| | | without breaking | crystallizable PET substrate both broken |
| | 5.0 | Not uniformly stretched without breaking | Not investigated |
| | 6.0 | Broken | Not investigated |

In respective ones of the reference test samples 1 to 3, although stretching temperature is different, a dyed laminate has been produced with a laminate comprising a PVA type resin layer formed on a crystallizable PET substrate by stretching the laminate at a stretching ratio of 4.0 to 4.5 to have a PVA type resin layer with oriented PVA molecules and iodine impregnated therein. Specifically, the stretched laminate was immersed in a dyeing solution containing iodine and potassium iodide at a temperature of 30° C. for an appropriate time period to have iodine impregnated in the PVA type resin layer in the stretched laminate, such that the single layer transmittance of the PVA type resin layer finally constituting the polarizing film becomes 40 to 44%. In addition, by adjusting the amount of iodine impregnated in the thin PVA type resin layer, various polarizing films have been produced with different single layer transmittance T and polarization rate P.

Reference is now made to the diagram in FIG. 26. FIG. 26 shows optical properties of the reference test samples 1 to 3. PVA molecules in the PVA type resin layer formed on the crystallizable PET substrate are oriented to a certain degree by the elevated temperature in-air stretching. On the other hand, it is presumed that the in-air stretching under such elevated temperature may facilitate crystallization of the PVA molecules preventing orientation of non-crystallized portion of molecules.

In view of such observations, the present inventors have developed, prior to the present invention, a polarizing film shown in the comparative test sample 3 and the method for manufacturing the same. The development is based on a surprising finding of plasticizing function of water wherein a laminate comprising a PVA type resin layer formed on a PET substrate can be stretched even under a stretching temperature below the Tg. According to the method, it was confirmed that a laminate comprising a PVA type resin layer formed on a PET substrate might be stretched to a stretching ratio of 5.0. This is the one corresponding to the Example 1 disclosed in the assignee's application PCT/JP2010/001460.

The present inventors have conducted further research and realized that the stretching ratio has been limited to 5.0 due to a crystallizable nature of the PET used for a PET substrate. The inventors have initially thought that the crystallizing property of the PET substrate such as crystallizable or non-crystallizable would not significantly affect stretching operation because a laminate comprising a PVA type resin layer formed on a PET substrate was stretched in boric acid solution at a temperature below the Tg, however, it was subsequently found that use of a non-crystallizable PET made it possible to stretch the laminate up to a stretching ratio of 5.5. Thus, it is presumed that the stretching ratio is limited in the manufacturing method of the polarizing film shown in the comparative test sample 3 to a value of 5.5 due to the limit in the non-crystallizable PET substrate.

For the comparative test sample 1, various polarizing films were formed with different single layer transmittance T and polarization rate P, the optical properties thereof being shown in FIG. 26 together with the reference test samples 1 to 3.

Reference is now made to FIG. 20 which is a diagram simply showing the relationship between the stretching ratio obtained by an elevated temperature in-air stretching, and a total stretching ratio (hereinafter referred as "a total stretching ratio") obtained by a two stage stretching including the elevated temperature in-air stretching and a second stretching in accordance with the present invention which has been created based on the research results of the present inventors. The horizontal axis of the diagram designates the stretching ratio under the end-free uniaxial elevated temperature in-air stretching at a stretching temperature of 130° C. The vertical axis of the diagram designates the total stretching ratio obtained by a two stage stretching including the end-free uniaxial elevated temperature in-air stretching, the total stretching ratio having been calculated based on the original length before the elevated temperature in-air stretching which has been taken as one and equivalent to the ratio of magnification of the final length with respect to the original length. For example, in the case where the stretching ratio under the end-free uniaxial elevated temperature in-air stretching at a stretching temperature of 130° C. is 2.0 and stretching ratio under the second stage stretching is 3.0, the resultant total stretching ratio will be 2.0×3.0=6.0. The second stage stretching after the elevated temperature in-air stretching may be carried out as an end-free uniaxial stretching in boric acid solution at a stretching temperature of 65° C. (stretching a laminate immersed in a boric acid solution is hereinafter referred as "in-boric-acid-solution stretching"). The inventors have obtained the result as shown in FIG. 20 by a combination of the two stage stretching.

The solid line in FIG. 20 shows a stretching ratio attainable using a non-crystallizable PET. The total stretching ratio of the non-crystallizable PET is limited to 5.5 with the elevated temperature in-air stretching ratio of 1.0, i.e. when the non-crystallizable PET is directly stretched by the in-boric acid solution stretching without the elevated temperature in-air stretching. It indicates that the non-crystallizable PET will break if stretched beyond this value, but the ratio is merely the minimum stretching ratio of the non-crystallizable PET, and the diagram shows that the larger the stretching ratio of elevated temperature in-air stretching, the larger the total stretching ratio of the non-crystallizable PET, and the stretchable ratio may be beyond 10.0.

The broken line in FIG. 20 shows the stretching ratio attainable in a PVA type resin layer formed on the non-crystallizable PET. The total stretching ratio of the PVA type resin layer is at the maximum 7.0 when the PVA type resin layer is directly stretched by the in-boric-acid-solution stretching without the elevated temperature in-air stretching. However, the larger the stretching ratio of elevated temperature in-air stretching, the smaller the total stretching ratio of the PVA type resin layer, and the total stretching ratio of the PVA type resin layer may fall below 6.0 when the elevated temperature in-air stretching ratio is 3.0. The PVA type resin layer will break if it is attempted to increase the total stretching ratio of the PVA type resin layer up to 6.0. As will be understood from FIG. 20, the reason for the laminate comprising a PVA type resin layer formed on a non-crystallizable PET substrate becoming impossible to be stretched changes depending on the amount of the stretching ratio under the elevated temperature in-air stretching, from that induced by the non-crystallizable PET substrate to that induced by the PVA type resin layer. For reference, the stretching ratio of PVA under the in-air stretching is up to 4.0, and the PVA cannot be stretched beyond this value. It is assumed that this stretching ratio corresponds to the total stretching ratio of the PVA.

Reference is now made to the diagram in FIG. 21. FIG. 21 is a schematic diagram showing the relationship between the stretching temperature in the elevated temperature in-air stretching and the total stretching ratio obtainable by carrying out both the elevated temperature in-air stretching and the in-boric acid solution stretching, for a non-crystallizable PET and a PVA type resin, the relationship being determined based on experiments. In FIG. 18, the diagram shows the stretching temperature for the elevated temperature in-air stretching on the horizontal axis, and the attainable stretching ratio with the elevated temperature in-air stretching on the vertical axis, for the non-crystallizable PET and the PVA type resin. FIG. 21 is different from FIG. 18 in that the horizontal axis is the stretching temperature when the elevated temperature in-air stretching ratio is 2.0, and the vertical axis is the total stretching ratio attainable with the elevated temperature in-air stretching and the in-boric-acid-solution stretching.

As will be described later, the present invention has been created by combining 2 stretching processes, the elevated temperature in-air stretching and the in-boric acid solution stretching, which is not merely a combination of 2 stretching processes, but it is to be noted that the invention could be accomplished based on the surprising findings that the following two technical problems could be simultaneously solved by the combination. There exist two technical problems that have conventionally been considered impossible to solve.

The first technical problem is that the stretching ratio and the stretching temperature which are governing factors for improving orientation of a PVA type resin are largely restricted by the thermoplastic resin substrate having a PVA type resin layer formed thereon.

The second technical problem is that, even if the restriction for the stretching ratio and the stretching temperature are cleared, crystallization and stretchability of a crystallizable resin such as a PVA type resin and a PET which is used as a thermoplastic resin substrate are physical properties which are not compatible with each other, so that the amount of stretching of the PVA type resin can be restricted by its crystallization.

The first technical problem will further be discussed in the followings. In manufacturing a polarizing film using a thermoplastic resin substrate, there is a restriction induced by the properties of the PVA type resin in that the stretching temperature should be above the Tg of the PVA type resin (75 to 80° C.) and the stretching ratio should be 4.5 to 5.0. If a crystallizable PET is used as the thermoplastic resin substrate, the stretching temperature is further restricted to 90 to 110° C. It has been considered that a polarizing film, produced through the elevated temperature in-air stretching of the aforementioned type laminate for thinning down the PVA type resin layer formed on a thermoplastic resin substrate included in the laminate, cannot be free from such restriction.

To address this, the present inventors has previously proposed an in-boric-acid-solution stretching process that can take place of the elevated temperature in-air stretching, and that is based on finding of a plasticizing function of water. It should however be noted that, even with the in-boric acid solution stretching at a stretching temperature of 60 to 85° C., it has been difficult to overcome the restrictions induced by the thermoplastic resin substrate where the stretching ratio using a crystallizable PET is limited at 5.0 and the stretching ratio using a non-crystallizable PET is limited at 5.5. Thus, the first technical problem is that, improvement of orientation of PVA molecules is restricted as above which in turn restricts optical properties of a thin polarizing film.

The solution to the first technical problem can be explained with reference to schematic diagrams shown in FIG. 22. There are shown two diagrams in FIG. 22, wherein one is the molecular orientation of the PET constituting the thermoplastic resin substrate and the other is a degree of crystallization of the PET. The horizontal axis in each of the diagrams represents a total stretching ratio of elevated temperature in-air stretching and in-boric-acid-solution stretching. The broken lines in FIG. 22 show the total stretching ratio which can be attained through the in-boric acid solution stretching alone. The extent of crystallization of the PET, regardless whether it is crystallizable or non-crystallizable, abruptly increases at the total stretching ratio between 4.0 and 5.0. Thus, the stretching ratio of the in-boric acid solution stretching was limited to 5.0 or 5.5. Where at this point, the molecular orientation reaches the upper limit and the required tension for the stretching abruptly increases. In other words, it is impossible to stretch beyond this point.

The solid lines in FIG. 22 show the results of the two stage stretching wherein PET is subjected to a stretching in an end-free uniaxial elevated temperature in-air stretching to attain a stretching ratio of 2.0 and at a stretching temperature of 110° C., then a further stretching in an in-boric acid solution stretching at a stretching temperature of 65° C. Regardless of whether the PET is crystallizable or non-crystallizable, the extent of crystallization did not show any abrupt increase, as opposed to the results obtained with only the in-boric acid solution stretching. As the result, the total stretchable ratio has been improved up to 7.0 where the orientation reached the upper limit and the required tension for stretching has abruptly increased. As is clear from FIG. 21, this result owes to adopting the end-free uniaxial elevated temperature in-air stretching for the first stage stretching. When an end-fixed uniaxial elevated temperature in-air stretching is adopted as described later, the attainable total stretching ratio can be increased to 8.5.

It has been confirmed from the relationship between the molecular orientation and the extent of crystallization of PET constituting the thermoplastic resin substrate shown in FIG. 22 that the crystallization of PET can be suppressed, regardless of whether the PET is crystallizable or non-crystallizable, by carrying out the elevated temperature in-air stretching as a preliminary stretching. However, reference should herein be made to FIG. 23. It will be noted in FIG. 23 that, when the thermoplastic resin substrate comprises a crystallizable PET, that the molecular orientation of the crystallizable PET after the preliminary stretching will be 0.30 or higher at 90° C., 0.20 or higher at 100° C., and 0.10 or higher at 110° C. The molecular orientation of the PET equal to or higher than 0.10 is not desirable as a manufacturing condition, because the tensile force required for the stretching in the second stage in boric acid solution increases load on the stretching apparatus. FIG. 23 shows that it is preferable to use a non-crystallizable PET for the thermoplastic resin substrate, more preferably a non-crystallizable PET having an orientation function of 0.10 or less, and further preferably a non-crystallizable PET having an orientation function of 0.05 or less.

FIG. 23 shows experimental data indicating the relationship between the stretching temperature in the elevated temperature in-air stretching with the stretching ratio of 1.8 and the orientation function of the PET used for the thermoplastic resin substrate. As is clear from FIG. 23, a PET that has an orientation function of 0.10 or less and that can be included in a laminate which can be stretched in boric acid solution to attain a high stretching ratio, is the one which can be classified into a non-crystallizable PET. Especially, in case where the orientation function is 0.05 or less, the non-crystallizable PET can be stretched steadily with a high stretching ratio without applying any excessive load such as an increase of stretching tension to the stretching apparatus in the second stretching in the boric acid solution. This will be easily understood from values of the orientation function for the examples 1 to 18 and those for the reference test samples 1 to 3 in FIG. 29.

By solving the first technical problem, it has become possible to eliminate restrictions in the stretching ratio which has been experienced due to the property of the PET substrate, and to improve molecular orientation of the PVA type resin by increasing the total stretching ratio. Thus, the optical properties of the polarizing film can be significantly improved. It should further be noted that the improvement of the optical properties had been more than those described above. Further improvements have been accomplished by solving the second technical problem.

The second technical problem can be described as follows. One of the characteristic features of PVA type resins and crystallizable resins such as a PET for the thermoplastic resin substrate is that, in these resins, molecules tend to be oriented by heating and stretching resulting in a progress of crystallization. Stretching of a PVA type resin is limited by crystallization of the resin that is crystallizable in nature. Crystallization and stretchability are two opposing physical properties, and it has been considered that progress of crystallization in a PVA type resin tends to prevent its molecules from being orientated. It is possible to describe a manner of solving the second technical problem with reference to FIG. 24. The solid line and the broken line in FIG. 24 show the relationship between the extent of crystallization and the orientation function of a PVA type resin calculated based on the results of two experiments.

The solid line in FIG. 24 shows the relationship between the extent of crystallization and the orientation function of the PVA type resin in samples prepared as follows. Six samples were prepared by forming laminates provided under the same condition, each laminate comprising a PVA type resin layer formed on a non-crystallizable PET substrate. Stretched laminates each comprising a PVA type resin layer were produced by subjecting thus prepared six laminates each comprising a PVA type layer to an elevated temperature in-air stretching at the same stretching ratio of 1.8, with different stretching temperatures of 80° C., 95° C., 110° C., 130° C., 150° C., and 170° C., respectively. Then, measurements have been made on respective ones of the PVA type resin layers in the stretched laminates to determine and analyze the extent of crystallization and the orientation function. Details of the measuring and analyzing processes will be described later.

The broken line in FIG. 24 shows, as the solid line does, the relationship between the extent of crystallization and the orientation function of each of the PVA type resin layers in samples prepared as follows. Six samples were prepared by forming laminates provided under the same condition, each laminate comprising a PVA type resin layer formed on a non-crystallizable PET substrate. Stretched laminates each comprising a PVA type resin layer were produced by subjecting thus prepared six laminates each comprising a PVA type layer to an elevated temperature in-air stretching at the same stretching temperature of 130° C. with different stretching ratio of 1.2, 1.5, 1.8, 2.2, 2.5, and 3.0, respectively. Then, measurements have been made on respective ones of the PVA type resin layers in the stretched laminates to determine and analyze the extent of crystallization and the orientation function with processes which will be described later.

With the solid line in FIG. 24, it has been confirmed that the molecular orientation of the PVA type resin is improved with increase of the stretching temperature in the elevated temperature in-air stretching of the PVA type resin layer included in the stretched laminate. In addition, with the broken line in FIG. 24, it has been confirmed that the molecular orientation of the PVA type resin is improved with increase of the stretching ratio under the elevated temperature in-air stretching of the PVA type resin layer included in the stretched laminate. Improving the molecular orientation or enhancing the extent of crystallization of the PVA type resin before the second stage in-boric acid solution stretching is effective to improve the resulting molecular orientation of the PVA type resin after the in-boric acid solution stretching. Further, it can be noticed in the T-P diagrams for the later described examples that, as the result of the improvement of the molecular orientation of the PVA type resin, it is also possible to improve the molecular orientation of poly-iodide ion.

The inventors could obtain unexpectedly remarkable results that, by increasing the stretching temperature or the stretching ratio during the first stage elevated temperature in-air stretching, the orientation of PVA molecules in the PVA type resin layer produced after the second stage in-boric acid solution stretching could be further enhanced.

Refer to the extent of crystallization of the PVA type resin shown in the horizontal axis of FIG. 24. It is preferable that the extent of crystallization of PVA type resin layer is 27% or higher in order for forming a dyed laminate without any problems such as dissolving of the PVA type resin layer during the dyeing process where a stretched laminate comprising the PVA type resin layer is immersed in a solution for dyeing. With such condition, it is possible to have the PVA type resin layer dyed without having the risk of the PVA type resin layer being dissolved. In addition, by having the extent of crystallization of the PVA type resin layer as high as 30% or higher, the temperature during the stretching in boric acid solution can be increased. With such increased stretching temperature, it becomes possible to carry out the stretching of the dyed laminate in a stable manner and to stably manufacture polarizing films.

On the other hand, if the extent of crystallization of the PVA type resin layer is 37% or higher, dyeing function is decreased to such an extent that the dye concentration in the dyeing solution must be increased, so that further problems arise in that there is a risk of the amount of dyeing material and the time for dyeing operation being increased, leading to a decrease in productivity. If the extent of crystallization of the PVA type resin layer is 40% or higher, there will be a further risk that the PVA type resin layer may be broken during the stretching in boric acid solution. Thus, the extent of crystallization of the PVA type resin layer should preferably be between 27% and 40%, and more preferably between 30% and 37%.

Now, reference is made to the orientation function of the PVA type resin layer shown in the vertical axis in FIG. 24. It is preferable that the orientation function of the PVA type resin layer is 0.05 or higher for manufacturing polarizing film using a non-crystallizable PET resin substrate. If the orientation function of the PVA type resin layer is 0.15 or higher, it is possible to decrease the stretching ratio under the stretching in boric acid solution for a dyed laminate comprising the PVA type resin layer. With this condition, it becomes possible to manufacture polarizing films of larger width.

On the other hand, with the orientation function of the PVA type resin layer equal to 0.30 or higher, dyeing function is decreased to such an extent that the concentration of dyeing material in dyeing solution must be increased, so that the further problems arise in that there is a risk of the amount of dyeing material and the time for dyeing operation being increased, leading to a decrease in productivity. With the orientation function of the PVA type resin layer of 0.35 or higher, there will be a further risk that the PVA type resin layer may be broken during the stretching in boric acid solution. Thus, the orientation function of PVA type resin layer should preferably be between 0.15 and 0.35, more preferably between 0.15 and 0.30.

It has been confirmed that the first technical problem can solved by the preliminary or auxiliary stretching of the laminate comprising a PVA type resin layer formed on the non-crystallizable PET substrate with the first stage elevated temperature in-air stretching, which allows for stretching the PVA type resin layer with a higher stretching ratio to thereby provide sufficient improvement of molecular orientation of PVA without encountering any restriction on the stretching ratio of a non-crystallizable PET substrate during the second stage in-boric-acid-solution stretching.

It is to be further noted that the solution to the second technical problem provided unexpected result that by adopting a higher stretching temperature for the preliminary or auxiliary stretching of the laminate comprising the PVA type resin layer formed on the non-crystallizable PET substrate during the first stage elevated temperature in-air stretching, or by attaining a higher stretching ratio during the preliminary or auxiliary stretching, it is possible to attain a further improvement in the orientation of the PVA molecules in the PVA type resin layer through the second stage in-boric-acid-solution stretching. In either of the cases, the first stage elevated temperature in-air stretching can be classified as a preliminary or auxiliary in-air stretching with respect to the second stage in-boric-acid-solution stretching. Hereinafter, the "first stage elevated temperature in-air stretching" is referred as the "preliminary in-air stretching" with respect to the second stage in-boric-acid-solution stretching.

A mechanism for solving particularly the second technical problem by performing the preliminary in-air stretching may be explained as follows. As shown in FIG. 24, the molecular orientation in the PVA type resin can be enhanced by the preliminary in-air stretching with an increase in the stretching temperature or the stretching ratio during the preliminary in-air stretching. It is assumed that the reason for this result is that the extent of crystallization of the PVA type resin is enhanced with the increase of the stretching temperature or the stretching ratio of the PVA type resin, so that the PVA type resin is stretched while points of crosslink are being partially formed. As a result, the molecular orientation in the PVA type resin is enhanced. It is assumed that by accomplishing such enhanced molecular orientation in the PVA type resin with the preliminary in-air stretching prior to the in-boric-acid-solution stretching, it is possible to facilitate cross-linking of the boric acid with the PVA type resin when the PVA type resin is immersed in the boric acid solution so that the PVA type resin is stretched with the boric acid serving as junction points. As the result, the molecular orientation in the PVA type resin is enhanced even after the in-boric-acid-solution stretching.

The followings set forth modes of embodiments of the present invention.

According to the first aspect, the present invention relates to a polarizing film in the form of a continuous web comprised of a PVA type resin having a dichroic material impregnated therein, wherein the polarizing film is formed by subjecting a PVA type resin layer to a stretching process, such that the PVA type resin layer has a thickness of 10 µm or less, the polarizing film having optical properties which satisfy conditions represented by the formulae:

$P > -(10^{0.929T-42.4}-1) \times 100$ (where $T < 42.3$); and $P \geqq 99.9$ (where $T \geqq 42.3$)

Where: T is the single layer transmittance and P is the polarization rate.

The dichroic material may be either iodine or a mixture of iodine and an organic dye. Preferably, the PVA type resin layer is formed on a non-crystallizable ester type thermoplastic resin substrate to form a laminate and the polarizing film is formed by subjecting the laminate to a 2-stage stretching process comprised of a preliminary in-air stretching and an in-boric-acid-solution stretching.

Any polarizing film that satisfies the above conditions as determined by the single layer transmittance T and the polarization rate P is principally considered as meeting performance requirements for use in a display for a liquid-crystal television using a large sized display element. Specifically, the performance requirements are equivalent to a contrast ratio of 1000:1 or higher, and, a maximum luminance of 500 cd/m$^2$ or higher. Hereinafter, the performance requirements will simply be referred as "required performance." As another application, the polarizing film can be used in an optically functional film laminate which is to be located at the viewing side of an organic electroluminescence (EL) display panel.

In an application where the polarizing films are used with liquid-crystal cells, the polarizing performance of either one of the polarizing films on a back light side or a viewing side should meet at least the above conditions. If a polarizing film with the polarization rate (P) of 99.9% or less is used for either one of polarizing films attached to the back light side or the viewing side, it will become impossible to attain the polarizing performance as a whole in a liquid crystal display device even if a polarizing film with the highest possible polarizing performance is used for the other of the polarizing films.

According to the first aspect of the present invention, there is provided an optically functional film laminate comprising a continuous web of the aforementioned polarizing film having one surface adhesively attached with an optically functional and the other surface provided with an adhesive agent layer, a separator being releasably laminated with the polarizing film through the adhesive agent layer. In this case, the optically functional film may be comprised of a triacetylcellulose (TAC) film.

According to the first aspect of the present invention, there may also be provided an optically functional film laminate comprising a continuous web of the aforementioned polarizing film having one surface adhesively attached with a first optically functional film and the other surface adhesively attached with a second optically functional film, a separator being releasably laminated to the second optically functional film through an adhesive agent layer. In this case, the first optically functional film may be comprised of a TAC film and the second optically functional film may be comprised of a biaxial phase difference film having refraction indices along three orthogonal axes having relation of nx>nz>ny.

In addition, the first optically functional film may be provided with an acrylic resin film and the second optically functional film may be a λ/4 phase difference film, the phase difference film being then placed with respect to the polarizing film such that the absorption axis of the polarizing film crosses the slow axis of the λ/4 phase difference film at an angle of 45±1 degrees.

According to the second aspect, the present invention relates to an optical film laminate comprising a continuous web of a non-crystallizable ester type thermoplastic resin substrate having a polarizing film formed on the non-crystallizable ester type thermoplastic resin substrate, the polarizing film comprising a PVA type resin having a dichroic material impregnated therein with an oriented state, wherein the polarizing film is formed by stretching a laminate comprising the PVA type resin layer formed on the non-crystallizable ester type thermoplastic resin substrate with a 2-stage stretching process comprised of a preliminary in-air stretching and an in-boric-acid-solution stretching, such that the PVA type resin layer has a thickness of 10 μm or less, and, the optical properties meeting the conditions represented by formulae:

$$P > -(10^{0.929T-42.4}-1) \times 100 \text{(where } T<42.3\text{); and}$$

$$P \geq 99.9 \text{(where } T \geq 42.3\text{)}$$

where T is single layer transmittance and P is a polarization rate.

According to the second aspect of the present invention, it is preferable that the non-crystallizable ester type thermoplastic resin substrate has a thickness which is at least 6 times as large as that of the PVA type resin layer as formed on the substrate, and more preferably at least 7 times. By having the thickness of the non-crystallizable ester type thermoplastic resin substrate of at least 6 times that of the PVA type resin layer, it is possible to suppress any possible problems such as breakage during transportation in manufacturing process induced by insufficient film strength, and formation of curling or deterioration of transferability when used as one of the polarizing films on a backlight side or a viewing side of a liquid-crystal display.

Reference is now made to FIG. 1. FIG. 1 shows a diagram which is prepared for the purpose of investigating if there may be any problem which may be caused by the relationship between the thickness of the non-crystallizable ester type thermoplastic resin substrate and that of the coating (the thickness of the polarizing film) of the PVA type resin layer. As shown in FIG. 1, with the ratio of the thicknesses of the non-crystallizable ester type thermoplastic resin substrate to that of the PVA type resin layer of around 5.0, it is concerned that a problem may arise during transportation. On the other hand, a concern may arise with the polarizing film having a thickness of 10 μm or more in that the anti-crack property may be lowered.

According to the second aspect of the present invention, it is preferable that the non-crystallizable ester type thermoplastic resin substrate is comprised of isophthalic acid-copolymerized polyethylene terephthalate, cyclohexanedimethanol-copolymerized polyethylene terephthalate, or non-crystallizable polyethylene terephthalate comprising other copolymerized polyethylene terephthalate, and may be of a transparent resin.

Dichroic material for dyeing the PVA type resin is preferably comprised of iodine, or a mixture of iodine and an organic dye.

According to the second aspect of the present invention, there is provided an optical film laminate comprising a polarizing film formed on a non-crystallizable ester type thermoplastic resin substrate, the polarizing film having a separator releasably laminated through an adhesive agent layer to a surface opposite to the surface where the non-crystallizable ester type thermoplastic resin substrate is attached. In this case, since the non-crystallizable ester type thermoplastic resin substrate serves as a protection film for the polarizing film, the resin substrate should be transparent.

According to the second aspect, there may further be provided an optically functional film laminate comprising a polarizing film formed on a non-crystallizable ester type thermoplastic resin substrate, the polarizing film having an optically functional film adhesively attached thereto at a surface opposite to the surface where the non-crystallizable ester type thermoplastic resin substrate is attached, an adhesive agent layer being formed on the optically functional film, a separator being releasably attached to optically functional film through the adhesive agent layer. In this case, it is preferable that the optically functional film is a biaxial phase difference film having refraction indices along three orthogonal axes having relation of nx>ny>nz.

According to the third aspect, the present invention relates to a stretched laminate comprising a stretched intermediate consisting of a molecularly oriented PVA type resin for manufacturing an optical film laminate comprising a continuous web of a non-crystallizable ester type thermoplastic resin substrate having a polarizing film laminated thereto, the polarizing film having a thickness of 10 μm or less and comprising the molecularly oriented PVA type resin formed on the non-crystallizable ester type thermoplastic resin substrate, the PVA type resin having a dichroic material impregnated therein in an oriented state, the polarizing film having the optical properties meeting the conditions represented by formulae:

$$P > -(10^{0.929T-42.4}-1) \times 100 \text{(where } T<42.3\text{); and}$$

$$P \geq 99.9 \text{(where } T \geq 42.3\text{),}$$

where T is the single layer transmittance and P is the polarization rate, the non-crystallizable ester type thermoplastic resin substrate being comprised of a preliminarily in-air stretched non-crystallizable polyethylene terephthalate with the orientation function of 0.10 or less being used for, and the PVA type resin being comprised of a PVA type resin having the extent of crystallization of between 27% to 40% and the orientation function of between 0.05 and 0.35.

According to the third aspect of the present invention, it is preferable that the non-crystallizable ester type thermoplastic resin substrate has a thickness which is at least 6 times and more preferably at least 7 times as large as that of the PVA type resin layer to be laminated thereon. With the thickness of the non-crystallizable ester type thermoplastic resin substrate larger than 6 times of that of the PVA type resin layer, there may arise problems such as breakage during transportation in manufacturing process induced by insufficient film strength, and formation of curling or deterioration of transferability when used as one of the polarizing films on a back light side or a viewing side of a liquid-crystal display.

According to the third aspect of the present invention, the non-crystallizable ester type thermoplastic resin substrate is preferably comprised of isophthalic acid-copolymerized polyethylene terephthalate, cyclohexanedimethanol-copolymerized polyethylene terephthalate, or non-crystallizable polyethylene terephthalate comprising other copolymerized polyethylene terephthalate, which may be transparent and has an orientation function of 0.10 or less, and may be stretched through an elevated temperature in-air stretching.

BRIEF DESCRIPTION OF THE DRAWINGS

FIG. 2 is a comparative diagram of the polarizing performance of the polarizing film with thicknesses of 3 µm, 8 µm and 10 µm;

FIG. 3 is a schematic diagram of T-P graphs showing the relationship between the single layer transmittance and the polarization rate;

FIG. 4 is a diagram showing a range of required performance of the polarizing film;

FIG. 5 is a diagram showing theoretical values of polarizing performance based on the dichroic ratio of polarizing films 1 to 7;

FIG. 6 is a comparative table showing differences in dissolution of the PVA type resin layer in accordance with differences in iodine concentration in dyeing bath;

FIG. 7 is a comparative diagram showing changes in the polarizing performance of the polarizing film formed with the PVA type resin layer in accordance with changes in iodine concentration in dyeing bath;

FIG. 26 is a diagram showing the polarizing performance of the polarizing films in accordance with the comparative test sample 1 and the reference test samples 1 to 3;

FIG. 27 is a list showing the manufacturing conditions of the polarizing films or the optical film laminates comprising the polarizing films in accordance with the examples 1 to 10;

FIG. 28 is a list showing the manufacturing conditions of the polarizing films or the optical film laminates comprising the polarizing films in accordance with the examples 11 to 18; and FIG. 29 is a comparative table showing the values of the orientation function for the examples 1 to 18 and the reference test samples 1 to 3.

BEST MODE FOR CARRYING OUT THE INVENTION

Figure 1:
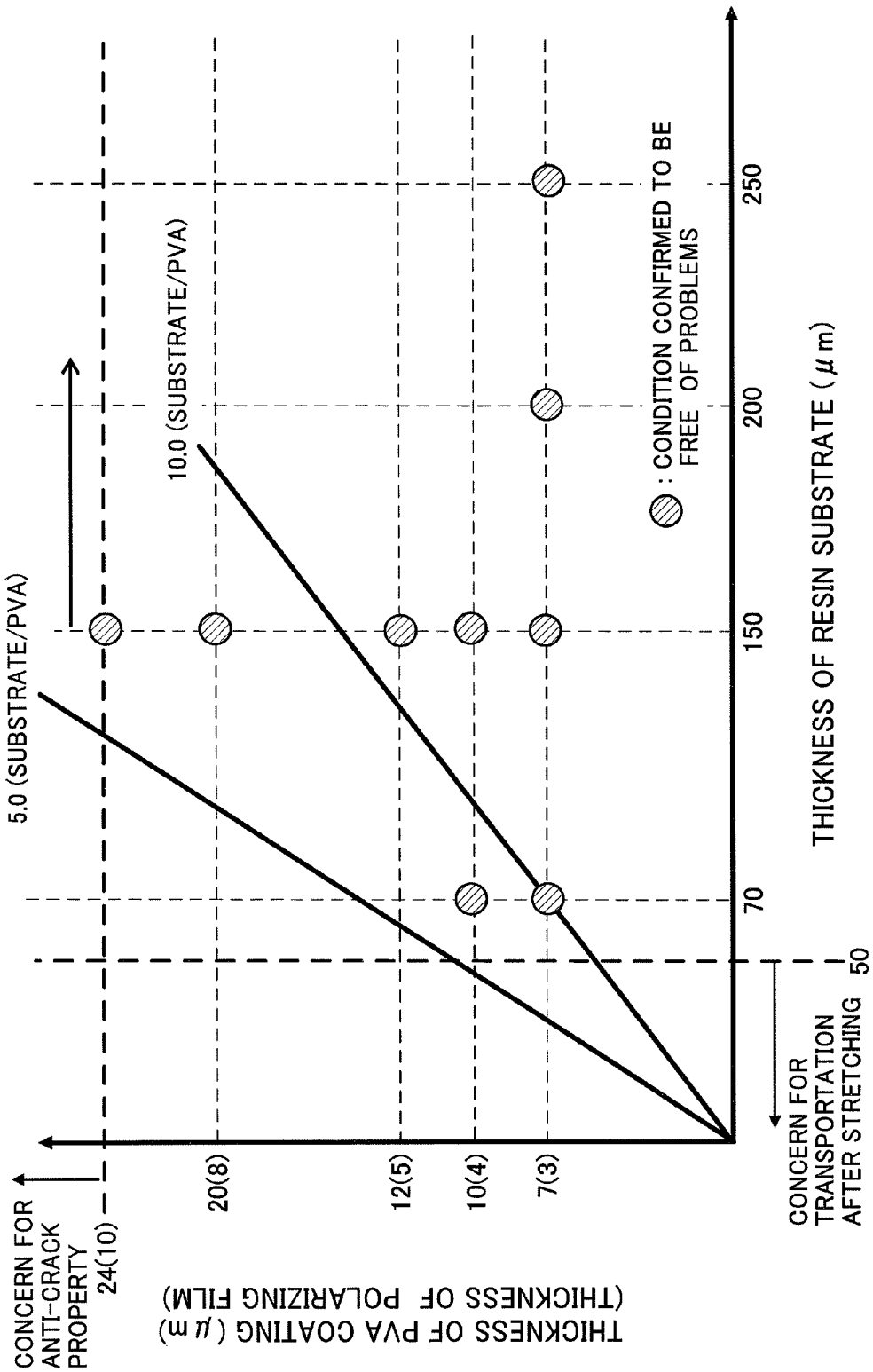
FIG. 1 is a diagram showing an appropriate thickness of the resin substrate with respect to the thickness of the PVA type resin layer (or the thickness of the polarizing film)

Descriptions will now be made on optical properties represented by material properties of the thermoplastic resin substrate used in the present invention and the polarizing performance of the polarizing film as background technologies of polarizing films.

General material properties of thermoplastic resins used in the present invention will now be described in the followings.

Thermoplastic resins are roughly classified into two categories, one being those which are in a crystallized state having regularly oriented polymer molecules and the other being those in an amorphous or non-crystallized state having polymer molecules which not regularly oriented or only in part regularly oriented. The former is referred as in a crystallized state and the latter in an amorphous or non-crystal state. Correspondingly, a thermoplastic resin having a nature of forming a crystallized state is referred as a crystallizable resin, and that which do not have such a nature is referred as a non-crystallizable resin. On the other hand, regardless whether it is crystallizable or not, a resin which is not in a crystallized state or which has not been crystallized is referred as amorphous or non-crystal resin. Herein, the term "amorphous" or "non-crystal" resin is used in a different meaning from a "non-crystallizable" resin that does not take a crystallized state.

Crystallizable resins include, for example, olefin type resins including polyethylene (PE) and polypropylene (PP), and ester type resins including polyethylene terephthalate (PET) and polybutylene terephthalate (PBT). One of the characteristics of such crystallizable resin is that heating or stretching generally causes polymer molecules being oriented and crystallization being progressed. Physical properties of such resins vary according to the extent of crystallization. On the other hand, even in the case of crystallizable resins such as PP and PET, it is possible to suppress crystallization by inhibiting polymer molecules being oriented through application of heat or stretching. Such PP and PET in which crystallization is thus suppressed are respectively referred as non-crystallizable polypropylene and non-crystallizable polyethylene terephthalate, and they are respectively generally referred as non-crystallizable olefin type resin and non-crystallizable ester type resin.

In case of PP, for example, it is possible to produce a non-crystallizable PP in which crystallization is suppressed by providing the PP with atactic structure having no stereoscopic regularity. Further, in case of PET, for example, it is possible to produce a non-crystallizable PET by copolymerizing modifier group such as isophthalic acid or 1,4-cyclohexanedimethanol as a polymerizing monomer, or by copolymerizing molecules that inhibit crystallization of PET.

General description will now be made on optical properties of polarizing film that may be used in a large sized display.

The term "optical properties" of a polarizing film is used in short to mean polarizing performance represented by polarization rate P and single layer transmittance T. In general, the polarization rate P and the single layer transmittance T of a polarizing film are in trade-off relationship. In a T-P diagram, there are plotted a plurality of values of the two optical factors. In a T-P diagram, it is interpreted that the polarizing performance of a polarizing film is superior if the single layer transmittance is higher (to the right of the diagram) and the polarization rate is higher (to the top of the graph) as indicated by the plotted line.

Reference is now made to the diagram in FIG. 3. It is to be noted that an ideal optical property is a case where T is 50% and P is 100%. Note that it is easier to increase the value of P with a low value of T, and it is difficult to increase the value of P with a high value of T. Further, referring to FIG. 4, there is shown a solid line drawn along plots to define a range in terms of the single layer transmittance T and the polarization rate P meaning that the values of the single layer transmittance T and the polarization rate P within the range meet specifically "required performance" providing a display contrast ratio of 1000:1 or higher and the maximum luminance of 500 cd/m² or higher. These specific values are considered to be, currently or even in future, optical properties required for a polarizing film for a large size display element. An ideal value of the single layer transmittance T is 50%, but when light transmits through a polarizing film, a part of light is reflected at a boundary between the polarizing film and air. Taking such reflection into consideration, it is noted that the single layer transmittance T is reduced by an extent corresponding to the portion of the reflected light, and the maximum attainable value of the single layer transmittance T may be 45 to 46%.

On the other hand, the polarization rate P may be converted to a contrast ratio (CR) of a polarizing film. For example, the polarization rate P of 99.95% corresponds to the contrast ratio CR of 2000:1 of a polarizing film. When this polarizing film is used in each of the opposite sides of a cell for a liquid-crystal television, the displayed image contrast ratio CR may be 1050:1. Such decrease in the displayed image contrast ratio CR as compared with the polarizing film contrast ratio CR is caused by the fact that depolarization occurs within the cell. Depolarization is caused by scatter and/or reflection of light which occur at the pigment in color filters, liquid-crystal molecule layer and a thin-film transistor (TFT) when the light is passed through the polarizing film on the backlight side and through the cell, resulting in a change in polarizing state of a part of the light. The contrast ratio CR of a liquid-crystal display television will become better and easier to observe the displayed image with increase in the contrast ratio CR of the polarizing film and that of the display.

By the way, the contrast ratio of a polarizing film is defined as a value of a parallel transmittance (Tp) divided by a cross transmittance (Tc). On the other hand, the contrast ratio of a display can be defined as a value of the maximum intensity of brightness divided by the minimum brightness. The minimum brightness is the one in a black screen, and in the case of a liquid-crystal display television under a general viewing environment, the required value for the minimum brightness is 0.5 cd/m² or lower. With the minimum brightness higher than the value, color reproducibility of the liquid-crystal display may be reduced. The maximum brightness is the one under a display of white screen, and a display with the maximum brightness or luminance in a range of 450 to 550 cd/m² is used for a liquid-crystal display television under a general viewing environment. With the maximum brightness or luminance lower than the value, visibility of the liquid crystal display may be reduced since the display may become dark to an unacceptable level.

Performance required for a display in a liquid-crystal television having a large size display element includes the display contrast ratio of 1000:1 or higher and the maximum brightness or luminance of 500 cd/m² or higher. These factors are referred as "required performance." The line 1 (T<42.3%) and the line 2 (T≧42.3%) in FIG. 4 are drafted along points of limit values of polarizing performance of a polarizing film necessary to achieve the required performance. These lines have been determined with the following simulations based on combinations of polarizing films on a backlight side and a viewing side shown in FIG. 5.

Contrast ratio and maximum brightness or luminance of a display for a liquid-crystal display television are calculated based on the intensity of light from the illumination light source (the backlight unit), the transmittance of two polarizing films, one on the backlight side and the other on the viewing side, the transmittance of cells, the polarization rate of the two polarizing films, one on the backlight side and the other on the viewing side, and the depolarization ratio of the cells. The lines 1 and 2 in FIG. 4 designate the boarder of the required performance and derived based on basic values including the intensity of the illumination light source (10,000 cd/m²), the transmittance (13%) and the depolarization ratio (0.085%) of the cells used in a conventional liquid-crystal display television, providing several pairs of polarizing films with various polarizing performance, and performing calculations to obtain the contrast ratio CR and the maximum brightness for each pair of the polarizing films in the display for a conventional liquid-crystal display television. It is to be understood that any polarizing film which does not reach the line 1 and/or the line 2 has the contrast ratio CR lower than 1000:1 and the maximum brightness lower than 500 cd/m². The followings are the equations used for the calculation.

Equation 1 is the one for determining the contrast ratio CR of a display. Equation 2 is for determining the maximum brightness of a display. Equation 3 is for determining the dichroic ratio of a polarizing film.

$$CRD = Lmax/Lmin \quad \text{Equation 1}$$

$$Lmax = (LB \times Tp - (LB/2 \times k1B \times DP/100)/2 \times (k1F - k2F)) \times Tcell/100 \quad \text{Equation 2}$$

$$R = A_{k2}/A_{k1} = \log(k2)/\log(k1) = \log(Ts/100 \times (1 - P/100)/T_{PVA})/\log(Ts/100 \times (1 + P/100)/T_{PVA}) \quad \text{Equation 3}$$

Where;
Lmin=(LB×Tc+(LB/2×k1B×DP/100)/2×(k1F−k2F))× Tcell/100
Tp=(k1B×k1F+k2B×k2F)/2×$T_{PVA}$
Tc=(k1B×k2F+k2B×k1F)/2×$T_{PVA}$
k1=Ts/100×(1+P/100)/$T_{PVA}$
k2=Ts/100×(1−P/100)/$T_{PVA}$
CRD: contrast ratio of the display
Lmax: maximum brightness or luminance of the display
Lmin: minimum brightness or luminance of the display
DR: dichroic ratio of the polarizing film Ts: single layer transmittance of the polarizing film
P: polarization rate of the polarizing film
k1: first primary transmittance
k2: second primary transmittance
k1F: k1 of the polarizing film on the viewing side
k2F: k2 of the polarizing film on the viewing side
k1B: k1 of the polarizing film on the backlight side
k2B: k2 of the polarizing film on the backlight side
$A_{k1}$: absorbance rate in the direction of transmission axis of the polarizing film
$A_{k2}$: absorbance rate in the direction of absorption axis of the polarizing film
LB: intensity of illumination light from the illumination light source (10,000 cd/m$^2$)
Tc: cross transmittance of polarizing films (a combination comprising a viewing side polarizing film and a backlight side polarizing film)
Tp: parallel transmittance of polarizing films (a combination comprising a viewing side polarizing film and a backlight side polarizing film)
Tcell: transmittance of cell (13%)
PC: depolarization ratio of cell (0.085%)
$T_{PVA}$: transmittance of a PVA film having no iodine impregnated therein (0.92)

The line 1 in FIG. 4 (T<42.3%) can be derived based on the polarizing performance of polarizing films belonging to group 3 shown in FIG. 5. Referring to the group 3 shown in FIG. 5, it is noted that a polarizing film D designated by a plot D (a white circle) has the polarizing performance represented by coordinates (T, P)=(42.1%, 99.95%), and two such polarizing film can be paired for use at respective ones of the backlight side and the viewing side of a display for a liquid-crystal display television to satisfy the required performance.

However, even in the case of those belonging to the same group 3, it is to be noted that the other three polarizing films designated as a polarizing film A (40.6%, 99.998%), a polarizing film B (41.1%, 99.994%) and a polarizing film C (41.6%, 99.98%) have transmittance rate lower than that of the polarizing film D, so that if two of such polarizing films are paired for use in both the backlight side and the viewing side, the required performance cannot be satisfied. When one of the polarizing films A, B and C is used on either one of the backlight side or the viewing side, it is required that the polarizing film on the other side has a higher single layer transmittance T than the group 3 polarizing film and the polarization rate P of 99.9% or higher, such as a polarizing film E in the group 4, a polarizing film F in the group 5 or a polarizing film G in the group 7 in order to attain the required performance.

The properties of the polarizing films belonging to the groups 1 to 7 are calculated in accordance with the Equation 3. Use of the Equation 3 allows for calculating the single layer transmittance ratio T and the polarization rate P based on the dichroic ratio (DR) which can be considered as an index of the polarizing properties of a polarizing film. The dichroic ratio is the absorbance rate in the direction of the absorption axis of a polarizing film divided by the absorbance rate in the direction of the transmission axis thereof. It is to be noted that with higher value of this ratio it is possible to attain better polarizing performance. For example, polarizing films in the group 3 are those having polarizing performance where the dichroic ratio is about 94. It means that any polarizing films with lower DR than this value do not satisfy the required performance.

If a polarizing film, such as a polarizing film H (41.0%, 99.95%) in the group 1 or a polarizing film J (42.0%, 99.9%) in the group 2, having inferior polarizing performance than the polarizing films in the group 3, is used as a polarizing film on either one of the backlight side or the viewing side, it is clear from the Equation 1 and the Equation 2 that a polarizing film, such as a polarizing film I (43.2%, 99.95%) in the group 6 or a polarizing film K (42.0%, 99.998%) in the group 7, having superior polarizing performance than the polarizing films in the group 3, has to be used on the other side to satisfy the required performance.

The polarizing performance of either one of the polarizing films on the backlight side or the viewing side have to be better than that of the polarizing films in the group 3 to satisfy the required performance of a display for a liquid-crystal display television. The line 1 (T<42.3%) in FIG. 4 indicates the lower limit of the polarizing performance, and the line 2 (T≧42.3%) indicates the lower limit of the polarization rate P. If a polarizing film with the polarization rate P of 99.9% or lower is used as a polarizing film on either one of the backlight side or the viewing side, the required performance cannot be satisfied even by using a polarizing film with the best possible polarizing performance on the other side.

In conclusion, in order to satisfy polarizing performance required for a display of a liquid-crystal display television using a large size display element, the polarizing performance of the polarizing film on either one of the backlight side or the viewing side should be at least in the range represented by the line 1 (T<42.3%) and the line 2 (T≧42.3%), and more specifically, the polarizing performance should be better than that of the polarizing films in the group 3, and the polarization rate should be 99.9% or higher.

Further, descriptions will now be made with respect to the method for manufacturing a polarizing film consisting of a PVA type resin using a thermoplastic resin substrate that a first and a second insolubilization in the embodiments of the present invention are considered to be parts of the measures for dealing with important technical challenges.

It is to be noted that it would not be an easy task to have iodine impregnated in a PVA type resin layer without having the PVA type resin layer included a stretched intermediate (or, a stretched laminate) being dissolved in a dyeing solution. It is an important technical challenge in the manufacture of a polarizing film to have iodine impregnated in a PVA type resin layer of a decreased thickness. Usually, the amount of iodine impregnated in the PVA type resin layer is controlled by using a plurality of dyeing solutions with different iodine concentration in a range of 0.12 to 0.25 wt % so that the dyeing process is carried out for a constant immersing time. With such usual dyeing process in the manufacture of a polarizing film, the PVA type resin layer can be dissolved to such an extent that dyeing becomes no longer possible. Herein, the term "concentration" means the rate of composition in relation to a total amount of solution. Further, the term "iodine concentration" means the rate of iodine in relation to the total amount of solution, and does not include amount of iodine content added as, for example, potassium iodide. Hereinafter, the terms "concentration" and "iodine concentration" are used in the same meanings as above.

The aforementioned technical challenge has been solved by raising the iodine concentration in the dichroic material to 0.3 wt % or higher as is clear from the experimental results shown in FIG. 6. In particular, a stretched laminate comprising a stretched intermediate consisting of a PVA type resin layer is dyed in dyeing solutions with different iodine concentration, and the immersion time is controlled to form a dyed laminate comprising dyed intermediate, and then is stretched in boric acid solution to allow for forming each of polarizing films with various polarizing performances.

Reference is made to the diagram shown in FIG. 7. In FIG. 7, it has been verified that there is no meaningful difference in the polarizing performance between polarizing films formed in the solutions of different iodine concentrations of 0.2 wt %, 0.5 wt % and 1.0 wt %. In this regard, in the manufacture of a dyed laminate including a dyed intermediate, it is preferable for accomplishing dyeing of excellent uniformity in a stable manner to use a solution of decreased iodine concentration so as to secure a stable immersion time, rather than to use a solution of increased iodine concentration for carrying out dyeing process within a short immersion time.

Figure 8:
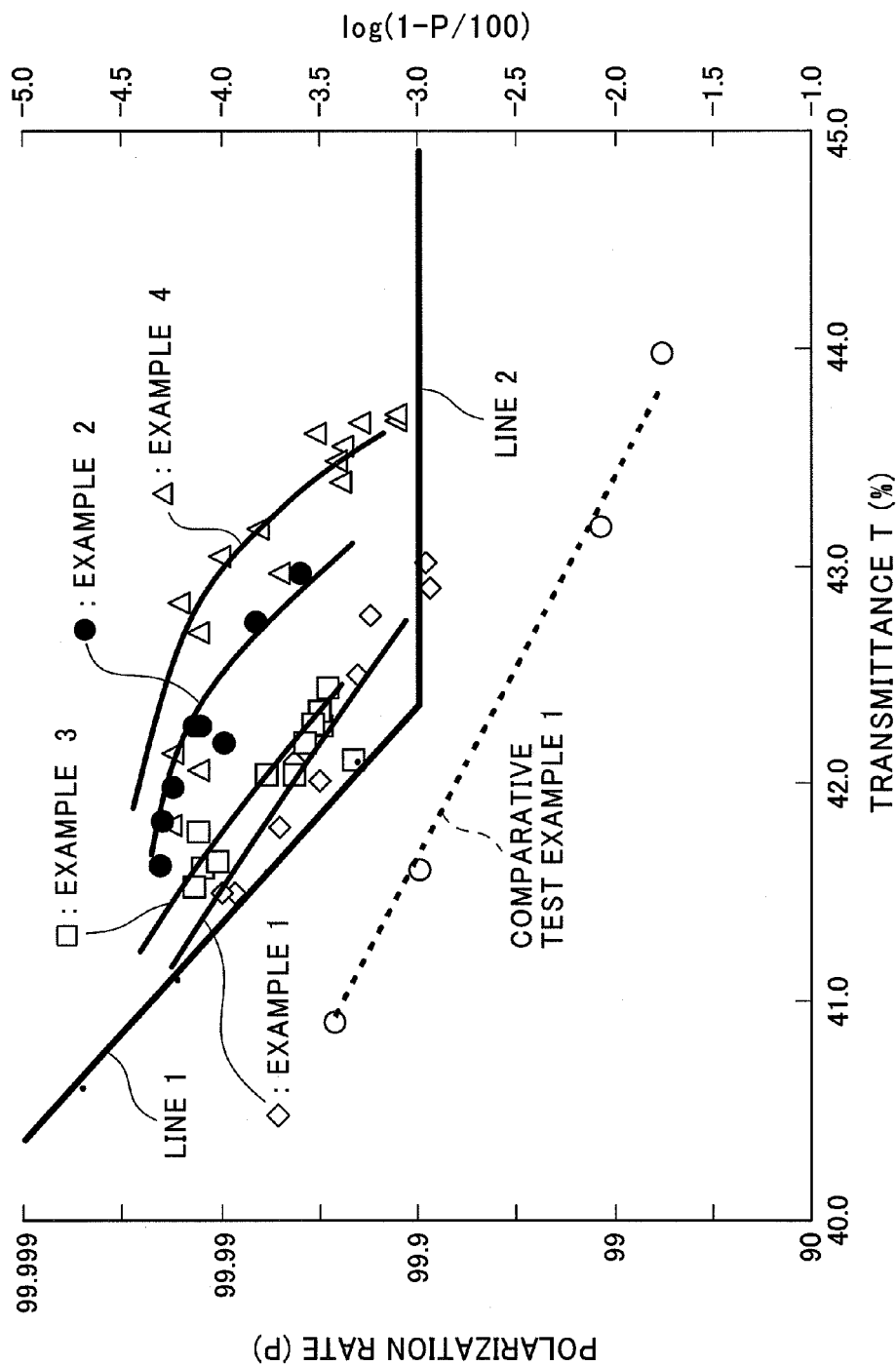
FIG. 8 is a comparative diagram showing the polarizing performances of the polarizing films of examples 1 to 4.

Reference is now made to the diagram in FIG. 8. It is to be noted that the first and second insolubilization processes in the embodiments of the present invention (hereinafter referred as "the first and the second insolubilization processes") both have effects on the optical properties of the finally manufactured polarizing films. FIG. 8 is considered as showing results of analysis relating to the effects of the first and the second insolubilization processes on the PVA type resin layer having decreased thickness. FIG. 8 has been drafted by plotting optical properties of each of polarizing films manufactured based on the examples 1 to 4 which satisfy the required performance for a display for a liquid-crystal display television using a large size display element.

The example 1 shows the optical properties of the polarizing film manufactured without adopting the first and the second insolubilization processes, the example 2 shows the optical properties of the polarizing film manufactured without adopting the first insolubilization process but adopting the second insolubilization process, the example 3 shows the optical properties of the polarizing film manufactured with the first insolubilization process but without the second insolubilization process, and the example 4 shows the optical properties of the polarizing film manufactured with both the first and the second insolubilization processes.

In the embodiments of the present invention, a polarizing film that satisfies the required performance may be manufactured without the first and the second insolubilization processes. However, as clearly shown in FIG. 8, the optical properties of the example 1, manufactured without the first and the second insolubilization processes, are inferior to those of the polarizing films in accordance with the examples 2 to 4. Comparing the optical properties of respective ones of the examples, it will be noted that the optical properties of the example 4 are the best, those of the example 2 are the second best, then followed by the example 3 and then the example 1. In each of the examples 1 and 2, a dyeing solution with the iodine concentration of 0.3 wt % and the potassium iodide concentration of 2.1 wt % is used. In contrast, in the examples 3 and 4, there have been used a plurality of dyeing solutions in which iodine concentrations have been varied in a range of 0.12 to 0.25 wt % and potassium iodide concentration in a range of 0.84 to 1.75 wt %. A decisive difference between the group of the examples 1 and 3 and the group of the examples 2 and 4 is that the dyed intermediate of the former group has not been insolubilized, but the dyed intermediate of the latter group has been insolubilized. For the example 4, the insolubilization processes have been applied not only to the dyed intermediate but also to the stretched intermediate before dyeing. It is to be noted that through the first and the second insolubilization processes, further improvements in the optical properties of the polarizing films have been accomplished.

It is to be noted that the mechanism for improving optical properties of a polarizing film does not owe to the iodine concentration in the dyeing solution as is clear in FIG. 7. It is understood that it is the result of the first and the second insolubilization processes. This findings may be regarded as a third technical challenge and the solution thereto in the manufacturing process of the present invention.

According to the embodiments of the present invention, the first insolubilization process is adopted to insolubilize the PVA type resin layer of a decreased thickness included in the stretched intermediate (or the stretched laminate). On the other hand, the second insolubilization process included in the cross-linking process is for stabilizing iodine impregnated in the PVA type resin layer in the dyed intermediate (or a dyed laminate) so that the iodine is prevented from being eluted during the in-boric-acid-solution stretching under the solution temperature of 75° C. in a later process, and for insolubilizing the PVA type resin layer of decreased thickness.

It should however be noted that, if the second insolubilization process was omitted, the iodine impregnated in the PVA type resin layer would possibly be eluted during the in-boric-acid-solution stretching under the solution temperature of 75° C., so that the PVA type resin layer would possibly be dissolved. Such elution of iodine and dissolution of the PVA type resin layer may be avoided by lowering boric acid solution temperature. For example, it is required to have a dyed intermediate (or a dyed laminate) stretched while it is immersed in the boric acid solution under the solution temperature lower than 65° C. However, such lowered solution temperature may result in a plasticizing function of water being utilized only to an insufficient extent, so that the PVA type resin layer included in the dyed intermediate (or the dyed laminate) may not be softened to a satisfactory level. Thus, there may be a risk that stretchability of the intermediate may be decreased to a level that breakage of the dyed intermediate (or the dyed laminate) may occur during the in-boric acid solution stretching. This will mean as a matter of fact that an intended total stretching ratio of the PVA type resin layer cannot be attained.

(General Description of the Manufacturing Process)

Figure 9:
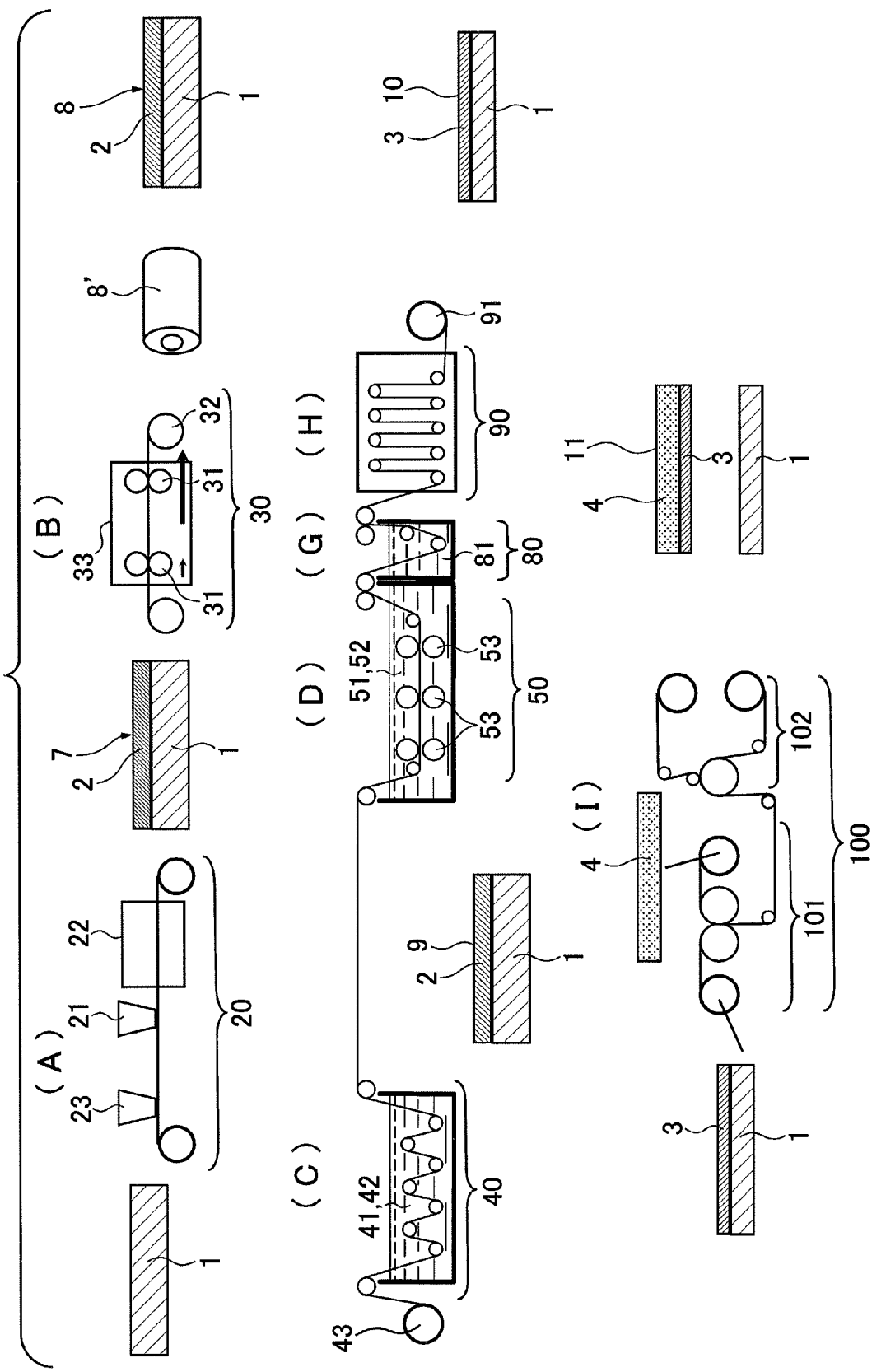
FIG. 9 is a schematic drawing showing a manufacturing process for producing an optical film laminate without insolubilization treatment.

Reference is made to FIG. 9. FIG. 9 is a schematic drawing showing one example of manufacturing process for an optical film laminate 10 comprising a polarizing film 3 in which an insolubilization process is not carried out. Here, description will be made on the method for manufacturing an optical film laminate 10 comprising a polarizing film 3 in accordance with the example 1.

A non-crystallizable ester type thermoplastic resin substrate has been provided in the form of a continuous web of substrate comprising isophthalic acid-copolymerized polyethylene terephthalate (hereinafter referred as non-crystallizable PET) including 6 mol % of isophthalic acid copolymerized therein. A laminate 7 has been produced from the continuous web of non-crystallizable PET substrate 1 having the glass-transition temperature of 75° C., and a PVA layer 2 having the glass-transition temperature of 80° C. in accordance with the following procedures.

(Laminate Manufacturing Process (A))

First, a non-crystallizable PET substrate 1 having a thickness of 200 μm, and a PVA solution have been prepared. The PVA solution had a PVA concentration of 4 to 5 wt % and made from powders of PVA having a degree of polymerization of 1000 or higher and a degree of saponification of 99% or higher, the powders being dissolved in water to prepare the solution. Then, using a laminate manufacturing apparatus 20 comprising a coating unit 21, a drying unit 22 and a surface modifying apparatus 23, the PVA solution is coated on the non-crystallizable PET substrate 1 with a thickness of 200 μm, and dried at a temperature of 50 to 60° C., to form a 7 μm-thick PVA layer 2 on the non-crystallizable PET substrate 1. Hereinafter, is the product formed as above is referred as "a laminate 7 comprising a 7 μm-thick PVA layer formed on a non-crystallizable PET substrate," or "a laminate 7 comprising a 7 μm-thick PVA layer," or simply as "a laminate 7."

The laminate 7 comprising a PVA layer is used to finally manufacture a 3 μm-thick polarizing film 3 through following processes including a 2-stage stretching including a preliminary in-air stretching and an in-boric-acid-solution stretching.

(Preliminary In-air Stretching Process (B))

In a first stage or preliminary in-air stretching process (B), the laminate 7 comprising the 7 μm-thick PVA layer 2 is integrally stretched with the non-crystallizable PET substrate 1 to form "a stretched laminate 8" including a 5 μm-thick PVA layer 2. Particularly, using a preliminary in-air stretching apparatus 30 comprising a stretching unit 31 located in an oven 33, the laminate 7 including the 7 μm-thick PVA layer 2 is subjected to an end-free uniaxial stretching by the stretching unit 31 in the oven 33 at a stretching temperature of 130° C. to a stretching ratio of 1.8, to form the stretched laminate 8. At this stage, the stretched laminate 8 may be wound into a roll 8' with a winding apparatus 32 provided in relation to the oven 33.

End-free stretching and fixed-end stretching will now be outlined. When a continuous film is stretched in the feeding direction, the film shrinks in the direction orthogonal to the stretching direction, i.e. in width-wise direction. The end-free stretching is a stretching process in which no restriction incurred against the shrinkage. A longitudinal uniaxial stretching is a method of stretching wherein a stretching force is applied only in the longitudinal direction. The end-free uniaxial stretching is generally compared with a fixed-end uniaxial stretching in which shrinkage occurring in the direction orthogonal to the stretching direction is restricted. Through the end-free uniaxial stretching, the 7 μm-thick PVA layer 2 included in the laminate 7 is stretched into a 5 μm-thick PVA layer 2 having PVA molecules oriented therein.

(Dying Process (C))

A dyeing process (C) is then carried out to produce a dyed laminate 9 having a dichroic material comprised of iodine impregnated in the 5 μm-thick PVA layer 2 which includes PVA molecules oriented therein. More specifically, there has been produced a dyed laminate 9 in which the oriented PVA layer 2 of the stretched laminate 8 includes iodine impregnated therein, using a dyeing apparatus 40 comprising a dye pool 42 of a dyeing solution 41 containing iodine and potassium iodide, to have the stretched laminate 8 unrolled from the roll 8' mounted on a feeding apparatus 43 provided in relation to the dyeing apparatus 40 and immersed for an appropriate time in the dyeing solution at a solution temperature of 30° C., so that a resultant polarizing film 3 provided by the PVA layer has a single layer transmittance (T) of 40 to 44%.

In the above process, the dyeing solution 41 contains water as a solvent and iodine with a concentration of 0.30 wt % in order that the PVA layer 2 included in the stretched laminate 8 will not be dissolved. In addition, the dyeing solution 41 contains potassium iodide of 2.1 wt % for making it possible to dissolve iodine in water. The ratio of concentration of iodine to that of potassium iodide is 1:7. Describing in more detail, the laminate 8 is immersed for 60 seconds in the dyeing solution 41 with iodine concentration of 0.30 wt % and potassium iodide concentration of 2.1 wt % to form the dyed laminate 9 having iodine impregnated in the 5 μm-thick PVA layer 2 in which PVA molecules are oriented therein. In the example 1, immersion time of the stretched laminate 8 in the dyeing solution 41 with iodine concentration of 0.30 wt % and potassium iodide concentration of 2.1 wt % is varied for controlling the impregnated amount of iodine so that dyed laminates 9 having several different values of the single layer transmittance T and those of the polarization rate P are produced within the range of the single layer transmittance T of 40 to 44%.

(In-Boric-Acid-Solution Stretching Process (D))

In a second stage or in-boric-acid-solution stretching process (D), the dyed laminate 9 including the PVA layer 2 having iodine impregnated therein in an oriented state is further stretched to form an optical film laminate 10 including the PVA layer having iodine impregnated therein in an oriented state which provides a 3 μm-thick polarizing film 3. Particularly, using an in-boric-acid-solution stretching apparatus 50 comprising a boric acid solution pool 52 of boric acid solution 51 and a stretching unit 53, the dyed laminate 9 continuously delivered from the dyeing apparatus 40 is immersed in the boric acid solution 51 containing boric acid and potassium iodide at a solution temperature of 65° C., then is fed to the stretching unit 53 arranged in the in-boric-acid-solution stretching apparatus 50 for an end-free uniaxial stretching, to a stretching ratio of 3.3, to form the optical film laminate 10.

Describing in more detail, the boric acid solution 51 has been provided in a form containing 4 parts in weight of boric acid with respect to 100 parts in weight of water, and 5 parts in weight of potassium iodide with respect to 100 parts in weight of water. In the process, the dyed laminate 9 included amount of iodine impregnated therein is firstly immersed for 5 to 10 seconds in the boric acid solution 51. The dyed laminate 9 is then passed as it is through a plurality of pairs of rolls driven with different peripheral speeds so as to constitute the stretching unit of the in-boric-acid-solution stretching apparatus 50 for carrying out the end-free uniaxial stretching to a stretching ratio of 3.3 in 30 to 90 seconds. This stretching process has been effective to change the PVA layer in the dyed laminate 9 to a 3 μm-thick PVA layer having the iodine impregnated therein in a high-order oriented state in one direction in the form of a polyiodide ion complex. The PVA layer provides the polarizing film 3 in the optical film laminate 10.

As described above, in the example 1, there has been produced an optical film laminate 10 comprising a 3 μm-thick PVA layer integrally stretched with a non-crystallizable PET substrate, starting with a laminate 7 comprising a 7 μm-thick PVA layer 2 formed on the non-crystallizable PET substrate 1, by subjecting it to a preliminarily in-air stretching at a stretching temperature of 130° C. to form a stretched laminate 8, then subjecting the stretched laminate 8 to a dyeing process to thereby form a dyed laminate 9, the dyed laminate 9 being then stretched in boric acid solution at a temperature of 65° C., so that the total stretching ratio becomes 5.94. Such 2-stage stretching allows for high-order orientation of the PVA molecules in the PVA layer 2 formed on the non-crystallizable PET substrate 1 to form an optical film laminate comprising a 3 μm-thick PVA layer providing a polarizing film 3 having iodine impregnated therein during dyeing process with a high-order orientation in the form of a polyiodide ion complex. Preferably, the formed optical film laminate 10 is subjected to subsequent cleaning, drying and transferring processes to obtain a finished product. The details of processes for the cleaning (G), drying (H) and transferring (I) will be described in association with a manufacturing process incorporating insolubilization process in the example 4.

(General Description of Other Manufacturing Processes)

Figure 10:
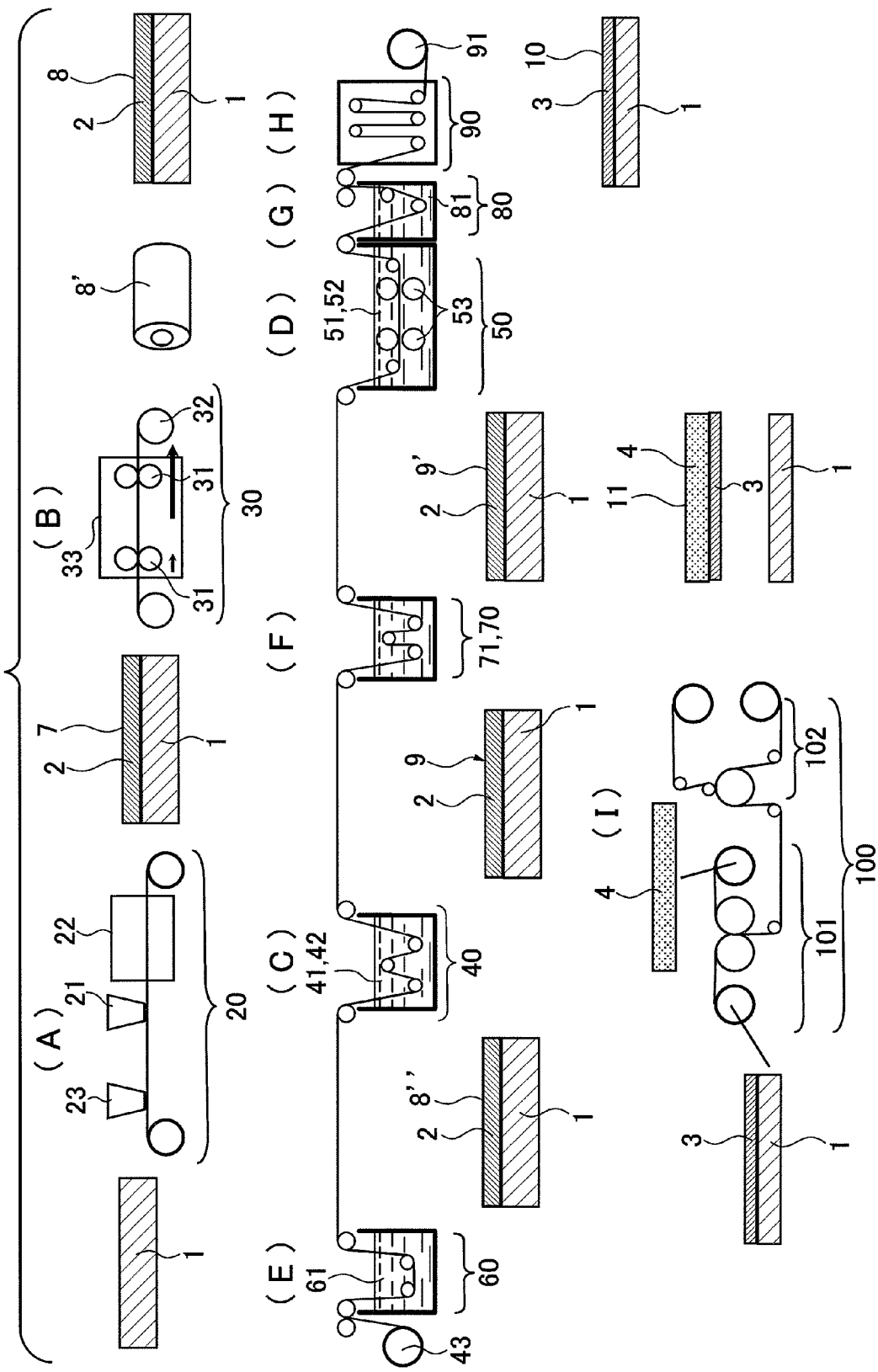
FIG. 10 is a schematic drawing showing a manufacturing process for producing an optical film laminate with insolubilization treatment.

Reference should now be made to FIG. 10. FIG. 10 is a schematic illustration of a method for manufacturing the optical film laminate 10 including the polarizing film 3 adopting an insolubilization process. Here, descriptions will be made with respect to a manufacturing process of the optical film laminate 10 including the polarizing film 3 in accordance with the example 4. As apparent in FIG. 10, the manufacturing process for the example 4 may be understood as being the one corresponding to the process for the example 1, but the first insolubilization is additionally incorporated before the dyeing process and the cross-linking process including the second insolubilization process before the in-boric-acid-solution stretching. In the present method, it can be interpreted that the laminate manufacturing process (A), the preliminary in-air stretching process (B), the dyeing process (C) and the in-boric-acid-solution stretching process (D) are identical to those in the manufacturing process of the example 1, except a difference in the temperature of the boric acid solution for the in-boric-acid-solution stretching. Thus, descriptions on these processes are only briefly be made, and the first insolubilization process before dying process and the cross-linking process including the second insolubilization process before in-boric-acid-solution stretching will be primarily described.
(First Insolubilization process (E))

The first insolubilization process is an insolubilization process (E) carried out prior to the dyeing process (C). As in the manufacturing process in accordance with the example 1, the laminate 7 comprising the 7 μm-thick PVA layer 2 formed on the non-crystallizable PET substrate is produced in the laminate manufacturing process (A), then the laminate 7 including the 7 μm-thick PVA layer 2 is subjected to an in-air stretching process as shown by the preliminary in-air stretching process (B) to form the stretched laminate 8 including the 5 μm-thick PVA layer 2. Subsequently, the stretched laminate 8 delivered from the roll 8' mounted on the feeding apparatus 43 is insolubilized to form the insolubilized stretched laminate 8". As a matter of fact, the insolubilized stretched laminate 8" includes an insolubilized PVA layer 2, is the laminate 8" being hereinafter referred as—a insolubilized stretched laminate 8"—.

More specifically, use is made of an insolubilizing apparatus 60 containing a boric acid insolubilizing solution 61, and the stretched laminate 8 is immersed for 30 seconds in the boric acid insolubilizing solution 61 under a solution temperature of 30° C. The boric acid insolubilizing solution 61 used in this process contains 3 parts in weight of boric acid with respect to 100 parts in weight of water (hereinafter referred as "boric acid insolubilizing solution"). This process aims at insolubilizing the 5 μm-thick PVA layer included in the stretched laminate 8 so that the PVA layer is prevented from being dissolved at least during the immediately following dyeing process (C).

After insolubilizing the stretched laminate 8, different dyeing solutions has been prepared with iodine concentration varying in a range of 0.12 to 0.25 wt %, in contrast to the case of the example 1, and various dyed laminates 9 having different values of the single transmittance and those of the polarization rate have been produced, using these dyeing solutions and maintaining the immersion time of the insolubilized stretched laminate 8" in the dyeing solution constant for controlling the amount of the impregnated iodine so that the single transmittance of the finally formed polarizing film becomes 40 to 44%. Even after such immersing in the dyeing solutions with iodine concentration of 0.12 to 0.25 wt %, the PVA layers in the insolubilized stretched laminates 8" have not been dissolved.
(Cross-Linking Process Including Second Insolubilization (F))

Cross-linking process can be interpreted as including a function of the second insolubilization in view of the objects described in the followings. The cross-linking process aims at, firstly making the PVA layer in the dyed laminate 9 insoluble during the following in-boric-acid-solution stretching process (D), secondly stabilizing the dye impregnated in the PVA layer so that iodine in the PVA layer will not be eluted, and thirdly forming junction points by cross-linking molecules in the PVA layer. The second insolubilization is realized by the first and the second aims.

Cross-linking (F) is a process performed prior to the in-boric-acid-solution stretching process (D). The dyed laminate 9 formed in the dyeing process (C) is cross-linked to form a cross-linked dyed laminate 9' that includes a cross-linked PVA layer 2. Specifically, use is made of a cross-linking apparatus 70 containing a solution 71 which includes iodine and potassium iodide (hereinafter referred as "boric acid cross-linking solution"), and the dyed laminate 9 is immersed for 60 seconds in the boric acid cross-linking solution 71 under a solution temperature of 40° C. to have the PVA molecules cross-linked in the PVA layer having iodine impregnated therein, to yield the cross-linked dyed laminate 9'. The boric acid cross-linking solution 71 in this process contains 3 parts in weight of boric acid with respect to 100 parts in weight of water and 3 parts in weight of potassium iodide with respect to 100 parts in weight of water.

In the in-boric acid solution stretching process (D), the cross-linked dyed laminate 9' is immersed in the boric acid solution under a solution temperature of 75° C. and subjected to an end-free uniaxial stretching process, to a stretching ratio of 3.3, to form the optical film laminate 10. Through the stretching process, the PVA layer 2 included in the dyed laminate 9' and having iodine impregnated therein has been converted to the 3 μm-thick PVA layer 2 which includes the impregnated iodine in the form of a polyiodide ion complex oriented in one direction with a high order orientation rate. This PVA layer provides the polarizing film 3 in the optical film laminate 10.

The example 4 has been prepared by firstly providing a laminate 7 comprising a 7 μm-thick PVA layer 2 formed on a non-crystallizable PET substrate 1, then subjecting the laminate 7 to an end-free uniaxial stretching to carry out the preliminary in-air stretching at a stretching temperature of 130° C. to the stretching ratio of 1.8 to form a stretched laminate 8. Then, the formed stretched laminate 8 is immersed in the boric acid insolubilizing solution 61 under a solution temperature of 30° C. to insolubilize the PVA layer included in the stretched laminate to form an insolubilized stretched laminate 8". The insolubilized stretched laminate 8" is immersed in dyeing solution containing iodine and potassium iodide under a solution temperature of 30° C. to form a dyed laminate 9 having iodine impregnated in the insolubilized PVA layer. Then, the dyed laminate 9 comprising the PVA layer having iodine impregnated therein is immersed for 60 seconds in the boric acid cross-linking solution 71 under a solution temperature of 40° C. to have PVA molecules in the PVA layer having iodine therein cross-linked to form the cross-linked dyed laminate 9'. Subsequently, the cross-linked dyed laminate 9' is immersed for 5 to 10 seconds in a solution 51 containing boric acid and potassium iodide for carrying out an in-boric-acid-solution stretching at a solution temperature of 75° C., and is subjected to an end-free uniaxial stretching in the solution for the in-boric-acid-solution stretching, to a stretching ratio of 3.3, to form the optical film laminate 10.

As described above, the process for the example 4 includes the 2-stage stretching consisting of the elevated temperature in-air stretching and the in-boric-acid-solution stretching, and the pre-processing consisting of the insolubilization before immersion in the dyeing pool and the cross-linking before the in-boric-acid-solution stretching, so that it is possible to manufacture the optical film laminate 10 in a stable manner, the laminate 10 including the 3 μm-thick PVA layer which provides the polarizing film in which the PVA molecules in the PVA layer 2 formed on the non-crystallizable PET substrate 1 are oriented with a high-order orientation rate and iodine molecules securely impregnated among the PVA molecules through the dyeing process are oriented therein with a high-order orientation rate in one direction in the form of an polyiodide ion complex.

(Cleaning Process (G))

The dyed laminate 9 or the cross-linked dyed laminate 9' in accordance with the example 1 or the example 4 is stretched in the in-boric-acid-solution stretching process (D), and then taken out of the boric acid solution 51. The taken out optical film 10 including the polarizing film 3 is preferably conveyed to a cleaning process (G) as it is. The cleaning process (G) aims at washing out unnecessary residuals depositing on a surface of the polarizing film 3. The cleaning process (G) may be omitted and the optical film 10 including the polarizing film 3 may be directly conveyed to a drying process (H). It should however be noted that, if the optical film laminate 10 is not sufficiently cleaned, boric acid may precipitate on the polarizing film 3 after drying process. Thus, the optical film laminate 10 is conveyed to a cleaning apparatus 80 and immersed for 1 to 10 seconds in a cleaning solution 81 containing potassium iodide under a solution temperature of 30° C. such that the PVA in the polarizing film 3 does not dissolve. Potassium iodide concentration in the cleaning solution 81 may be about 0.5 to 10 parts in weight with respect to 100 parts in weight of water.

(Drying Process (H))

The cleaned optical film laminate 10 is conveyed to a drying process (H) to be dried. Then, the dried optical film laminate 10 which is in the form of a continuous web is taken up by a winding apparatus 91 provided in relation to the drying apparatus 90 to provide a roll of the optical film laminate 10 including the polarizing film 3. Any appropriate process, such as natural drying, blow drying and thermal drying, may be adopted for the drying process (H). In both the examples 1 and 4, the drying process has been performed with warm air at a temperature of 60° C. for 240 seconds in the drying apparatus 90 provided in the oven.

(Laminating and Transferring Process (I))

The optical film laminate 10 comprising the 3 μm-thick polarizing film 3 formed on the non-crystallizable PET substrate is wound as a roll of the optical film laminate 10, and then is subjected to laminating and transferring steps which are carried out simultaneously in a laminating/transferring process (I) such as a process described in the followings. The manufactured polarizing film 3 is of a decreased thickness by being stretched and may be as thin as 10 μm or less, usually only 2 to 5 μm, such reduced thickness making it difficult to handle the polarizing film 3 as a single layer. Thus, the polarizing film 3 needs to be handled in the form of an optical film laminate 10 after it has been formed on the non-crystallizable PET substrate, or, as an optically functional film laminate 11 which is provided by laminating and transferring the polarizing film to another optically functional film 4 through a bonding agent.

In the laminating/transferring process (I) shown in FIG. 9 or FIG. 10, the optically functional film 4 is laminated to the optical film laminate 10 at a side of the polarizing film 3 through a bonding agent, and the non-crystallizable PET substrate is peeled from the polarizing film 3. Thus, the polarizing film 3 is transferred to the optically functional film 4, to form the optically functional film 11 which is then taken up into a roll. Specifically, the optical film laminate 10 is fed out by a feeding/laminating apparatus 101 included in a laminating/transferring apparatus 100, and laminated to the optical film laminate 10 at a side of the polarizing film 3 through a bonding agent, the polarizing film 3 being then peeled from the optical film laminate 10 to have the polarizing film 3 transferred to the optically functional film 4 by means of a winding/transferring apparatus 102, to thereby form the optically functional film laminate 11.

The optical film laminate 10 taken up into a roll by the winding apparatus 91 in the drying process (H) or the optically functional film laminate 11 formed in laminating/transferring process (I) can take wide varieties of structures.

Figure 11:
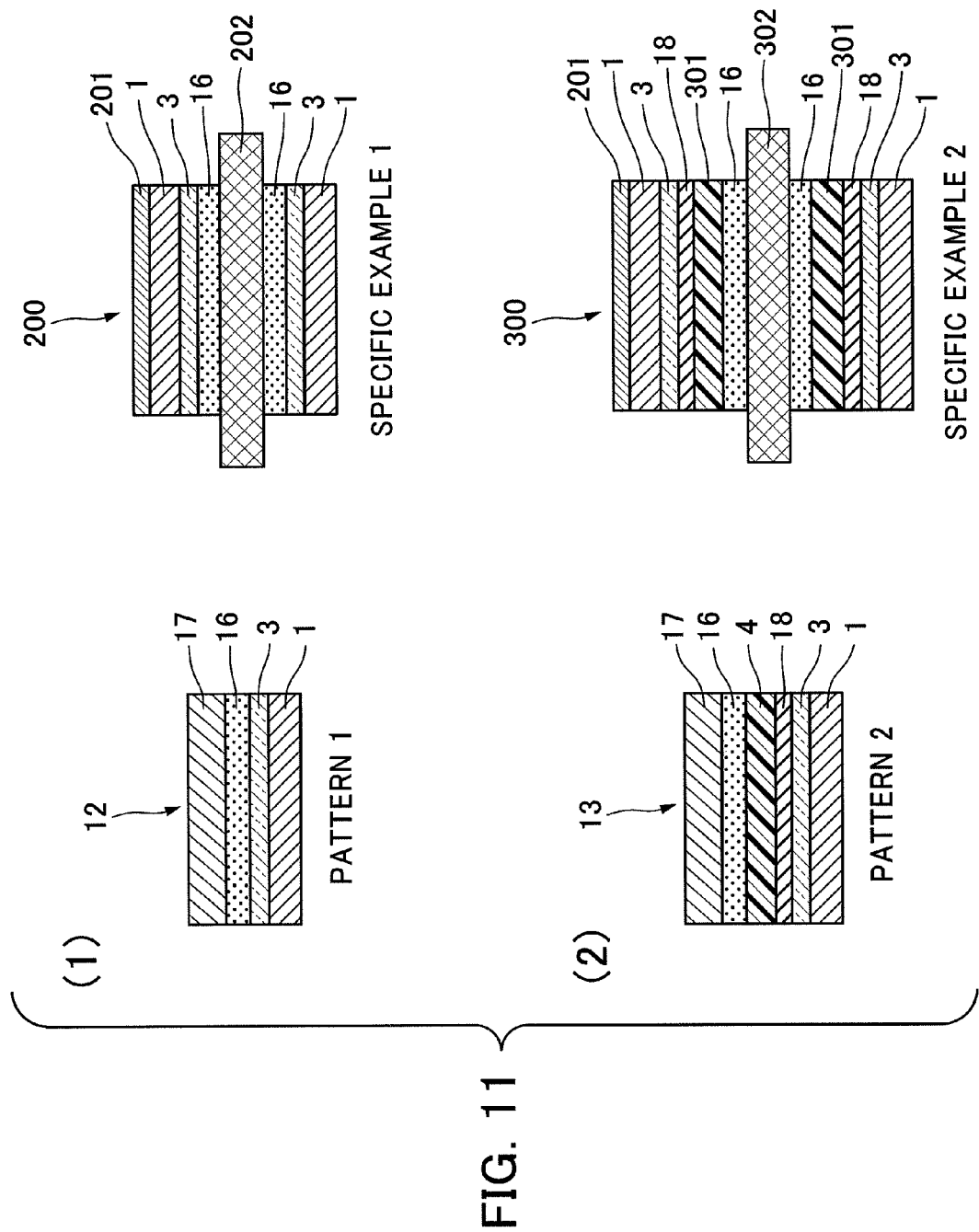
FIG. 11 shows examples of optical film laminate wherein the polarizing film is laminated.
Figure 12:
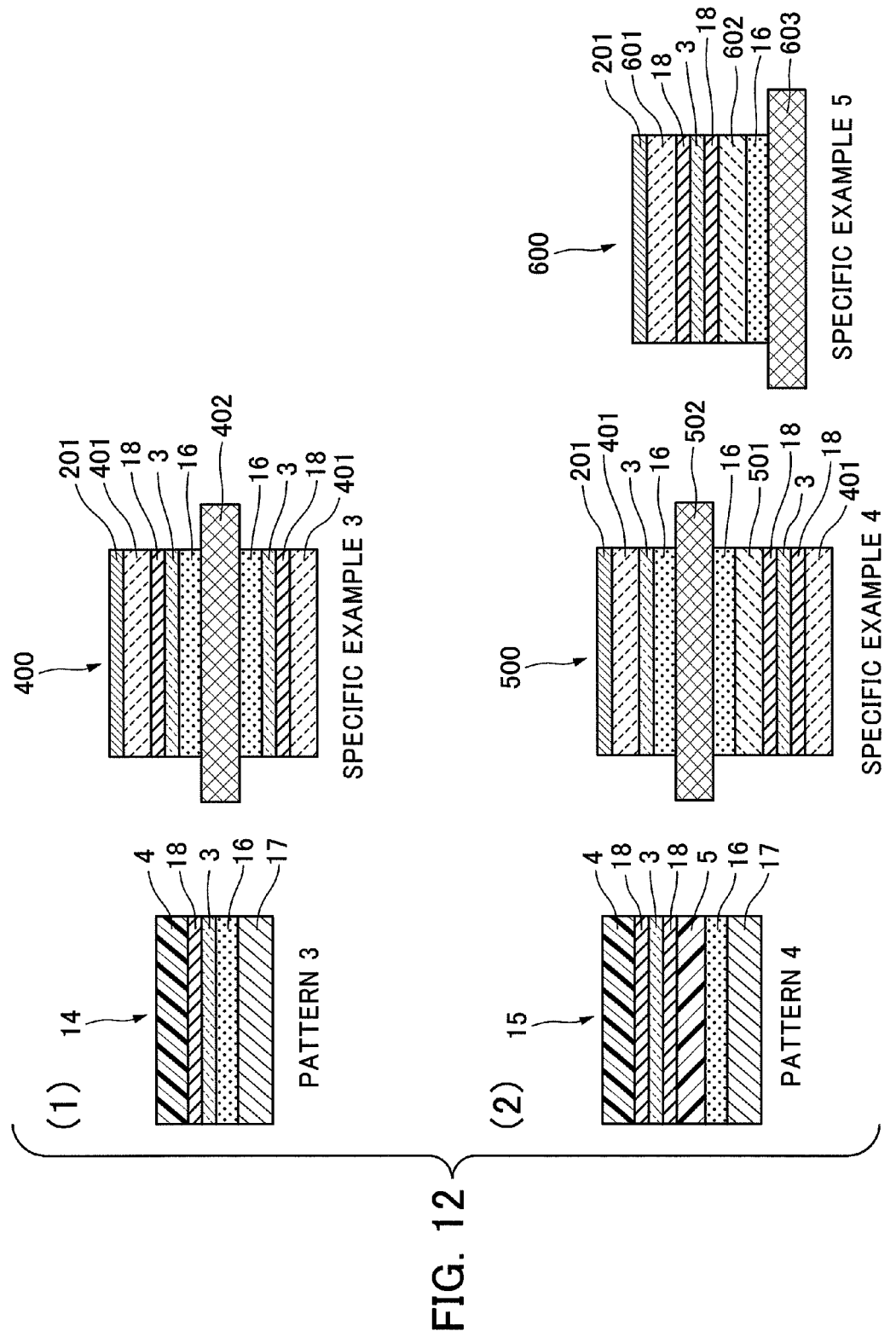
FIG. 12 shows examples of optically functional film laminate wherein the polarizing film is laminated.

FIG. 11 and FIG. 12 show varieties of structures of the optical film laminate 10 or the optically functional film 11 as typical patterns 1 to 4.

In FIG. 11 illustrating the patterns 1 and 2, there are shown in schematic sections laminated structures of an optical film laminate 12 and an optical film laminate 13 having sectional configurations which are different from that in the optical film laminate 10. The optical film laminate 12 includes a separator 17 which is laminated on the polarizing film 3 of the optical film laminate 10 through an adhesive agent layer 16. As shown in the specific example 1 in FIG. 11, in the case where the non-crystallizable PET substrate 1 constitutes a protection film, the laminate 12 may be used as an optical film laminate on either a backlight side or a viewing side of, for example, a display panel 200 for an IPS-type liquid-crystal display television. In this case, two of the optical film laminates may be attached to both sides of the IPS liquid-crystal cell 202 respectively through the adhesive agent layers 16. In this configuration, a surface treatment layer 201 may generally be formed on the viewing side surface of the non-crystallizable PET substrate 1.

The optical film laminate 13 is constructed to include an optically functional film 4 which is attached to the polarizing film 3 of the optical film laminate 10 with a bonding agent layer 18, a separator 17 being attached to the optically functional film 4 with an adhesive agent layer 16. As shown in the specific example 2 in FIG. 11, in the case where the optically functional film 4 is a biaxial phase difference film 301 with refraction indices nx, ny and nz along three orthogonal axes have relation of nx>ny>nz, the optical film laminate 13 may be used as an optically functional film laminate for use either on a backlight side or a viewing side of, for example, a display panel 300 for a VA-type liquid-crystal display television. In this case, the optical film laminates are attached to both sides of the VA type liquid-crystal cell 302 respectively with the adhesive agent layers 16. In this configuration, a surface treatment layer 201 may generally be formed on the viewing side surface of the non-crystallizable PET substrate 1. Both the optical film laminate 12 and the optical film laminate 13 are characterized in that the non-crystallizable PET substrate 1 is not peeled off the polarizing film 3 but is used as, for example, a protection film of the polarizing film 3.

In FIG. 12 illustrating the patterns 3 and 4, there are shown in schematic sections structures of an optical film laminate 14 and an optical film laminate 15 which have sectional configurations different from that of the optical film laminate 11. The optical film laminate 14 includes a polarizing film 3 which has in advance been transferred to the optically functional film 4 by having the non-crystallizable PET substrate 1 peeled therefrom and attached to the optically functional film 4 with a bonding layer 18. The optical film laminate 14 further includes a separator 17 which is attached through an adhesive agent layer 16 to the surface of the polarizing film 3 opposite to the surface from which the non-crystallizable PET substrate 1 has been peeled. As shown in the specific example 3 in FIG. 12, in the case where the optically functional film 4 is comprised of a protection film made of a TAC film 401, the laminate 14 may be used as an optically functional film laminate for use either on a backlight side or a viewing side of, for example, a display panel 400 for an IPS-type liquid-crystal display television. In this case, the optical film laminates attached to both sides of the IPS liquid-crystal cell 402 respectively with the adhesive agent layers 16. In this configuration, a surface treatment layer 201 may generally be formed on the viewing side surface of the TAC film 401.

The optical film laminate 15 includes a second optically functional film 5 which is attached through a second bonding agent 18 to the surface of the polarizing film 3 opposite to the surface from which the non-crystallizable PET substrate 1 has been peeled in transferring the polarizing film 3 to the optically functional film 4 using a first bonding agent 18 to form a laminate, a separator 17 being attached to thus formed laminate with the adhesive agent 16. As shown in the specific example 4 in FIG. 12, in the case where the optically functional film 4 is comprised of a TAC film 401 and the second optically functional film 5 is a biaxial phase difference film 501 having refraction indices nx, ny and nx along three orthogonal axes with a relation of nx>nz>ny, the optical film laminate 15 may be used as an optically functional film laminate for use on a backlight side of, for example, a display panel 500 for an IPS-type liquid-crystal display television. In this case, such optical film laminate is attached to the backlight side of the IPS liquid-crystal cell 502 with the adhesive agent layer 16.

The optically functional film laminate 15 may further be used as an anti-reflection film (a circular polarizing plate) for preventing surface reflection in a display apparatus or interface reflection at an interface of members in the display apparatus, by forming the second optically functional film as a λ/4 phase difference film 602. Particularly, in the case where the optically functional film 4 is in the form of an acrylic resin film 601, where the second optically functional film 5 constitutes a λ/4 phase difference film 602, or where the polarizing film 3 and the λ/4 phase difference film are laminated with a lamination angle between the absorption axis of the polarizing film 3 and the slow axis of the λ/4 phase difference film being set to 45±1 degrees, then the laminate 15 may be used as an anti-reflection film of, for example, an organic electroluminescence (EL) display 600 as shown in the specific example 5 in FIG. 12. In this case, such optically functional film may be attached to the viewing side of the organic EL panel 603 with the adhesive agent layer 16. In this configuration, a surface treatment layer 201 may generally be formed on the viewing side of the acrylic resin film 601. Both the optical film laminate 14 and the optical film laminate 15 are characterized in that the laminate used in the laminate is the one from which the non-crystallizable PET substrate 1 has been peeled off at the same time when the polarizing film 3 is transferred to the optically functional film 4.

It should further be noted that the optically functional film in each of the layers constituting respective ones of the optically functional film laminates 11, 14 and 15, and the optical film laminates 12 and 13 is not limited to those described above. The optically functional film may comprise anyone of a triacetylcellulose (TAC) film or a polarizing film protection film containing acrylic resin, any phase difference film including a biaxial phase difference film (for example, a film having refraction indices nx, ny and nz with a relation of nx>ny>nz, or nx>nz>ny), a λ/4 phase difference film, a λ/2 phase difference film, a positive-dispersion phase difference film, a flat-dispersion phase difference film, a reverse-dispersion phase difference film, a brightness enhancement film, and a diffusion film. In addition, a plurality of those films may be laminated together for use. The adhesive agent layer 16 or the bonding agent layer 18 may be of any appropriate adhesive agent or bonding agent. Representatively, the adhesive agent layer may be of an acrylic adhesive agent and the bonding agent layer may be of a vinyl alcohol type bonding agent.

(Optical Properties of Polarizing Film Manufactured Under Various Conditions)

(1) Improvement in the Optical Properties of the Polarizing Film with Insolubilization (Examples 1 to 4)

It has been clarified in the descriptions with reference to FIG. 8 that, each of the polarizing films manufactured based on the examples 1 to 4 has been effective to overcome the technical objects of the present invention, and that the optical properties of each of the polarizing films satisfy the required performance for a display of liquid-crystal display television using a large size display element. Further, as is clear from the diagram in FIG. 8, the optical properties of the polarizing film of the example 1 without insolubilization are inferior to any of optical properties of the polarizing films of the examples 2 to 4 with the first and/or the second insolubilization. The optical properties of the examples have the following relation in terms of superiority: The example 4 with the first and the second insolubilization> the example 2 with only the second insolubilization> the example 3 with only the first insolubilization> the example 1. It is to be further noted that improvements can be accomplished in the optical properties of the polarizing film or those of the optical film laminate including the polarizing film, by applying the first and/or the second insolubilization process in addition to the manufacturing process of the optical film laminate 10.

(2) Influence of the Thickness of the PVA Type Resin Layer on the Optical Properties of the Polarizing Film (Example 5)

In the example 4, the 7 μm-thick PVA layer has been stretched to finally obtain the 3 μm-thick PVA layer in the optical film laminate, whereas in the example 5, the 12 μm-thick PVA layer has been stretched to finally obtain the 5 μm-thick PVA layer in the optical film laminate. This polarizing film in the example 5 has been manufactured under the same conditions as in the example 4 except the thickness.

(3) Influence of the Difference in Type of the Non-Crystallizable PET Substrate on the Optical Properties of the Polarizing Film (Example 6)

In the example 4, the non-crystallizable PET substrate has included isophthalic acid copolymerized to PET, whereas in the example 6, use has been made of a non-crystallizable PET substrate including 1,4-cyclohexanedimethanol copolymerized to PET as a modified base. This polarizing film was manufactured under the same conditions as in the example 4 except the modified base.

Figure 13:
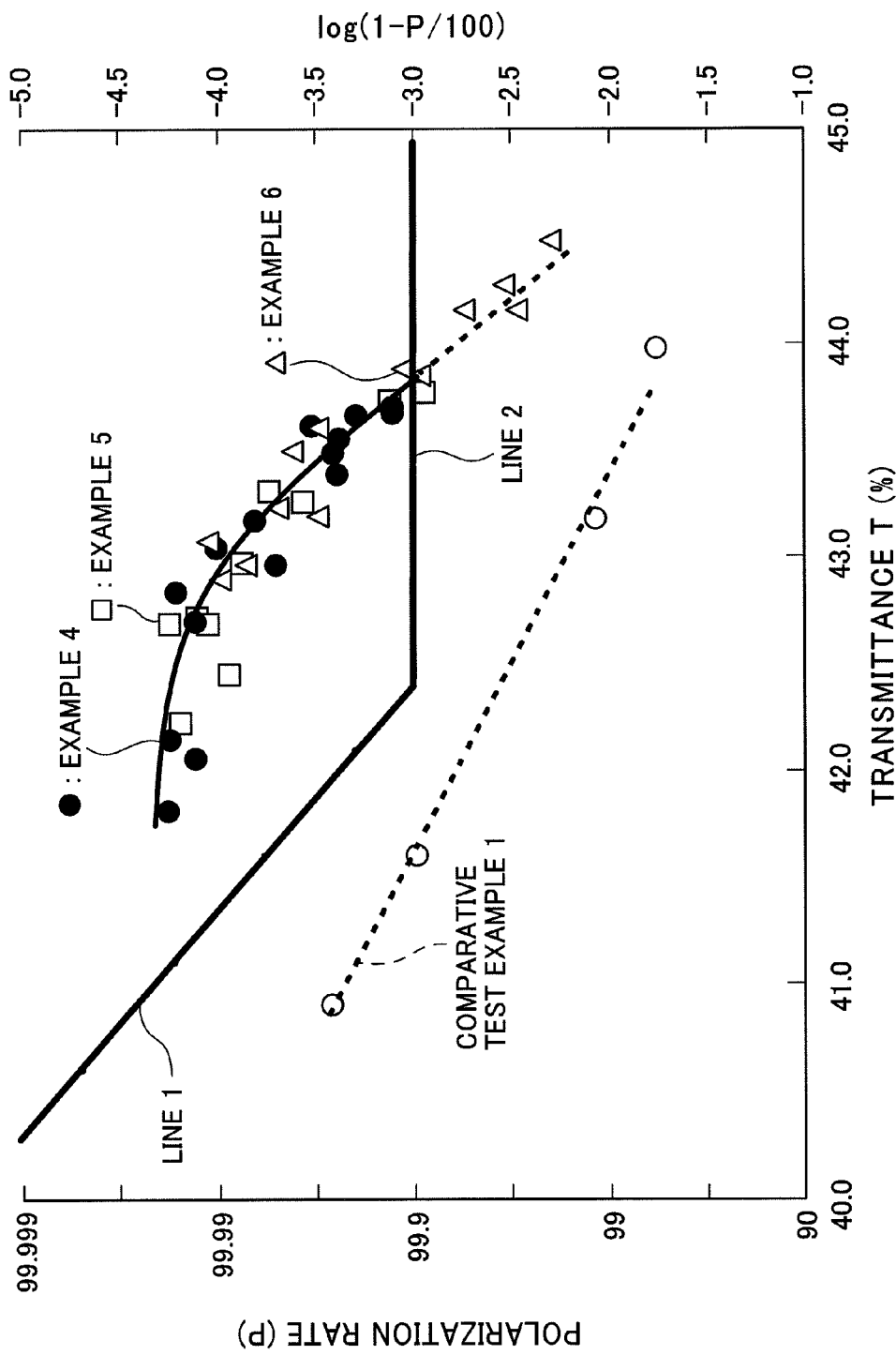
FIG. 13 is a comparative diagram showing the polarizing performance of the polarizing films (PVA layer thickness, non-crystallizable PET substrate) in accordance with the examples 4 to 6.

Reference is now made to the diagram in FIG. 13. It is noted that there is no significant difference among the optical properties of the polarizing films manufactured in accordance with the examples 4 to 6. It is understood from the results that the thickness of the PVA type resin layer or the type of the non-crystallizable ester type thermoplastic resin does not affect the optical properties.

(4) Improvement in the Optical Properties of the Polarizing Film Provided by the Preliminary In-Air Stretching Ratio (Examples 7 to 9)

Figure 20:
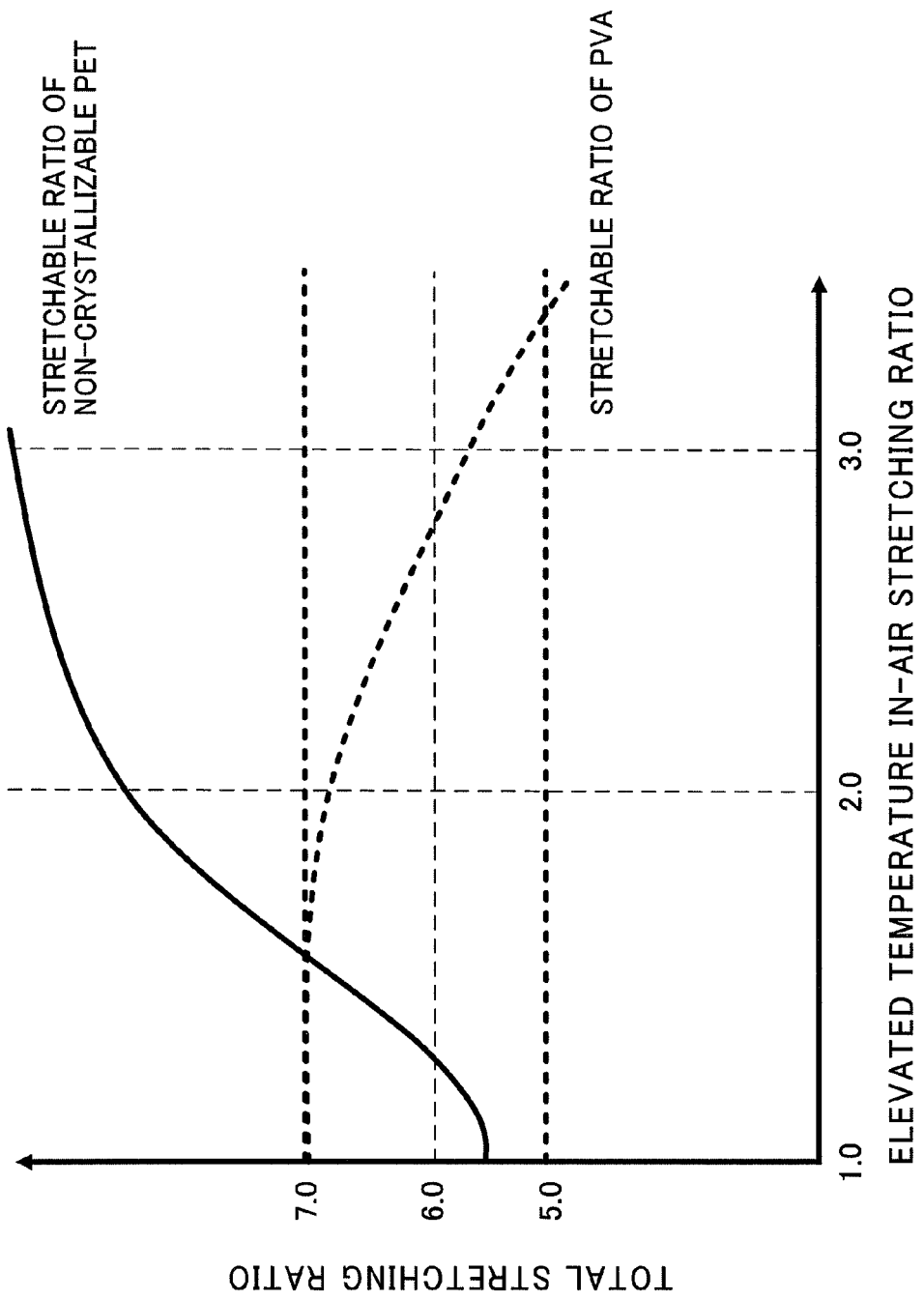
FIG. 20 is a schematic diagram showing the relationship between the stretching ratio under the elevated temperature in-air stretching and the total stretching ratio of the non-crystallizable PET and the PVA type resin.
Figure 21:
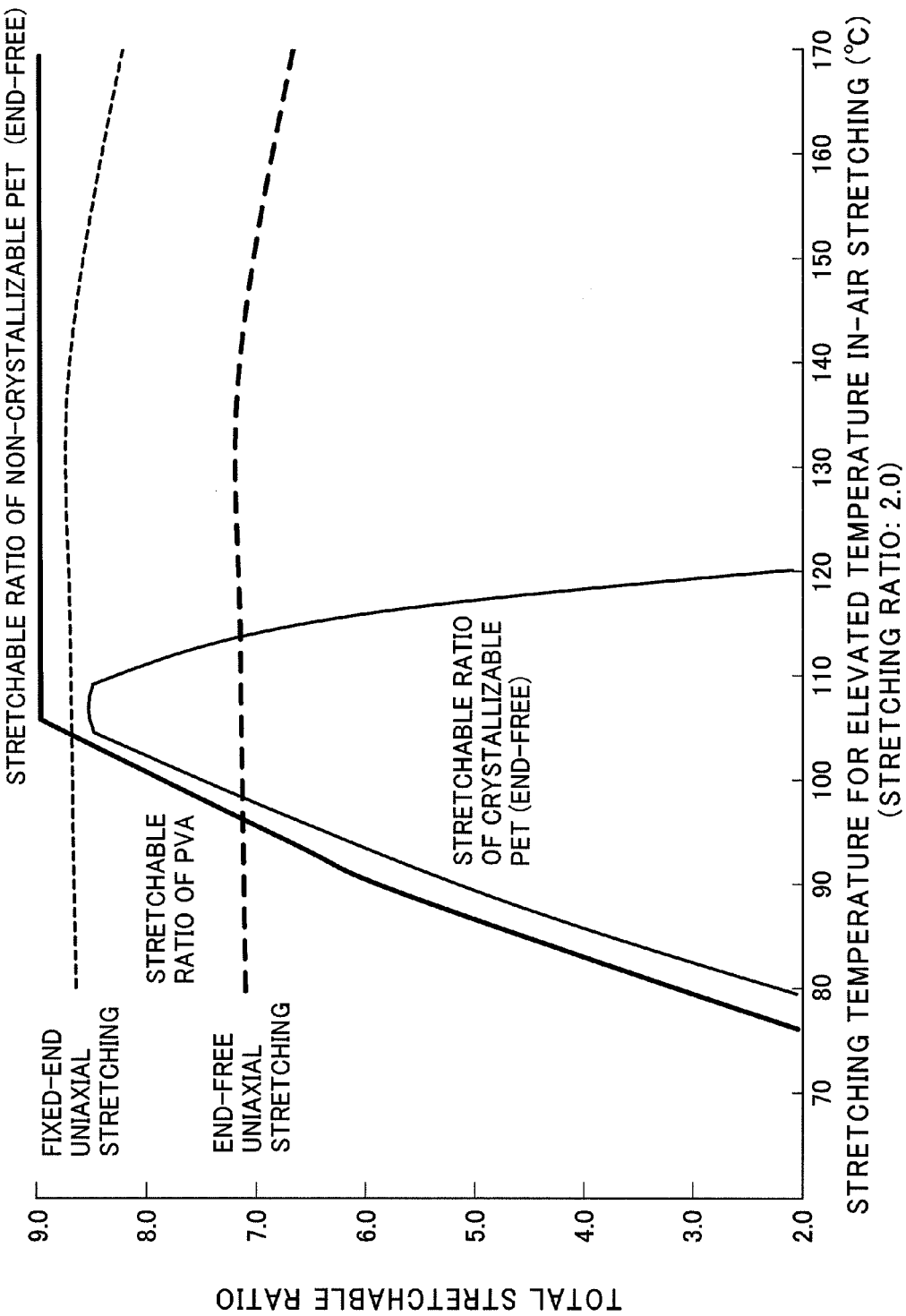
FIG. 21 is a schematic diagram showing the relationship between the stretching temperature in the elevated temperature in-air stretching and the total attainable stretching ratio of each of the crystallizable PET, the non-crystallizable PET and the PVA type resin.
Figure 22:
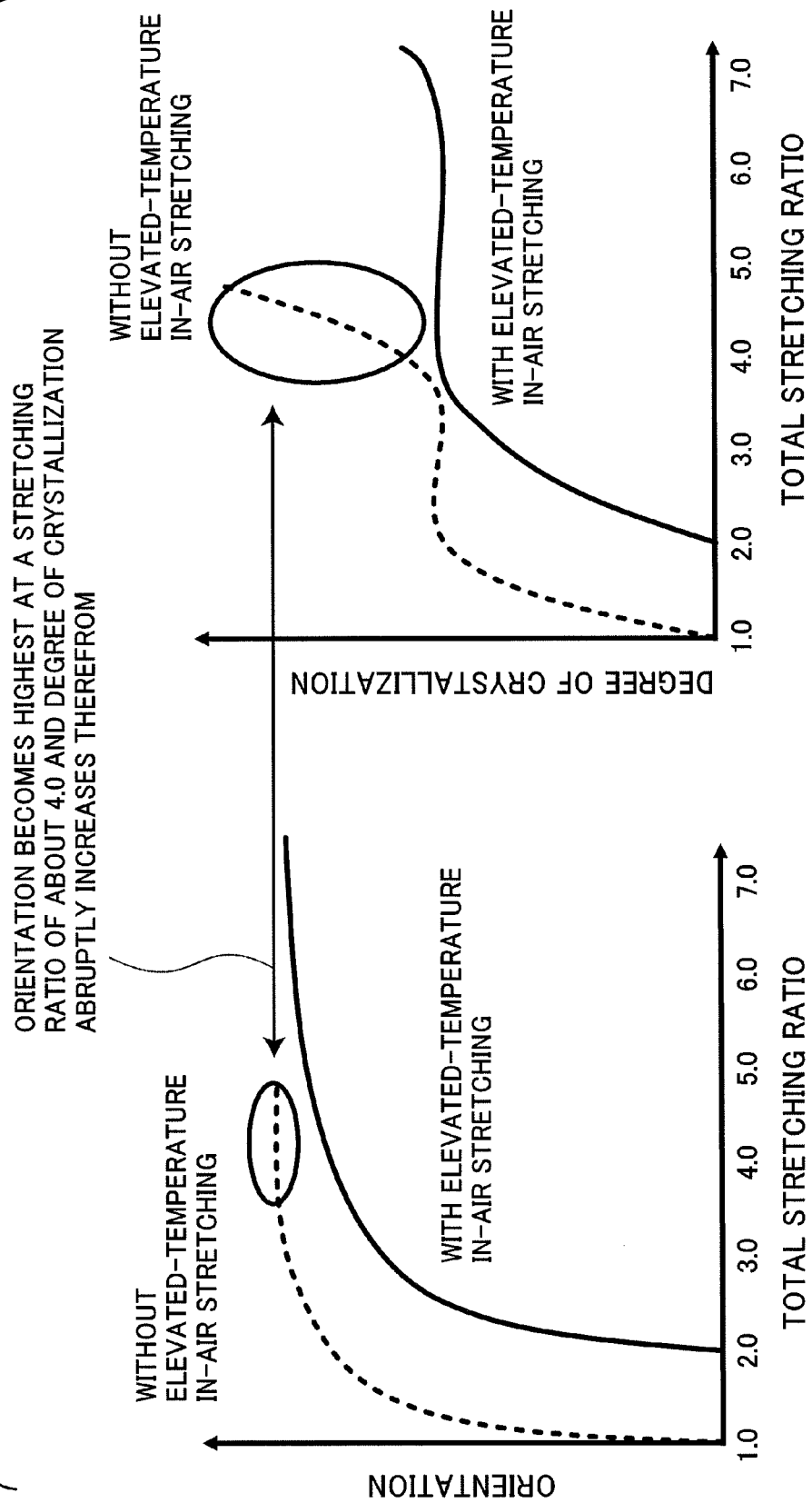
FIG. 22 is a schematic diagram showing the relationships between the total stretching ratio and the molecular orientation, and the extent of crystallization of the PET used as the thermoplastic resin substrate.
Figure 23:
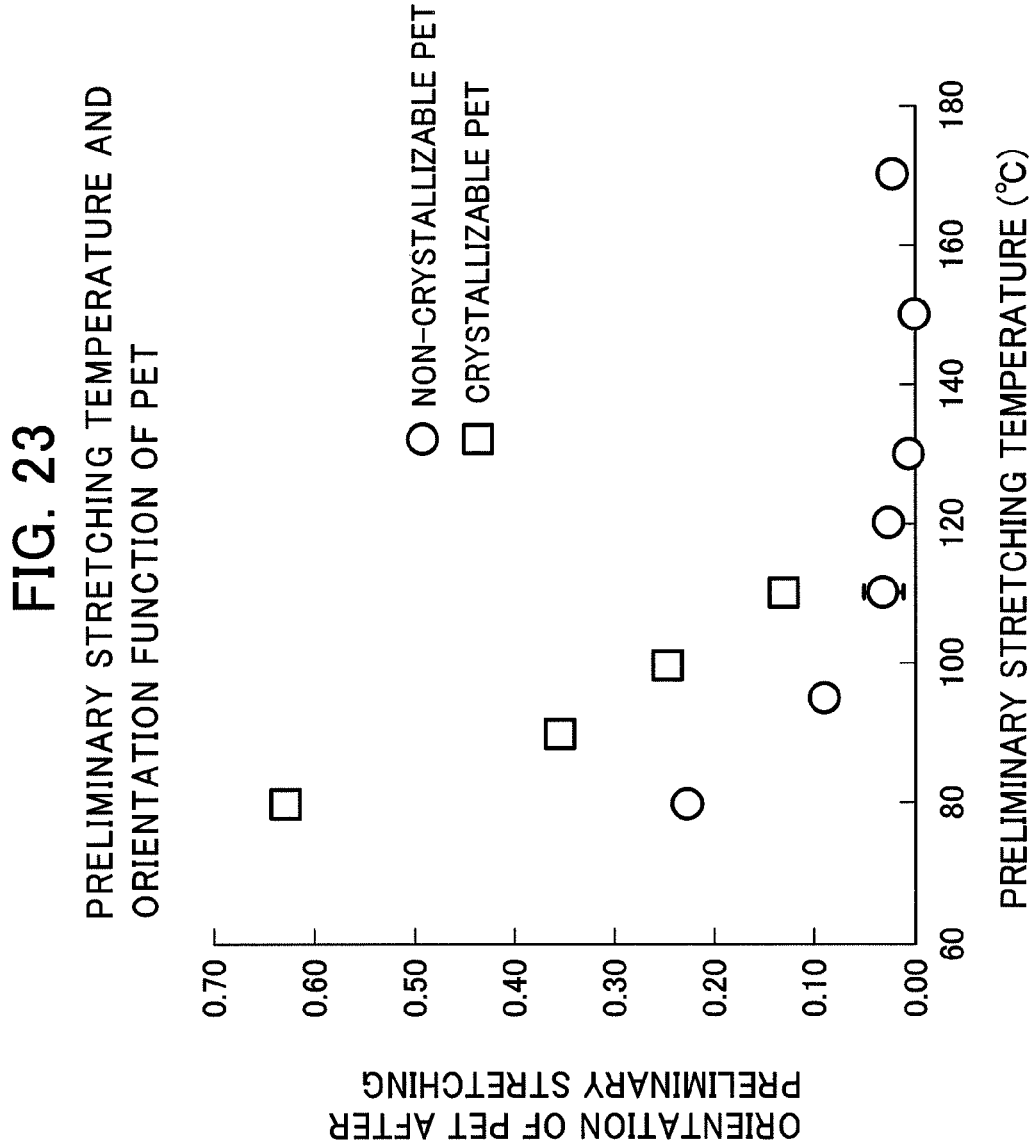
FIG. 23 is a diagram showing the relationship between the stretching temperature of the preliminary in-air stretching at a stretching ratio of 1.8 and the orientation function of PET after the preliminary in-air stretching.
Figure 24:
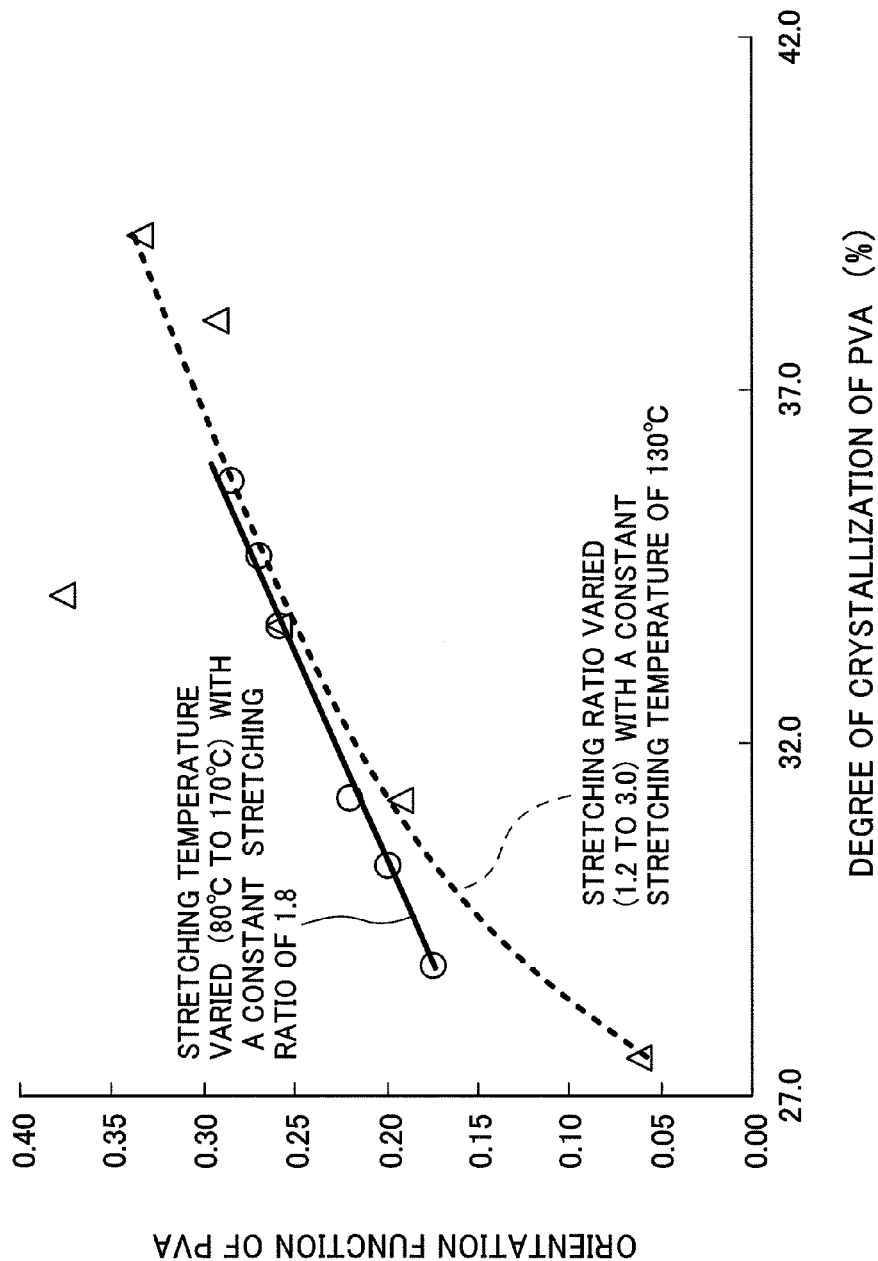
FIG. 24 is a diagram showing the relationship between the extent of crystallization and the orientation function of PVA.
Figure 25:
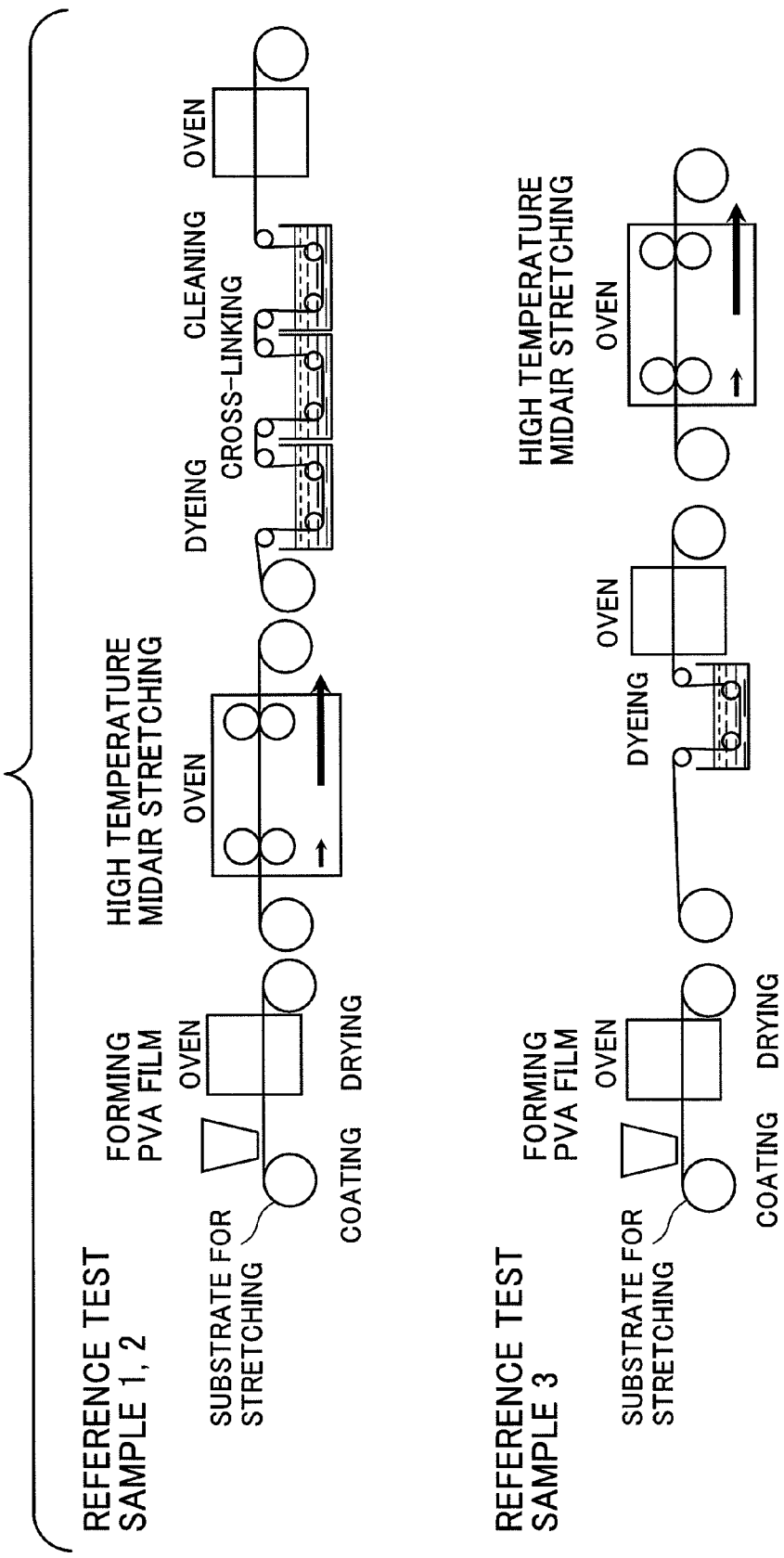
FIG. 25 is a schematic drawing showing examples of manufacturing process of polarizing film using the thermoplastic resin substrate.

In the example 4, the stretching ratio of the first stage preliminary in-air stretching has been 1.8 and that of the second stage in-boric-acid-solution stretching has been 3.3, whereas in the examples 7 to 9, the stretching ratios of the first stage preliminary in-air stretching and the second stage in-boric-acid solution stretching have respectively been 1.2 and 4.9, 1.5 and 4.0, and 2.5 and 2.4. The polarizing films of the examples 7 to 9 have been manufactured under the same conditions including the stretching temperature of 130° C. and the boric acid solution temperature of 75° C. as in the example 4 except the stretching ratios. The total stretching ratio in each one of the examples 8 and 9 has been 6.0, which is not noticeably different from the total stretching ratio of the example 4 wherein the total stretching ratio of 5.94 has been accomplished by the preliminary in-air stretching with the ratio of 1.8. However, in contrast to this, the total stretching ratio of the example 7 has been limited to 5.88. This result has been caused by the fact that it has not been possible to bring the stretching ratio of the in-boric-acid-solution stretching to a level beyond 4.9. It is assumed that this result has been obtained due to the influence of the stretchable ratio of non-crystallizable PET on the relationship between the total stretching ratio and the first stage preliminary in-air stretching ratio, as explained with reference to FIG. 20.

Figure 14:
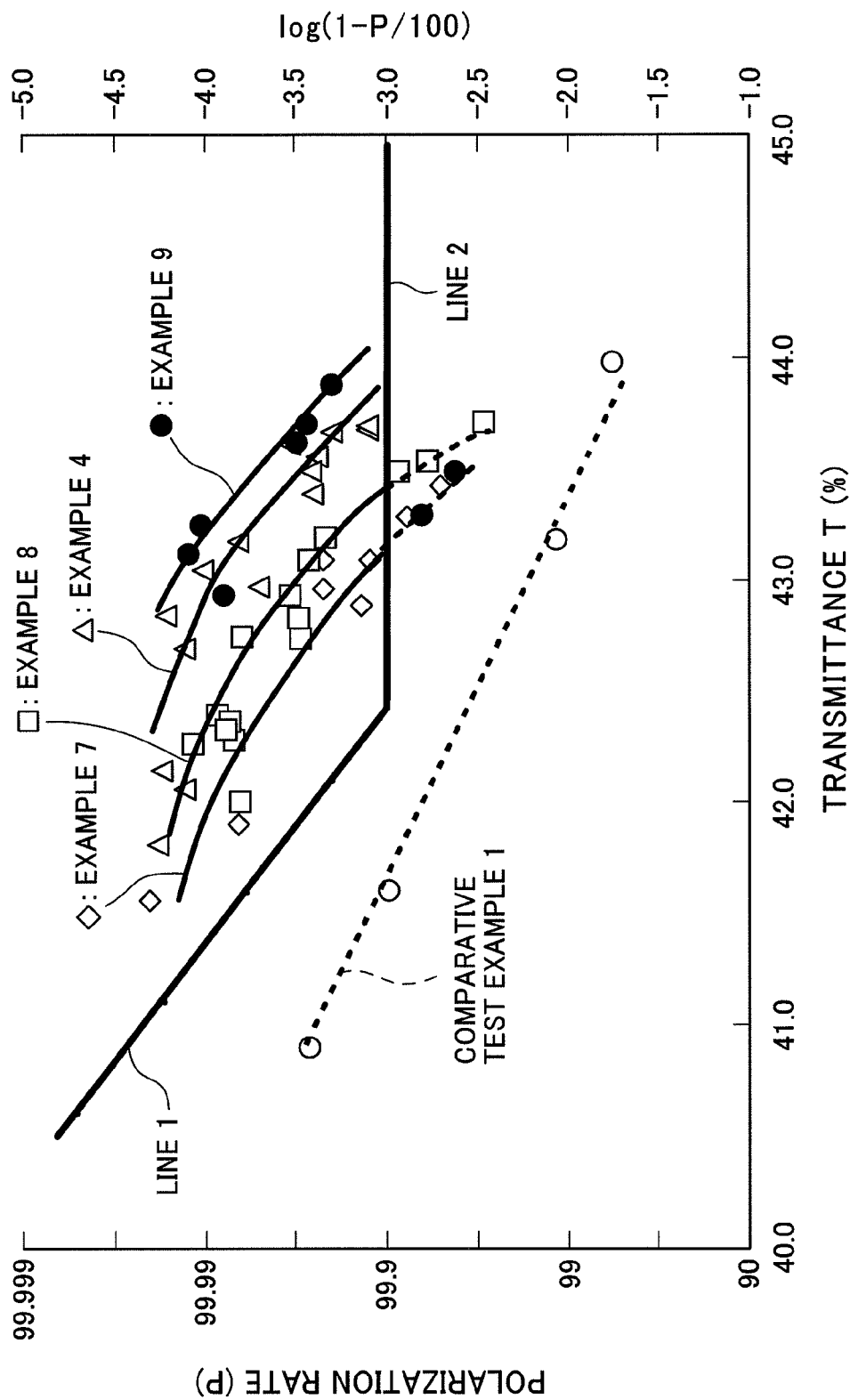
FIG. 14 is a comparative diagram showing the polarizing performance of the polarizing films (preliminary in-air stretching ratio) in accordance with the examples 4 and 7 to 9.

Reference is now made to the diagram in FIG. 14. It is noted that each of the polarizing films of the examples 7 to 9, as well as the example 4, has overcome the technical problems of the present invention relating to the manufacture of a polarizing film having a thickness equal to or smaller than 10 µm and has optical properties satisfying the required performance that the present invention aims at. The optical property of the example 9 has the best properties among the examples, followed by the example 4, then followed by the example 8, and the example 7. It shows that when the stretching ratio of the first stage preliminary in-air stretching is in a range of 1.2 to 2.5, even if the total stretching ratio after the second stage in-boric-acid-solution stretching is similar, the optical properties of the polarizing film are improved with an increase in the stretching ratio of the first stage preliminary in-air stretching. Thus, by increasing the stretching ratio of the first stage preliminary in-air stretching in the manufacturing process of the optical film laminate 10 including the polarizing film 3, the optical properties of the manufactured polarizing film or the optical film laminate 10 including the polarizing film can further be improved.

(5) Improvement of the Optical Properties of the Polarizing Film Provided by the Preliminary in-Air Stretching Temperature (Examples 10 to 12)

In the example 4, the preliminary in-air stretching temperature has been controlled at 130° C., whereas in the examples 10 to 12, the stretching temperature have respectively been controlled at 95° C., 110° C., and 150° C., which are higher than the glass transition temperature Tg of PVA. These polarizing films have been manufactured under the same conditions including, for example, the preliminary in-air stretching ratio of 1.8 and the in-boric-acid-solution stretching ratio of 3.3 as in the example 4 except the stretching temperature.

Figure 15:
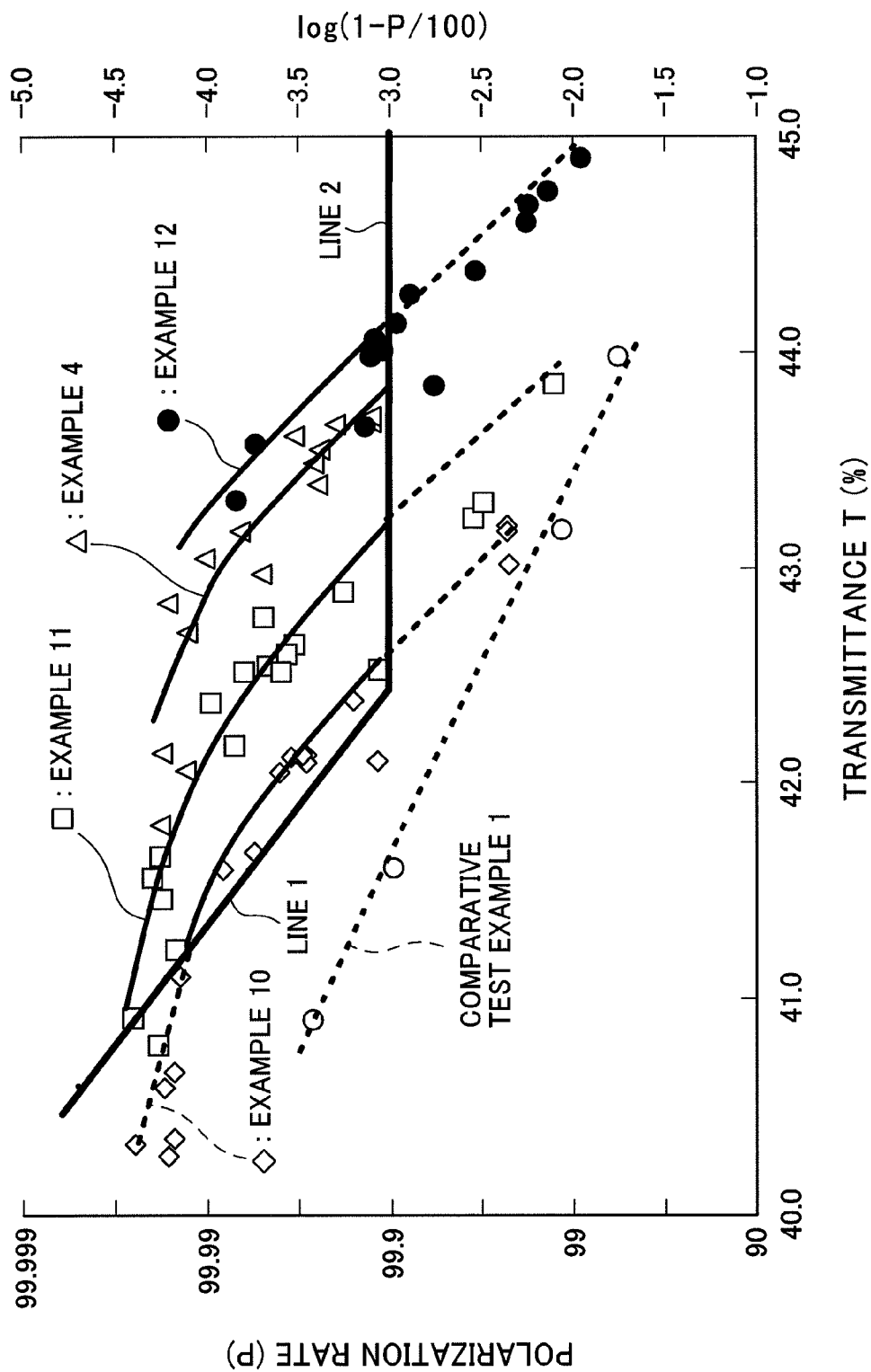
FIG. 15 is a comparative diagram of polarizing performance of polarizing films (preliminary in-air stretching temperature) of examples 4, and 10 to 12.

Reference is now to be made to the diagram in FIG. 15. It is noted that each of the polarizing films of the examples 4 and 10 to 12 has overcome the technical problems of the present invention relating to the manufacture of a polarizing film having a thickness equal to or smaller than 10 µm, and has optical properties satisfying the required performance that the present invention aims at. The optical properties of the example 12 are the most superior among the examples, followed by the example 4, followed by the example 11, and the example 10. It shows that when the stretching temperature of the first stage preliminary in-air stretching is controlled to be higher than the glass transition temperature and to sequentially increase from 95° C. to 150° C., even if the total stretching ratio after the second stage in-boric acid solution stretching is similar, the optical properties of the polarizing film can be improved with increase of the stretching temperature of the first stage preliminary in-air stretching. Thus, it is to be understood that by raising the stretching temperature of the first stage preliminary in-air stretching in the manufacturing process of the optical film laminate 10 including the polarizing film 3, the optical properties of the manufactured polarizing film or the optical film laminate 10 including the polarizing film can further be improved.

(6) Improvement of the Optical Property of the Polarizing Film Provided by the Total Stretching Ratio (Examples 13 to 15)

In the example 4, the first stage preliminary in-air stretching ratio has been 1.8 and the second stage in-boric acid solution stretching ratio has been 3.3, whereas in the examples 13 to 15, only the second stage in-boric acid solution stretching ratio has been changed to 2.1, 3.1 and 3.6, respectively to provide the total stretching ratio for each of the examples 13 to 15 of 5.04 (about 5.0), 5.58 (about 5.5) and 6.48 (about 6.5), respectively. These polarizing films have been manufactured under the same conditions as in the example 4 except the total stretching ratio.

Figure 16:
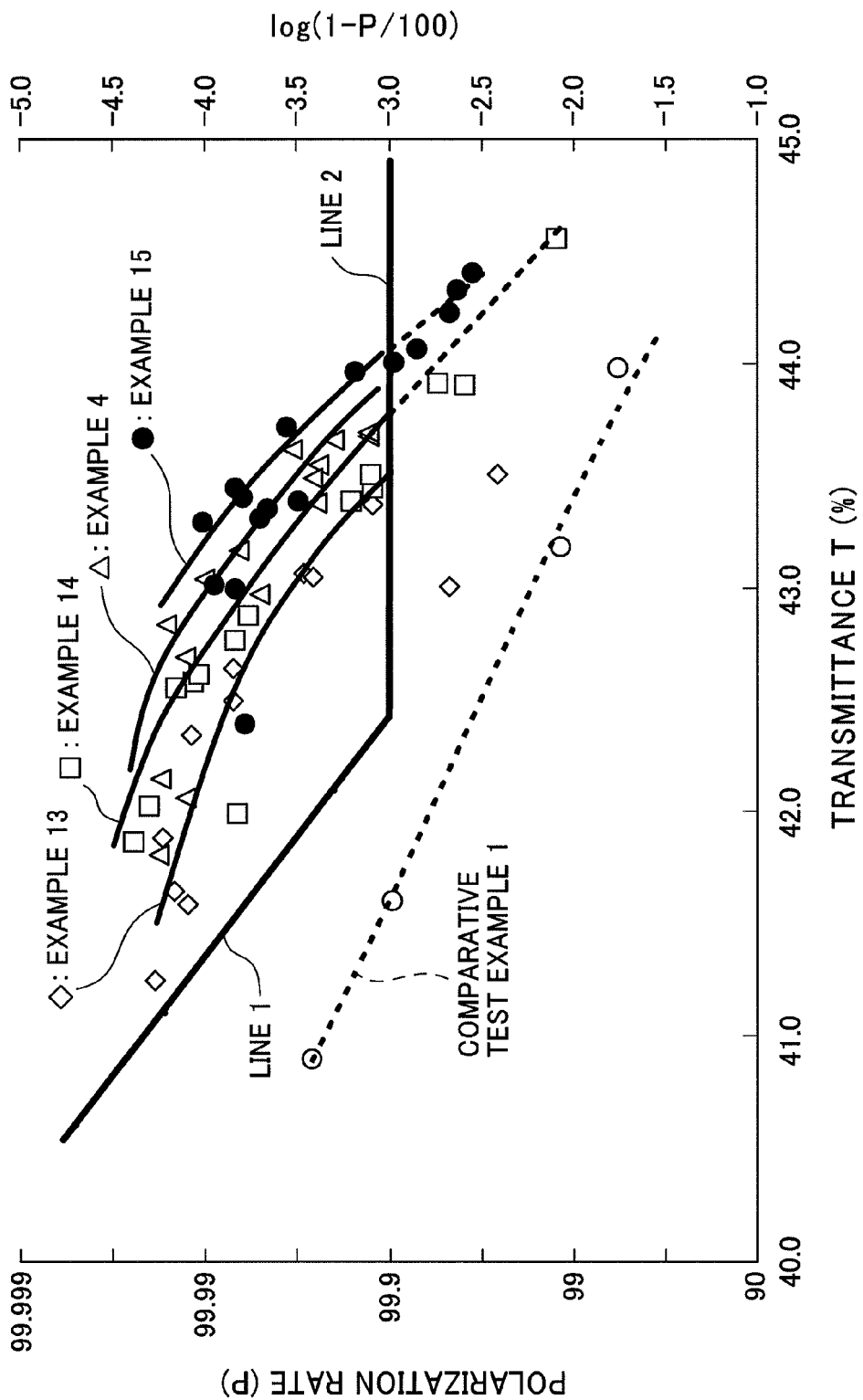
FIG. 16 is a comparative diagram of polarizing performance of polarizing films (total stretching ratio) of examples 4, and 13 to 15.

Reference is made herein to the diagram in FIG. 16. It is noted that each of the polarizing films of the examples 4 and 13 to 15 has overcome the technical problems of the present invention relating to the manufacture of a polarizing film having a thickness equal to or smaller than 10 µm and has optical properties satisfying the required performance that the present invention aims at. The optical properties of the example 15 are the most superior among the examples, followed by the example 4, followed by the example 14, and the example 13. It shows that when the stretching ratio of the first stage preliminary in-air stretching is fixed at 1.8 and only the stretching ratio in the second stage in-boric-acid solution stretching is varied to provide the sequentially increasing total stretching ratio of 5.0, 5.5, 6.0 and 6.5, the optical properties of the polarizing film can be improved with increase of the total stretching ratio. Thus, by raising the total stretching ratio of the first stage preliminary in-air stretching and the second stage in-boric-acid-solution stretching in the manufacturing process of the optical film laminate 10 including the polarizing film 3, the optical properties of the manufactured polarizing film or the optical film laminate 10 including the polarizing film may further be improved.

(7) Improvement of the Optical Properties of the Polarizing Film Provided by the Total Stretching Ratio in the Fixed-End Uniaxial Stretching (Examples 16 to 18)

In the examples 16 to 18, optical film laminates have been manufactured under the same conditions as in the example 4 except the stretching process in the preliminary in-air stretching. In the example 4, the preliminary in-air stretching has adopted an end-free uniaxial stretching, whereas in each of the examples 16 to 18, an fixed-end uniaxial stretching has been adopted for the preliminary in-air stretching. In the examples 16 to 18, the stretching ratio accomplished in each case by the first stage preliminary in-air stretching has been controlled at 1.8 and only that of the second stage in-boric-acid-solution stretching has been varied in the respective cases to the values 3.3, 3.9 and 4.4, respectively, to provide the total stretching ratio of 5.94 (about 6.0) in the example 16, 7.02 (about 7.0) in the example 17, and 7.92 (about 8.0) in the example 18. Other manufacturing conditions for the examples 16 to 18 have been the same as in the example 4.

Figure 17:
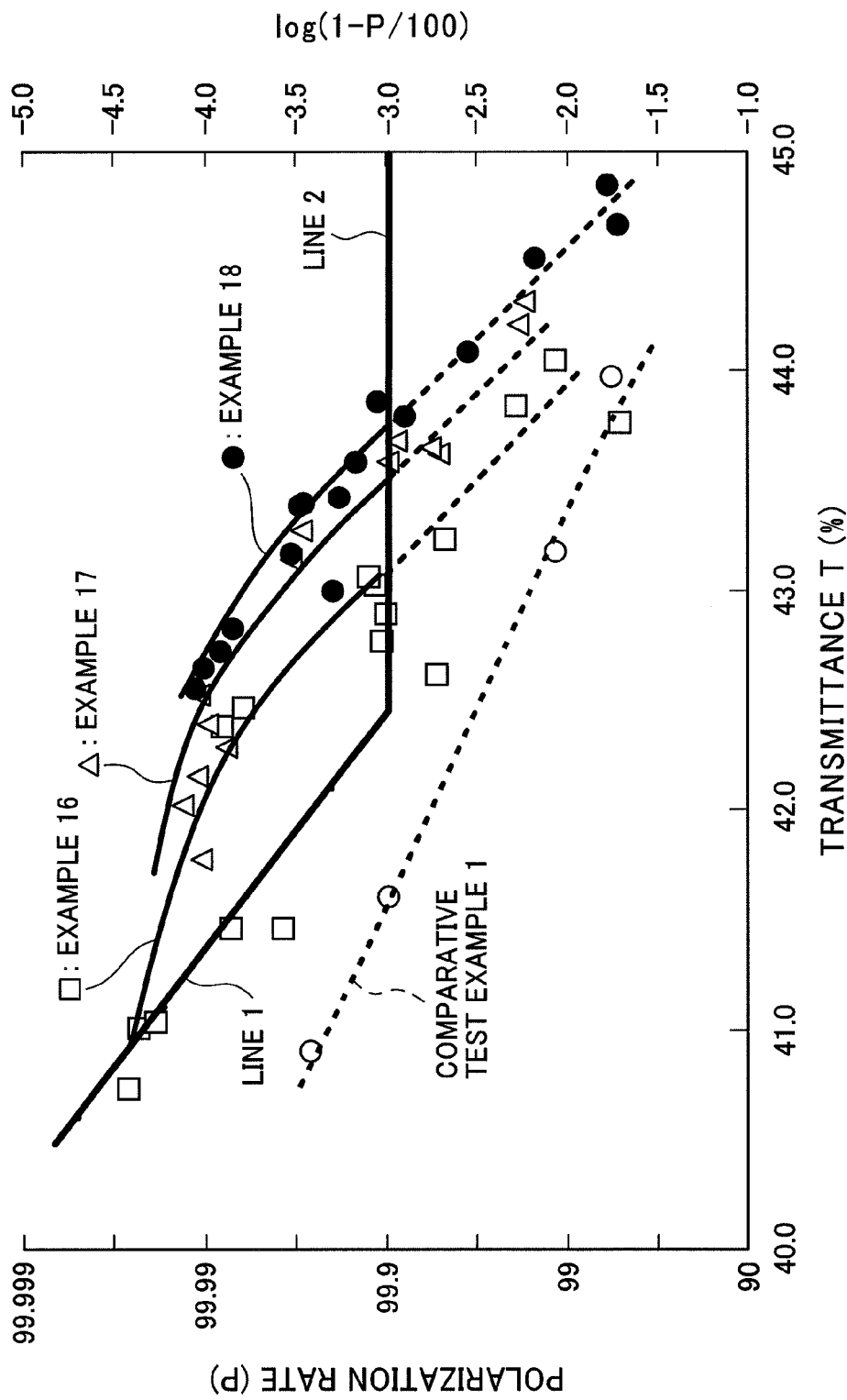
FIG. 17 is a diagram showing the polarizing performance of the polarizing films produced by fixed-end uniaxial stretching process in accordance with the examples 16 to 18.
Figure 18:
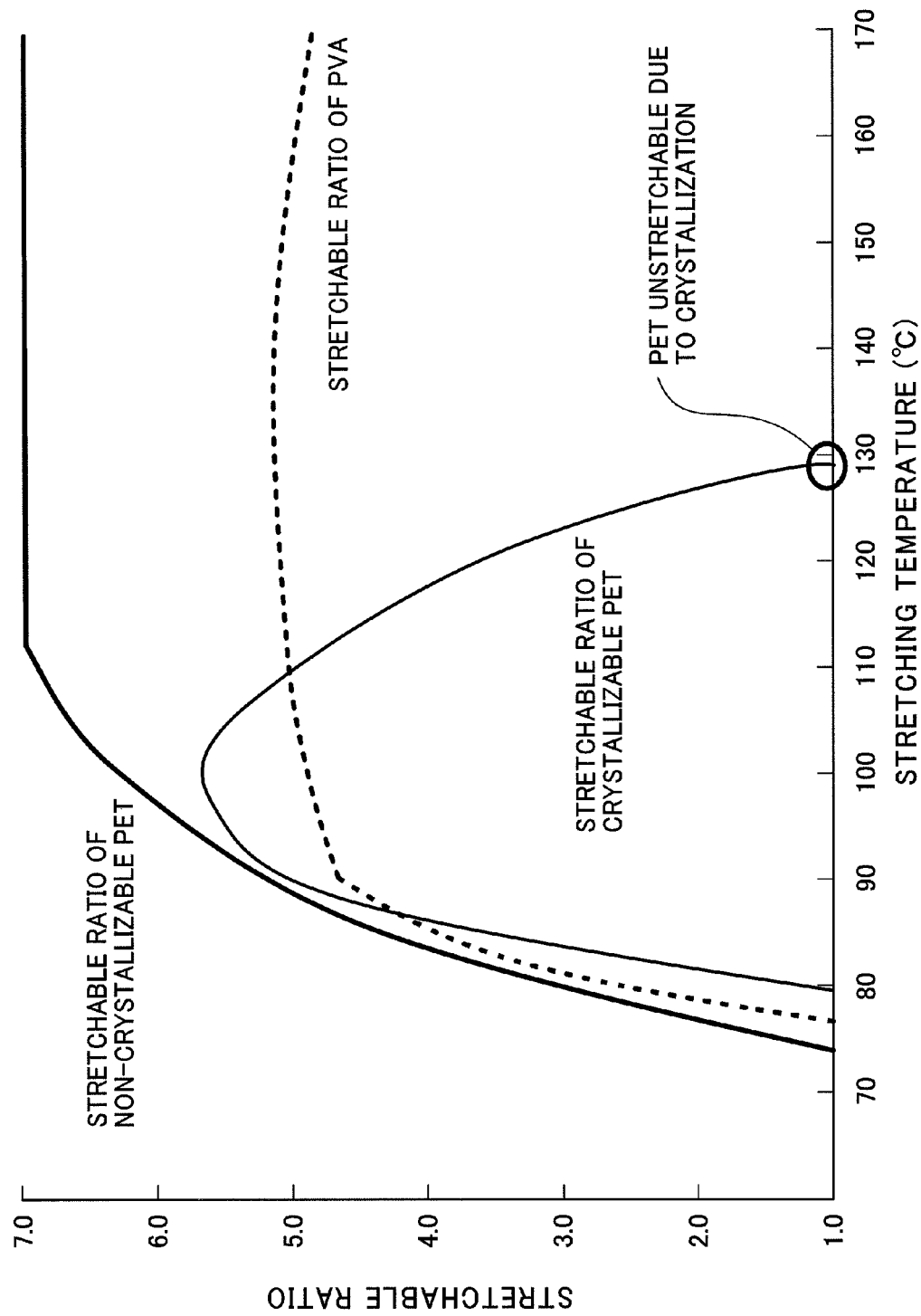
FIG. 18 is a schematic diagram showing the relationship between the stretching temperature and the attainable stretching ratio of each of the crystallizable PET, the non-crystallizable PET and the PVA type resin.
Figure 19:
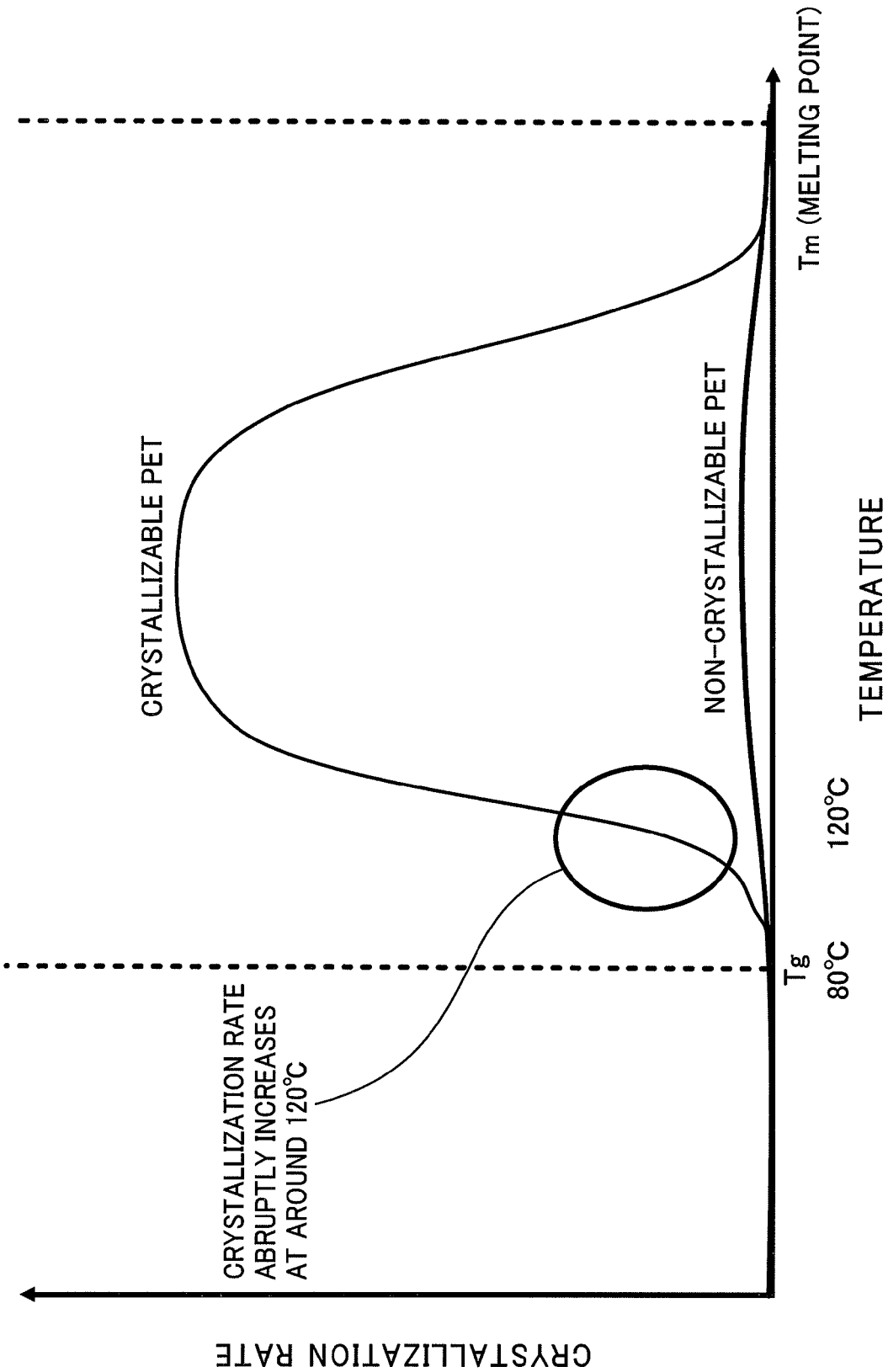
FIG. 19 is a schematic diagram showing changes in crystallization rate in accordance with temperature changes between Tg and Tm of the crystallizable PET and the non-crystallizable PET.

Refer to the diagram in FIG. 17. It is noted that each of the polarizing films of the examples 16 to 18 has overcome the technical problems of the present invention relating to the manufacture of a polarizing film having a thickness equal to or smaller than 10 µm and has optical properties satisfying the required performance that the present invention aims at. The optical properties of the example 18 are the most superior among the examples, followed by the example 17, and the example 16. It shows that when the stretching ratio of the first stage preliminary in-air stretching is controlled to be 1.8 and only the stretching ratio in the second stage in-boric acid solution stretching is varied to provide the total stretching ratio to increase as 6.0, 7.0 and 8.0, the optical properties of the polarizing film can be improved with increase of the total stretching ratio. Thus, by raising the total stretching ratio of the first stage fixed-end uniaxial preliminary in-air stretching and the second stage in-boric-acid-solution stretching in the manufacturing process of the optical film laminate 10 including the polarizing film 3, the optical properties of the manufactured polarizing film or the optical film laminate 10 including the polarizing film can further be improved. Further, it can be confirmed that the total stretching ratio can be increased when a fixed-end uniaxial stretching is adopted for the first stage preliminary in-air stretching, compared with a case wherein an end-free uniaxial stretching has been adopted.

EXAMPLES

FIG. 27 and FIG. 28 show a list of manufacturing conditions of the polarizing films or the optical film laminates including the polarizing films in accordance with the examples 1 to 18. FIG. 29 shows values of the orientation function of the PET resin substrates for respective ones of the stretched laminates of the examples 1 to 18 and of the reference test samples 1 to 3, after the first stage elevated temperature in-air stretching has been carried out.

Example 1

A continuous web of substrate has been produced from a non-crystallizable ester type thermoplastic resin comprising isophthalic acid-copolymerized polyethylene terephthalate (hereinafter referred as "non-crystallizable PET") containing 6 mol % of isophthalic acid copolymerized therein. The glass transition temperature of the non-crystallizable PET is 75° C. A laminate comprising a continuous web of non-crystallizable PET substrate and polyvinyl alcohol (hereinafter referred as "PVA") layer has been produced in accordance with the following procedures. It should be noted that the glass transition temperature of PVA is 80° C.

First, a non-crystallizable PET substrate 1 with a thickness of 200 μm has been prepared together with a PVA solution having a PVA concentration of 4 to 5 wt % which has been prepared by dissolving powders of PVA of a degree of polymerization of 1000 or higher and a degree of saponification of 99% or higher in water. Then, the PVA solution has been applied to the 200 μm-thick non-crystallizable PET substrate in the form of a thin coating layer, and dried at a temperature of 50 to 60° C., to form a 7 μm-thick PVA layer on the non-crystallizable PET substrate. Hereinafter, is the product formed as above is referred as "a laminate including a 7 μm-thick PVA layer formed on a non-crystallizable PET substrate," or "a laminate including a 7 μm-thick PVA layer," or simply as "a laminate."

The laminate including the 7 μm-thick PVA layer has been subjected to the following process including a 2-stage stretching comprised of a preliminary in-air stretching and an in-boric-acid-solution stretching to produce a 3 μm-thick polarizing film. Through the first stage preliminary in-air stretching, the laminate including the 7 μm-thick PVA layer has been stretched together with the non-crystallizable PET substrate to form a stretched laminate including a 5 μm-thick PVA layer, which will hereinafter be referred as "a stretched laminate." Describing in more detail, the stretched laminate has been produced from the laminate including the 7 μm-thick PVA layer by subjecting it to an end-free uniaxial stretching by means of the stretching apparatus arranged in the oven maintained at a stretching temperature of 130° C. to attain a stretching ratio of 1.8. Through this stretching process, the PVA layer included in the stretched laminate has been converted into a 5 μm-thick PVA layer having PVA molecules oriented therein.

Next, the stretched laminate has been subjected to a dyeing process whereby iodine has been impregnated in the 5 μm-thick PVA layer which has PVA molecules in an oriented state to produce a laminate having a dyed PVA layer, which hereinafter will be referred as "a dyed laminate." Describing in more detail, the dyed laminate contains iodine impregnated in the PVA layer of the stretched laminate, and is formed by immersing the stretched laminate for an appropriate time in a dyeing solution at a solution temperature of 30° C. containing iodine and potassium iodide, to thereby convert the PVA layer into a polarizing film having a single layer transmittance (T) of 40 to 44%. In the process, use has been made of a dyeing solution containing water as a solvent and iodine at a concentration in a range of 0.12 to 0.30 wt %, and potassium iodide of 0.7 to 2.1 wt %, the ratio of concentration of iodine to that of potassium iodide being 1:7.

It is to be noted that potassium iodide is required in order to have iodine dissolved in water. More in detail, the stretched laminate was immersed for 60 seconds in the dyeing solution having iodine concentration of 0.30 wt % and potassium iodide concentration of 2.1 wt % to form a dyed laminate having iodine impregnated in the 5 μm-thick PVA layer which includes PVA molecules in an oriented state. In the example 1, immersion time of the stretched laminate in the dyeing solution having iodine concentration of 0.30 wt % and potassium iodide concentration of 2.1 wt % has been varied for controlling the amount of iodine impregnated in the PVA layer, so that the polarizing film constituted by the PVA layer possesses a single layer transmittance of 40 to 44%, and that variously different dyed laminates with different single layer transmittance values and different polarization rates are obtained.

In the second stage of the in-boric-acid-solution stretching, the dyed laminate has further been stretched together with the non-crystallizable PET substrate to form an optical film laminate including the PVA layer providing a 3 μm-thick polarizing film. Hereinafter, the laminate thus formed will be referred as "an optical film laminate." Describing in more detail, the optical film laminate has been formed from the dyed laminate by transporting the dyed laminate through a stretching apparatus arranged in a processing apparatus having a bath of boric acid solution containing boric acid and potassium iodide at a solution temperature of 65° C. to 85° C., was and subjecting it to an end-free uniaxial stretching to attain a stretching ratio of 3.3. More in detail, the boric acid solution temperature has been controlled to 65° C. The boric acid solution contained 4 parts in weight of boric acid with respect to 100 parts in weight of water, and 5 parts in weight of potassium iodide with respect to 100 parts in weight of water.

In the process, the dyed laminate having the controlled amount of impregnated iodine has first been immersed in the boric acid solution for 5 to 10 seconds. The dyed laminate has then been transported in the state it is immersed in the solution through a plurality of pairs of rolls driven at different peripheral speeds to provide the stretching apparatus in the processing apparatus for carrying out the end-free uniaxial stretching to attain a stretching ratio of 3.3 in 30 to 90 seconds. Through this stretching, the PVA layer included in the dyed laminate is converted into a 3 µm-thick PVA layer having iodine impregnated therein with a high-order orientation in one direction in the form of a polyiodide ion complex. The PVA layer provides the polarizing film in the optical film laminate.

As described above, in the example 1, the laminate including the 7 µm-thick PVA layer formed on the non-crystallizable PET substrate has first been subjected to a preliminarily in-air stretching at a stretching temperature of 130° C. to form the stretched laminate, then the stretched laminate has been dyed to form the dyed laminate, the dyed laminate having been subjected to an in-boric-acid-solution stretching at a stretching temperature of 65° C., to attain the total stretching ratio of 5.94, to thereby form the optical film laminate including the 3 µm-thick PVA layer which has been stretched together with the non-crystallizable PET substrate. Through such 2-stage stretching, it has become possible to attain a high-order orientation of the PVA molecules in the PVA layer formed on the non-crystallizable PET substrate to form the optical film laminate including the 3 µm-thick PVA layer which finally constitutes the polarizing film having iodine impregnated therein through the dyeing process with a high-order orientation in the form of a polyiodide ion complex.

Although not an essential process for manufacturing an optical film laminate, the optical film has been taken out of the boric acid solution, and then cleaned with potassium iodide solution to remove any boric acid deposited on the surface of the 3 µm-thick PVA layer formed on the non-crystallizable PET substrate. Subsequently, the cleaned optical film laminate has been dried with warm air at a temperature of 60° C. in a drying process. The cleaning process aims at improving appearance by washing out boric acid deposition.

Although similarly not an essential process for manufacturing an optical film laminate, in laminating/transferring process, bonding agent was applied on the surface of the 3 µm-thick PVA layer formed on the non-crystallizable PET substrate and an 80 µm-thick triacetylcellulose (TAC) film has been attached thereto through the bonding agent, and thereafter the non-crystallizable PET substrate has been peeled to have the 3 µm-thick PVA layer transferred to the 80 µm-thick TAC film.

Example 2

In the example 2, as in the example 1, a laminate has at first provided by forming a 7 µm-thick PVA layer on a non-crystallizable PET substrate, then the laminate including the 7 µm-thick PVA layer has been subjected to a preliminary in-air stretching, to a stretching ratio of 1.8 to thereby form a stretched laminate, and thereafter the stretched laminate has been immersed in a dyeing solution containing iodine and potassium iodide at a solution temperature of 30° C. to form a dyed laminate including a PVA layer having iodine impregnated therein. In the example 2, in contrast to the example 1, a cross-linking process has additionally been carried out by immersing the dyed laminate for 60 seconds in the boric acid cross-linking solution at a solution temperature of 40° C. for the purpose of cross-linking PVA molecules in the PVA layer having iodine impregnated therein. The boric acid cross-linking solution in this process has contained 3 parts in weight of boric acid with respect to 100 parts in weight of water and 3 parts in weight of potassium iodide with respect to 100 parts in weight of water.

The cross-linking process in the example 2 is considered to provide at least 3 technical effects. The first is an insolubilization for preventing the reduced thickness PVA layer in the dyed laminate from being dissolved during the following in-boric-acid-solution stretching. The second is the dye stabilization for preventing the iodine impregnated in the PVA layer from being eluted. The third is the function of forming junction points by cross-linking the molecules in the PVA layer.

The method in the example 2 has further included a process in which the cross-linked dyed laminate has then been immersed in the stretching pool containing an in-boric acid solution at a solution temperature of 75° C., which is higher than the stretching temperature of 65° C. in the example 1, to stretch the laminate to a stretching ratio of 3.3 as in the example 1, to thereby form an optical film laminate. It should further be noted that, each of cleaning, drying and laminating/transferring process in the example 2 had been the same as that in the example 1.

To clarify the technical meritorious effect attained by the cross-linking process which has been conducted prior to the in-boric-acid-solution stretching, the non-cross-linked dyed laminate in the example 1 has been immersed in the in-boric-acid-solution stretching pool at a solution temperature of 65 to 75° C., to find that the PVA layer included in the dyed laminate dissolved in the solution in the stretching pool so that the stretching process has not been able to be carried out.

Example 3

In the example 3, as in the example 1, a laminate has first been prepared by forming a 7 µm-thick PVA layer on a non-crystallizable PET substrate, then the laminate including the 7 µm-thick PVA layer has been subjected to a preliminary in-air stretching to attain a stretching ratio of 1.8, to thereby form a stretched laminate. In the example 3, in contrast to the example 1, an insolubilizing process has been additionally incorporated, for insolubilizing the PVA layer in the stretched laminate and having PVA molecules oriented, the insolubilizing process being carried out by immersing the stretched laminate for 30 seconds in boric acid insolubilizing solution at a solution temperature of 30° C. The boric acid insolubilizing solution in this process has contained 3 parts in weight of boric acid with respect to 100 parts n weight of water. The technical effect obtained by the insolubilization process in the example 3 is that the PVA layer in the stretched laminate is insolubilized so that it will not be eluted at least during the following dyeing process.

In the example 3, the insolubilized and stretched laminate has then been immersed, as in the example 1, in a dyeing solution containing iodine and potassium iodide at a solution temperature of 30° C. to form a dyed laminate including a PVA layer having iodine impregnated therein. Subsequently, the dyed laminate has been immersed in the in-boric acid solution stretching pool at a solution temperature of 65° C., which is same as the stretching temperature in the example 1, to stretch the laminate to a stretching ratio of 3.3 as in the example 1, to thereby form an optical film laminate. It is further to be noted that each of the cleaning, drying and laminating/transferring processes in the example 3 has been the same as that in the example 1.

To clarify the technical meritorious effect attained by the insolubilizing process which is carried out prior to the dyeing process, the non-insolubilized stretched laminate in the example 1 has been dyed to form a dyed laminate, then the dyed laminate has been immersed in the in-boric-acid-solution stretching pool at a solution temperature of 65 to 75° C., to find that the PVA layer in the dyed laminate dissolved in the solution of the stretching pool so that the laminate has not been stretchable.

When the non-insolubilized stretched laminate in the example 1 has been immersed in a dyeing solution containing water as solvent and iodine at a concentration in a range of 0.12 to 0.25 wt %, instead of the dyeing solution having a concentration of 0.30 wt % used in the Example 1 with other factors being unchanged, the PVA layer included in the stretched laminate has dissolved in the dying pool so that the laminated cannot be dyed. However, when the insolubilized stretched laminate in the example 3 has been used, the PVA layer has not been dissolved even at the iodine concentration in the range of 0.12 to 0.25 wt % so that the dyeing process has been carried out.

In the example 3 wherein the PVA layer can be dyed successfully even with iodine concentration of 0.12 to 0.25 wt % in the dyeing solution, variety of different dyed laminates have been produced with a constant immersion time of the stretched laminate in the dyeing solution and with different iodine concentrations and different potassium iodide concentrations in the dyeing solution in the range described with respect to the example 1, by controlling the amount of the impregnated iodine so that the polarizing films provided by the PVA layers in the final products have different values of single transmittance and different polarization rates, with the values of the single layer transmittance in the range of 40 to 44%.

Example 4

In the example 4, an optical film laminate has been produced through a manufacturing process where insolubilizing process in the example 3 and cross-linking process in the example 2 have additionally incorporated in the manufacturing process in the example 1. Firstly, a laminate has been provided by forming a 7 μm-thick PVA layer on a non-crystallizable PET substrate, then, the laminate including the 7 μm-thick PVA layer has been subjected to an end-free uniaxial in-air stretching to attain a stretching ratio of 1.8, to thereby form a stretched laminate. In the example 4, as in the example 3, the formed stretched laminate has been immersed in a boric acid insolubilizing solution at a solution temperature of 30° C. for 30 seconds to have the PVA layer in the stretched laminate insolubilized with PVA molecules in an oriented state. In the example 4, the stretched laminate comprising the insolubilized PVA layer has further been immersed, as in the example 3, in a dyeing solution containing iodine and potassium iodide at a solution temperature of 30° C. to form a dyed laminate including a PVA layer having iodine impregnated therein.

In the example 4, as in the example 2, the dyed laminate thus formed has been immersed in a boric acid cross-linking solution at a solution temperature of 40° C. for 60 seconds to have the PVA molecules cross-linked in the PVA layer in which iodine is impregnated. In the example 4, the dyed laminate including the cross-linked PVA layer has further been immersed for 5 to 10 seconds in an in-boric acid solution stretching pool at a solution temperature of 75° C., which is higher than the stretching temperature of 65° C. in the example 1, to subject the laminate to an end-free uniaxial stretching to attain a stretching ratio of 3.3 as in the example 2, to thereby form an optical film laminate. Each of the cleaning, drying and laminating/transferring processes in the example 4 has been the same as that in the examples 1 to 3.

In the example 4, as in the example 3, the PVA layer has not been dissolved even at the iodine concentration in the range of 0.12 to 0.25 wt %. In the example 4, various dyed laminates have been produced with a constant immersion time of the stretched laminate in the dyeing solution and with various iodine concentrations and potassium iodide concentrations in the dyeing solution in the range described with respect to the example 1, by controlling the amount of the impregnated iodine so that the polarizing films provided by the PVA layers have respectively different values of single layer transmittance and different polarization rates with the range of single layer being in the range of 40 to 44%.

As above, in the example 4, a laminate has first been produced by forming a 7 μm-thick PVA layer on a non-crystallizable PET substrate, then, subjecting the laminate including the 7 μm-thick PVA layer to an end-free uniaxial stretching in a preliminary in-air stretching process, to attain a stretching ratio of 1.8, to thereby form a stretched laminate. The stretched laminate thus formed has been immersed in a boric acid insolubilizing solution at a solution temperature of 30° C. for 30 seconds to have the PVA layer included in the stretched laminate insolubilized with PVA molecules in an oriented state. The stretched laminate including the insolubilized PVA layer has further been immersed in a dyeing solution containing iodine and potassium iodide at a solution temperature of 30° C. to form a dyed laminate including a PVA layer having iodine impregnated therein. The dyed laminate has been immersed in boric acid cross-linking solution at a solution temperature of 40° C. for 60 seconds to have PVA molecules cross-linked in the PVA layer having iodine impregnated therein. The dyed laminate including the cross-linked PVA layer has further been immersed for 5 to 10 seconds in an in-boric acid solution stretching pool containing iodine and potassium iodide at a solution temperature of 75° C., then has been processed in an end-free uniaxial stretching to attain a stretching ratio of 3.3, to thereby form an optical film laminate.

In the example 4, because of the 2-stage stretching process consisting of an elevated temperature in-air stretching and an in-boric-acid-solution stretching together with the pre-processing consisting of an insolubilizing process prior to immersion in dyeing pool and a cross-linking process prior to the in-boric-acid-solution stretching, it has become possible to manufacture in a stable manner an optical film laminate including a 3 μm-thick PVA layer having iodine impregnated therein through a dyeing process and providing a polarizing film having PVA molecules oriented with a high-order orientation in one direction in the form of a polyiodide ion complex in the PVA layer formed on the non-crystallizable PET substrate.

Example 5

In the example 5, an optical film laminate has been manufactured under the same conditions as in the example 4 except the thickness of the PVA layer formed on the non-crystallizable PET substrate. In the example 4, the thickness of the PVA layer has been 7 μm before stretching, and that of the PVA layer in the finally manufactured optical film laminate has been 3 μm, whereas in the example 5, the thickness of the PVA layer before stretching has been 12 μm, and that of the PVA layer in the finally manufactured optical film laminate has been 5 μm.

Example 6

In the example 6, an optical film laminate has been manufactured under the same conditions as in the example 4 except the polymerizing monomer in the non-crystallizable PET substrate. In the example 4, use has been made of a non-crystallizable PET substrate having isophthalic acid copolymerized in the PET, whereas in the example 6, a non-crystallizable PET substrate has had 1,4-cyclohexanedimethanol copolymerized in the PET as a modifier group.

Example 7

In the example 7, an optical film laminate has been manufactured under the same conditions as in the example 4 except that the stretching ratio for each of the preliminary in-air stretching and the in-boric-acid-solution stretching has been varied so that the total stretching ratio became 6.0 or a value close to 6.0. In the example 4, the stretching ratios for the preliminary in-air stretching and the in-boric acid solution stretching have respectively been 1.8 and 3.3, whereas in the example 7, the respective ones of the ratios have been 1.2 and 4.9. The reason for the difference of the total stretching ratio in the example 4 of 5.94 and that in the example 7 of 5.88 is that it has not been possible to raise the in-boric-acid-solution stretching ratio above 4.9 in the example 7.

Example 8

In the example 8, an optical film laminate has been manufactured under the same conditions as in the example 4 except the stretching ratio for each of the preliminary in-air stretching and the in-boric acid solution stretching was varied so that the total stretching ratio has become 6.0. In the example 8, the stretching ratios for the preliminary in-air stretching and the in-boric-acid-solution stretching have been 1.5 and 4.0, respectively.

Example 9

In the example 9, an optical film laminate has been manufactured under the same conditions as in the example 4 except that different values have been adopted for the stretching ratio for each of the preliminary in-air stretching and the in-boric acid solution stretching to attain the total stretching ratio of 6.0. In the example 9, the stretching ratios for the preliminary in-air stretching and the in-boric acid solution stretching have been 2.5 and 2.4, respectively.

Example 10

In the example 10, an optical film laminate has been manufactured under the same conditions as in the example 4 except a difference in the stretching temperature. In the example 10, the stretching temperature for the preliminary in-air stretching has been 95° C., whereas in the example 4, the corresponding temperature has been 130° C.

Example 11

In the example 11, an optical film laminate has been manufactured under the same conditions as in the example 4 except a difference in the stretching temperature. In the example 11, the stretching temperature for the preliminary in-air stretching has been 110° C., whereas in the example 4, the corresponding temperature has been 130° C.

Example 12

In the example 12, an optical film laminate has been manufactured under the same conditions as in the example 4 except a difference in the stretching temperature. In the example 12, the stretching temperature for the preliminary in-air stretching has been 150° C., whereas in the example 4, the corresponding temperature has been 130° C.

Example 13

In the example 13, an optical film laminate has been manufactured under the same conditions as in the example 4 except that a different value has been adopted as the stretching ratio for the in-boric-acid-solution stretching. In the example 13, the stretching ratio for the preliminary in-air stretching and that for the in-boric-acid-solution stretching have been 1.8 and 2.8, respectively, whereas in the example 4, the corresponding values have been 1.8 and 3.3, respectively. In the example 13, the total stretching ratio has therefore been about 5.0 (5.04 to be accurate), whereas in the example 4, the corresponding ratio has been about 6.0 (5.94 to be accurate).

Example 14

In the example 14, an optical film laminate has been manufactured under the same conditions as in the example 4 except that a different value has been adopted as the stretching ratio for the in-boric acid solution stretching. In the example 14, the stretching ratio for the preliminary in-air stretching and that for the in-boric acid solution stretching have been 1.8 and 3.1, respectively, whereas in the example 4, the corresponding values have been 1.8 and 3.3, respectively. In the example 14, the total stretching ratio has therefore become about 5.5 (5.58 to be accurate), whereas in the example 4, it has been about 6.0 (5.94 to be accurate).

Example 15

In the example 15, an optical film laminate has been manufactured under the same conditions as in the example 4 except that a different value has been adopted as the stretching ratio for the in-boric acid solution stretching. In the example 15, the stretching ratio for the preliminary in-air stretching and that for the in-boric-acid-solution stretching have been 1.8 and 3.6, respectively, whereas in the example 15, the corresponding values have been 1.8 and 3.3, respectively. In the example 15, the total stretching ratio has therefore become about 6.5 (6.48 to be accurate), whereas in the example 4, the corresponding value has been about 6.0 (5.94 to be accurate).

Example 16

In the example 16, an optical film laminate has been manufactured under the same conditions as in the example 4 except the stretching process for the preliminary in-air stretching. In the example 16, the laminate has been subjected to a fixed-end uniaxial stretching in the preliminary in-air stretching to attain the stretching ratio of 1.8, whereas in the example 4, an end-free uniaxial stretching has been adopted in the preliminary in-air stretching to attain the stretching ratio of 1.8.

Example 17

In the example 17, an optical film laminate has been manufactured under the same conditions as in the example 16 except that a different value has been adopted as the stretching ratio for the in-boric acid solution stretching. In the example 17, the stretching ratio for the preliminary in-air stretching and that for the in-boric acid solution stretching have been 1.8 and 3.9, respectively, whereas in the example 16, the corresponding values have been 1.8 and 3.3, respectively. In the example 17, the total stretching ratio has therefore become about 7.0 (7.02 to be accurate), whereas in the example 16, the corresponding value has been about 6.0 (5.94 to be accurate).

Example 18

In the example 18, an optical film laminate has been manufactured under the same conditions as in the example 16 except that a different value has been adopted as the stretching ratio for the in-boric acid solution stretching. In the example 18, the stretching ratio for the preliminary in-air stretching and that for the in-boric-acid-solution stretching have been 1.8 and 4.4, respectively, whereas in the example 16, the corresponding values have been 1.8 and 3.3, respectively. In the example 18, the total stretching ratio has therefore become about 8.0 (7.92 to be accurate), whereas in the example 16, the corresponding value has been about 6.0 (5.94 to be accurate).

(Comparative Test Sample 1)

In the comparative test sample 1, a laminate has been manufactured under the same conditions as in the example 4. First, a laminate has been produced by forming a 7 μm-thick PVA layer on a non-crystallizable PET substrate by applying PVA solution on a 200 μm-thick non-crystallizable PET substrate and drying the same. Then, the laminate including the 7 μm-thick PVA layer has been subjected to an end-free uniaxial stretching in an elevated temperature in-air stretching process at a stretching temperature of 130° C. to attain a stretching ratio became 4.0 to thereby form a stretched laminate. After the stretching, the PVA layer included in the stretched laminate has been reduced in thickness to produce a 3.5 μm-thick PVA layer which has PVA molecules oriented therein.

Then, the stretched laminate has been dyed to form a dyed laminate having iodine impregnated in the 3.5 μm-thick PVA layer including PVA molecules oriented therein. Describing more specifically, the dyed laminate has been formed by immersing the stretched laminate in a dyeing solution containing iodine and potassium iodide at a solution temperature of 30° C. for an appropriate time to have iodine impregnated therein so that a polarizing film formed by the PVA layer has a single layer transmission of 40 to 44%. The amount of impregnated iodine has been controlled to produce variously different dyed laminates with different values of the single layer transmission and those of the polarization rate.

Further, the dyed laminated has been subjected to a cross-linking process, particularly, by immersing the dyed laminate in a boric acid cross-linking solution containing 3 wt % of iodine and 3 wt % of potassium iodide at a solution temperature of 40° C. for 60 seconds. The cross-linked dyed laminate in the comparative test sample 1 corresponds to the optical film laminate in accordance with the example 4. Thus, the cleaning, drying and laminating and/or transferring processes in the comparative test sample 1 have been similar to those in the example 4.

(Comparative Test Sample 2)

In the comparative test sample 2, the stretched laminates provided in the comparative test sample 1 have been stretched under the same conditions to attain the stretching ratio of 4.5, 5.0 and 6.0, respectively. The above comparative table sets forth various properties obtained in the 200 μm-thick non-crystallizable PET substrate and the PVA layer formed on the non-crystallizable PET substrate, including the comparative test samples 1 and 2. It is thereby confirmed that the stretching ratio of the elevated temperature in-air stretching at the stretching temperature of 130° C. has an upper limit at the value 4.0.

(Comparative Test Sample 3)

In the comparative test sample 3, under the same conditions as in the comparative test sample 1, a laminate has been produced by forming a 7 μm-thick PVA layer on a non-crystallizable PET substrate by applying PVA solution on a 200 μm-thick non-crystallizable PET substrate and drying the same. Then, the laminate comprising the 7 μm-thick PVA layer has been immersed in a dyeing solution containing iodine and potassium iodide at a solution temperature of 30° C. to form a dyed laminate including a PVA layer having iodine impregnated therein. Describing in more detail, the dyed laminate has been formed by immersing the stretched laminate in a dyeing solution containing 0.30 wt % of iodine and 2.1 wt % of potassium iodide at a solution temperature of 30° C. for an appropriate time so that a polarizing film provided by the PVA layer possesses a single layer transmission of 40 to 44%. Then, the dyed laminate including the PVA layer having iodine impregnated therein has been subjected to an end-free uniaxial stretching in a boric acid solution at a stretching temperature of 60° C. to attain a stretching ratio of 5.0. Thus, there have been produced through different immersion time periods various optical laminates each including such 3 μm-thick PVA layer integrally stretched with the PET resin substrate.

(Reference Test Sample 1)

In the reference test sample 1, a laminate has been produced by forming a 7 μm-thick PVA layer on a crystallizable PET substrate by using a continuous web of crystallizable polyethylene terephthalate (hereinafter referred as crystallizable PET) as resin substrate and by applying PVA solution on a 200 μm-thick crystallizable PET substrate and drying the same. Glass transition temperature of the crystallizable PET is 80° C. Then, the formed laminate has been subjected to an end-free uniaxial stretching in an elevated temperature in-air stretching process at a stretching temperature of 110° C. to attain a stretching ratio of 4.0 to thereby form a stretched laminate. Through the stretching, the PVA layer in the stretched laminate has been converted into a 3 μm-thick PVA layer having PVA molecules oriented therein. In the reference test sample 1, it has not been possible to stretch the laminate to a stretching ratio beyond 4.0 in the elevated temperature in-air stretching at a stretching temperature of 110° C.

The stretched laminate has then been dyed to form a dyed laminate which includes iodine impregnated in the 3.5 μm-thick PVA layer which has PVA molecules in an oriented state. Describing more specifically, the dyed laminate has been formed by immersing the stretched laminate in a dyeing solution containing iodine and potassium iodide at a solution temperature of 30° C. for an appropriate time to have iodine impregnated therein so that the polarizing film provided by the PVA layer possesses a single layer transmission of 40 to 44%. The amount of impregnated iodine has been changed to produce variously different dyed laminates having different values of single layer transmission and those of polarization rate. Then, the dyed laminated has been subjected to a cross-linking process, particularly, by immersing the dyed laminate in a boric acid cross-linking solution containing 3 parts in weight of iodine with respect to 100 parts in weight of water and 3 parts in weight of potassium iodide with respect to 100 parts in weight of water, at a solution temperature of 40° C. for 60 seconds. The cross-linked dyed laminate in the comparative test sample 1 corresponds to the optical film laminate in accordance with the example 4. Thus, the cleaning, drying and laminating and/or transferring processes in the comparative test sample 1 have been similar to those in the example 4.

(Reference Test Sample 2)

In the reference test sample 2, a laminate has been produced by forming a 7 μm-thick PVA layer on a 200 μm-thick crystallizable PET substrate as in the reference test sample 1. Then, the formed laminate has been subjected to an end-free uniaxial stretching through an elevated temperature in-air stretching process at a stretching temperature of 100° C. to attain a stretching ratio of 4.5 to thereby form a stretched laminate. Through the stretching process, the PVA layer has been converted in the stretched laminate into a 3.3 μm-thick PVA layer having PVA molecules oriented therein. In the reference test sample 2, it has not been possible to stretch the laminate beyond the stretching ratio of 4.5 in the elevated temperature in-air stretching under a stretching temperature of 100° C.

Then, a dyed laminate has been formed by immersing the stretched laminate in a dyeing solution containing iodine and potassium iodide at a solution temperature of 30° C. for an appropriate time to have iodine impregnated therein so that the polarizing film provided by the PVA layer possesses a single layer transmission of 40 to 44%. In the reference test sample 2, the amount of iodine impregnated in the PVA layer has been controlled as in the reference test sample 1 to form various different dyed laminates having different values of the single layer transmission and those of polarization rate.

(Reference Test Sample 3)

In the reference test sample 3, as in the reference test samples 1 and 2, a laminate has been produced by forming a 7 μm-thick PVA layer on a crystallizable PET substrate by applying PVA solution on a 200 μm-thick crystallizable PET substrate. Then, the formed laminate has been immersed in a dyeing solution containing iodine and potassium iodide at a solution temperature of 30° C. for an appropriate time to have iodine impregnated therein so that the polarizing film provided by the PVA layer possesses a single layer transmission of 40 to 44% and various different dyed laminates have been produced with different immersion time. Subsequently, thus formed dyed laminates have been subjected to an end-free uniaxial stretching through an elevated temperature in-air stretching process at a stretching temperature of 90° C. to a stretching ratio of 4.5 to thereby form a stretched laminate including the PVA layer having iodine impregnated therein in such an amount that the PVA layer provides a polarizing film. Through the stretching procedure, the PVA layer having iodine impregnated therein has been converted in the stretched laminate formed from the dyed laminate, to a 3.3 μm-thick PVA layer having PVA molecules impregnated therein. In the reference test sample 3, it has not been possible to stretch the laminate beyond the stretching ratio of 4.5 in the elevated temperature in-air stretching at a stretching temperature of 90° C.

(Measurement Process)

(Thickness Measurement)

Thickness of each of the non-crystallizable PET substrate, the crystallizable PET substrate and the PVA layer has been measured using a digital micrometer (KC-351C from Anritsu Electric Co., Ltd.).

(Measurement of Transmittance and Polarization Rate)

Each of the single layer transmittance T, the parallel transmittance Tp and the cross transmittance Tc of the polarizing film has been measured using a UV-visible spectrophotometer (V7100 from JASCO Corporation). The values of T, Tp and Tc are presented in terms of Y values measured according to JIS Z8701 (visual field of 2 degrees, C light source) and corrected for spectral luminous efficacy.

The polarization rate P has been calculated in accordance with the following equation using the above value of transmittance.

polarization rate $P=\{(Tp-Tc)/(Tp+Tc)\}^{1/2}/100$ (Evaluation of Orientation Function of Pet)

A Fourier Transform Infrared Spectrometer (FT-IR) (SPECTRUM 2000 from PerkinElmer, Inc.) has been used as the measurement device. Attenuated total reflection (ATR) of polarizing light was measured to evaluate the surface of a PET resin layer. Orientation function has been calculated according to the following procedures. Measurements have been made on the polarizing light in the directions of 0° and 90° with respect to the stretching direction. Intensity of the obtained spectral at 1340 cm$^{-1}$ has been used to calculate the orientation function according to the Equation 4 (refer to the Non-Patent Document 1) shown below. The condition of f=1 indicates a complete or perfect orientation, whereas the condition f=0 indicates a random orientation. The peak observed at 1340 cm$^{-1}$ is considered as indicating the absorption induced by a methylene in an ethylene glycol unit of PET.

$$\begin{aligned} f &= (3\langle\cos^2\theta\rangle - 1)/2 \\ &= [(R-1)(R_0+2)]/[(R+2)(R_0-1)] \\ &= (1-D)/[c(2D+1)] \\ &= -2\times(1-D)/(2D+1) \end{aligned}$$ (Equation 4)

where,
$c=(3\cot^2\beta-1)/2$,
$\beta=90°$, an angle of transition dipole moment with respect to an axis of molecular chain,
$\theta$: an angle of molecular chain with respect to stretching direction,
$R_0=2\cos^2\beta$,
$1/R=D=(I\perp)/(I//)$ (the more the PET is oriented, the greater the value of D),
$I\perp$=intensity measured when polarizing light incidents perpendicular to stretching direction,
$I//$=intensity measured when polarizing light incidents parallel to stretching direction.

(Evaluation of Orientation Function of PVA)

A Fourier Transform Infrared Spectrometer (FT-IR) (SPECTRUM 2000 from PerkinElmer, Inc.) has been used as the measurement device. Attenuated total reflection (ATR) of polarizing light has been measured to evaluate the surface of the PVA resin layer. Orientation function has been calculated according to the following procedures. Measurements have been made on the polarizing light in the directions of 0° and 90° with respect to the stretching direction. Intensity of the obtained spectral at 2941 cm$^{-1}$ has been used to calculate the orientation function according to the Equation 4 (the Non-Patent Document 1) shown above. For the intensity I, with a value at 3330 cm$^{-1}$ taken as a reference peak, a value of 2941 cm$^{-1}$/3330 cm$^{-1}$ has been used. The condition of f=1 indicates the complete or perfect orientation, whereas the condition f=0 indicates a random orientation. The peak observed at 2941 cm$^{-1}$ is considered as indicating the absorption induced by vibration of the main chain of PVA (—CH2-).

(Evaluation of Degree of Crystallization of PVA)

A Fourier Transform Infrared Spectrometer (FT-IR) (SPECTRUM 2000 from PerkinElmer, Inc.) has been used as the measurement device. Attenuated total reflection (ATR) of polarizing light has been measured to evaluate the surface of the PVA resin layer. Degree of crystallization has been calculated according to the following procedures. Measurements have been made on the polarizing light in the directions of 0° and 90° with respect to the stretching direction. Intensities of the obtained spectral at 1141 cm$^{-1}$ and at 1440 cm$^{-1}$ have been used to calculate the degree of crystallization. Calculations have been made using the intensity at 1141 cm$^{-1}$ as relative to the amount of crystallized part, and the value at 1440 cm$^{-1}$ as a reference peak to determine a crystallization index with the following equation (Equation 6). Further, a sample of PVA with a known degree of crystallization has been used in advance to create crystallization index and a calibration curve, and the calibration curve has been used to calculate the degree of crystallization from the crystallization index (Equation 5).

Degree of crystallization=63.8×crystallization index−44.8 (Equation 5)

Crystallization index=((*I*(1141 cm$^{-1}$)0°+2×*I*(1141 cm$^{-1}$)90°)/3)/((*I*(1440 cm$^{-1}$)0°+2×*I*(1440 cm$^{-1}$)90°)/3) (Equation 6)

where,
I(1141 cm$^{-1}$) 0°=intensity at 1141 cm$^{-1}$ when polarizing light incidents parallel to stretching direction,
I(1141 cm$^{-1}$) 90°=intensity at 1141 cm$^{-1}$ when polarizing light incidents perpendicular to stretching direction,
I(1440 cm$^{-1}$) 0°=intensity at 1440 cm$^{-1}$ when polarizing light incidents parallel to stretching direction,
I(1440 cm$^{-1}$) 90°=intensity at 1440 cm$^{-1}$ when polarizing light incidents perpendicular to stretching direction.

EXPLANATION OF NUMERICAL SYMBOLS

| | |
|---|---|
| 1: | Non-crystallizable PET substrate |
| 2: | PVA type resin layer |
| 3: | Polarizing film |
| 4: | Optically functional film |
| 5: | Second optically functional film |
| 7: | Laminate comprising PVA type resin layer |
| 8: | Stretched laminate |
| 8': | Roll of stretched laminate |
| 8'': | Insolubilized stretched laminate |
| 9: | Dyed laminate |
| 9': | Cross-linked dyed laminate |
| 10: | Optical film laminate |
| 11: | Optically functional film laminate |
| 12: | Optical film laminate (pattern 1) |
| 13: | Optical film laminate (pattern 2) |
| 14: | Optically functional film laminate (pattern 3) |
| 15: | Optically functional film laminate (pattern 4) |
| 16: | Adhesive agent (Adhesive agent layer) |
| 17: | Separator |
| 18: | Bonding agent (Bonding agent layer) |
| 20: | Laminate manufacturing apparatus |
| 21: | Coating unit |
| 22: | Drying unit |
| 23: | Surface modifying apparatus |
| 30: | Preliminary in-air stretching apparatus |
| 31: | Stretching unit |
| 32: | Winding apparatus |
| 33: | Oven |
| 40: | Dying apparatus |
| 41: | Dying solution |
| 42: | Dying pool |
| 43: | Feeding apparatus |
| 50: | In-boric acid solution stretching apparatus |
| 51: | Boric acid solution |
| 52: | Boric acid solution pool |
| 53: | Stretching unit |
| 60: | Insolubilizing apparatus |
| 61: | Boric acid insolubilizing solution |
| 70: | Cross-linking apparatus |
| 71: | Boric acid cross-linking solution |
| 80: | Cleaning apparatus |
| 81: | Cleaning solution |
| 90: | Drying apparatus |
| 91: | Winding apparatus |
| 100: | Laminating/transferring apparatus |
| 101: | Feeding/laminating apparatus |
| 102: | Winding/transferring apparatus |
| 200: | Display panel for IPS-type liquid-crystal television |
| 201: | Surface treatment layer |
| 202: | IPS liquid crystal cell |
| 300: | Display panel for VA-type liquid-crystal television |
| 301: | Biaxial phase difference film (nx > ny > nz) |
| 302: | VA liquid-crystal cell |
| 400: | Display panel for IPS-type liquid-crystal television |
| 401: | Triacetylcellulose (TAC) film |
| 402: | IPS liquid-crystal cell |
| 500: | Display panel for IPS-type liquid-crystal television |
| 501: | Biaxial phase difference film (nx > nz > ny) |
| 502: | IPS liquid-crystal cell |
| 600: | Organic electroluminescence display panel |
| 601: | Acrylic resin film |
| 602: | λ/4 phase difference film |
| 603: | Organic electroluminescence panel |
| (A): | Laminate manufacturing process |
| (B): | Preliminary in-air stretching process |
| (C): | Dying process |
| (D): | In-boric acid solution stretching process |
| (E): | First insolubilization process |
| (F): | Cross-linking process including second insolubilization |
| (G): | Cleaning process |
| (H): | Drying process |
| (I): | Laminating/transferring process |

The invention claimed is:

1. A stretched laminate for manufacturing an optical film laminating including a polarizing film, said stretched laminate comprising:
a non-crystallizable ester type thermoplastic resin substrate and a layer of a polyvinyl alcohol type resin formed on the non-crystallizable ester type thermoplastic resin substrate,
said non-crystallizable ester type thermoplastic resin substrate comprises a preliminarily in-air stretched non-crystallizable polyethylene terephthalate having an orientation function of 0.10 or less, and
said polyvinyl alcohol type resin having a degree of crystallization in a range between 27% to 40% and an orientation function in a range between 0.05 and 0.35.

2. A stretched laminate as defined by claim 1, wherein the non-crystallizable ester type thermoplastic resin substrate has a thickness which is at least 6.0 larger than a thickness of the polyvinyl alcohol type resin layer formed thereon.

3. A stretched laminate as defined by claim 1, wherein the non-crystallizable ester type thermoplastic resin substrate is stretched under an elevated temperature stretching process, said resin being selected from the group including polyethylene terephthalate copolymerized with isophthalic acid, polyethylene terephthalate copolymerized with cyclohexanedimethanol, and non-crystallizable polyethylene terephthalate comprising another copolymerized polyethylene terephthalate.

4. A stretched laminate as defined by claim 1, wherein the non-crystallizable ester type thermoplastic resin substrate comprises a transparent resin.

* * * * *